US006238961B1

(12) United States Patent
Asano et al.

(10) Patent No.: US 6,238,961 B1

(45) Date of Patent: May 29, 2001

(54) SEMICONDUCTOR INTEGRATED CIRCUIT DEVICE AND PROCESS FOR MANUFACTURING THE SAME

(75) Inventors: Isamu Asano, Iruma; Osamu Tsuchiya, Hamura, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/487,599

(22) Filed: Jan. 19, 2000

(30) Foreign Application Priority Data

Jan. 19, 1999 (JP) ........................................ 11-011018

(51) Int. Cl.[7] ........................................ H01L 21/336

(52) U.S. Cl. .................... 438/197; 438/239; 438/624; 438/629; 438/639; 438/738

(58) Field of Search .................... 438/197, 299, 438/301, 622, 624, 629, 637, 639, 738, 739, 238, 239

(56) References Cited

U.S. PATENT DOCUMENTS

| | | | | |
|---|---|---|---|---|
| 5,538,922 | * | 7/1996 | Cooper et al. | 438/624 |
| 5,578,524 | * | 11/1996 | Fukase et al. | 438/624 |
| 5,668,052 | * | 9/1997 | Matsumoto et al. | 438/624 |
| 5,880,020 | * | 3/1999 | Mano | 438/618 |
| 5,885,895 | * | 3/1999 | Liu et al. | 438/637 |
| 6,008,085 | * | 12/1999 | Sung et al. | 438/253 |
| 6,054,394 | * | 4/2000 | Wang | 438/753 |

FOREIGN PATENT DOCUMENTS

| | | |
|---|---|---|
| 7-321197 | 12/1995 | (JP) . |
| 10-163316 | 6/1998 | (JP) . |

* cited by examiner

*Primary Examiner*—T. N. Quach

(74) *Attorney, Agent, or Firm*—Antonelli, Terry, Stout & Kraus, LLP

(57) ABSTRACT

Word lines WL, which serve as gate electrodes of selection MISFETs of a DRAM, are formed over a main surface of a semiconductor substrate. Thereafter, plugs (connecting plugs BP and plugs formed in patterns SNCT) each connected to the source and drain of each MISFET are formed in an insulting film for covering the word lines WL. Next, an insulating film for covering the plugs is formed and a tungsten film having a pattern opposite to each bit line pattern is formed over the insulating film. With the tungsten film as a mask, part of the insulating film is etched to define each wiring trench. Next, each photoresist film having an opening and formed linearly in the direction of each word line WL is formed over each connecting plug BP. The remaining portions of the insulating film are etched with the photoresist film 35 and the tungsten film as masks to make the connecting plugs BP bare.

18 Claims, 50 Drawing Sheets

SEMICONDUCTOR INTEGRATED CIRCUIT DEVICE AND PROCESS FOR MANUFACTURING THE SAME

FIELD OF THE INVENTION

The present invention relates to a semiconductor device and a technique for manufacturing the same, and particularly to a technique effective for application to a dynamic Random Access Memory (DRAM), which requires a storage holding operation fit for high integration.

BACKGROUND OF THE INVENTION

A trench type and a stacked type have generally been known as a basic structure of a DRAM. The trench type is one wherein each of capacitative elements (hereinafter called simply "capacitors") for information storage is formed inside a trench defined in a substrate. The stacked type is one wherein each of capacitors is formed over its corresponding transfer transistor (hereinafter called selection MISFET (Metal Insulator Semiconductor Field Effect Transistor)) on the surface of a substrate. The stacked type is further classified into a CUB (Capacitor Under Bit-line) type wherein each capacitor is placed below its corresponding bit line and a COB (Capacitor Over Bit-line) type wherein each capacitor is located over the bit line. 64M-bit and later products which have gone into mass production, are of stacked types excellent in characteristic of a reduction in each cell area. The COB type is becoming mainstream.

A structure of a DRAM having each COB type memory cell is illustrated by way of example as follows. Namely, The memory cells of the DRAM having the COB type memory cells are placed at points where a plurality of word lines and a plurality of bit lines placed on a main surface of a semiconductor substrate in matrix form intersect respectively. Each memory cell comprises one selection MISFET and one capacitor electrically connected to the selection MISFET. The selection MISFET is formed in an active region whose periphery is surrounded by device isolation regions, and is comprised principally of a gate oxide film, a gate electrode formed integrally with each word line, and a pair of semiconductor regions each constituting a source and drain. Each of the bit lines is placed over its corresponding selection MISFET and electrically connected to one of the source and drain shared between two selection MISFETs adjacent in its extending direction. Similarly, each capacitor is placed over its corresponding selection MISFET and electrically connected to the other of the source and drain. In order to supplement a reduction in the amount (Cs) of an electrical charge stored in each capacitor due to scaling down of each memory cell, a lower electrode (storage electrode) of the capacitor placed over the bit line is processed in cylindrical form to increase a surface area thereof, and a capacitive insulating film and an upper electrode (plate electrode) are formed thereover.

In such a structure of COB type memory cell, the bit lines and the source and drain regions of the selection MISFET are electrically connected to one another by plugs each composed of a polycrystalline silicon film or the like. Since plugs for capacitor connection are also formed simultaneously with plugs for bit line connection in general, at least an insulating film corresponding to one layer is formed between the plug and bit line to isolate the bit line and the plug for capacitor connection from each other. Thus, the bit lines and the plugs are connected to one another through bit line connecting holes respectively. There is a demand for a reduction in the capacitance of each bit line in terms of an improvement in the operating speed of a DRAM and an improvement in the sensitivity for the detection of each stored charge. There is further a demand for scaling down or miniaturization of members such as the bit lines even in terms of the implementation of scaling down. In order to meet these demands, a technique is known wherein the bit lines are formed by a damascene method and side wall spacers each composed of a silicon nitride film are formed over inner side walls as described in the international publication WO98/28795, for example. Owing to such a technique, the bit lines are made thin and the distance between the bit lines is made long to reduce the capacitance between the bit lines, whereby the speeding up of the DRAM and the sensitivity for the detection of each stored capacitance are improved.

SUMMARY OF THE INVENTION

When bit lines are connected to their corresponding connecting plugs through bit line connecting holes, it is necessary to form patterns for the bit lines and patterns for the bit line connecting holes by different masks. Word lines each of which also serves as a gate electrode of each MISFET, are normally formed after isolation regions are formed over a main surface of a semiconductor substrate. Thereafter, connecting plugs are formed. Further, when the bit lines are formed by the damascene method, the bit line connecting holes are defined after the formation of trenches for the bit line patterns, and the bit lines to be connected to their corresponding connecting plugs are formed by a so-called dual damascene method. Here, lithography for the formation of the connecting plugs is carried out on the basis of a word line pattern corresponding to the gate electrode of each MISFET. However, since the connecting plug for the bit line connection and the connecting plug for the capacitor connection are generally formed in common, a pattern for a bit line and a pattern for a bit line connecting hole, which are to be next formed, are not subjected to photolithography on the basis of the connecting plug and subjected to photolithography on the basis of the word line pattern in a manner similar to the connecting plug. Namely, the pattern for the bit line and the pattern for the bit line connecting hole are brought to three interlayer alignment, so that pattern misalignment is liable to occur. In particular, a shift in alignment or misalignment between each bit line and its corresponding bit line connecting hole does not cause a problem so far in a word-line vertical direction because each bit line is formed so as to extend in the word-line vertical direction. However, the magnitude of the misalignment influences a connecting area as it is in the direction parallel to the word line, thus resulting in a large possibility that a problem will occur.

In the prior art, the side wall spacers each composed of the silicon nitride film are formed over the inner side walls of the trench defined in each bit line pattern as the method for making each bit line thin. However, this leads to the factors that the permittivity of the silicon nitride film is made large and the capacitance between the bit lines is increased. The increase in the capacitance between the bit lines is undesired because the sensitivity for the detection of each storage capacitance is lowered and the operating speed of the DRAM is reduced.

An object of the present invention is to provide a technique capable of implementing electrical connections between a bit line and a connecting plug on a self-alignment basis in a word line direction in each memory cell of a scaled-down DRAM, and a technique capable of implementing electrical connections between a bit line and a connecting plug with ease and a high degree of reliability.

Another object of the present invention is to simplify a process for forming portions where bit lines and connecting plugs are connected to one another.

A further object of the present invention is to reduce the capacitance between adjacent bit lines.

The above, and other objects and novel features of the present invention will become apparent from the description of the present specification and the accompanying drawings.

Summaries of typical ones of the inventions disclosed in the present application will be described in brief as follows:

(1) A process for manufacturing a semiconductor device, according to the present invention comprises (a) a step for forming isolation regions on a main surface of a semiconductor substrate and arranging a plurality of active regions each having a long side in a first direction, (b) a step for forming first interconnections each extending in a second direction orthogonal to the first direction and serving as a gate electrode of each MISFET over the main surface of the semiconductor substrate, (c) a step for forming a pair of semiconductor regions each serving as a source and drain of each MISFET in the active region between the first interconnections, (d) a step for forming a first insulating film for covering the first interconnections and defining each connecting hole in the first insulating film lying over at least one of the semiconductor regions, (e) a step for forming a connecting member electrically connected to each semiconductor region within its corresponding connecting hole, (f) a step for depositing a second insulating film, a third insulating film and a fourth insulating film having an etching selection ratio with respect to the third insulating film over the connecting member and depositing a first coating over the fourth insulating film, (g) a step for patterning a first resist film extending over the first coating in a first direction and etching the first coating under the existence of the first resist film, (h) a step for etching the fourth insulating film under the existence of the etched first coating with the third insulating film as a stopper and etching the third insulating film to thereby define a first trench extending in the first direction, (i) a step for patterning a second resist film having an opening extending in a second direction, etching the second insulating film under the existence of the second resist film and the first coating and thereby defining a second trench over a connecting member between the etched first coatings, (j) a step for forming a first conductive film for burying the first and second trenches over the entire surface of the semiconductor substrate, and (k) a step for removing the first conductive film other than the first and second trenches and thereby forming a second interconnection electrically connected to the connecting member lying over one semiconductor region within the first and second trenches.

(2) A process for manufacturing a semiconductor device, according to the present invention comprises (a) a step for forming isolation regions on a main surface of a semiconductor substrate and arranging a plurality of active regions each having a long side in a first direction, (b) a step for forming first interconnections each extending in a second direction orthogonal to the first direction and serving as a gate electrode of each MISFET over the main surface of the semiconductor substrate, (c) a step for forming a pair of semiconductor regions each serving as a source and drain of each MISFET in the active region between the first interconnections, (d) a step for forming a first insulating film for covering the first interconnections and defining each connecting hole in the first insulating film lying over at least one of the semiconductor regions, (e) a step for forming a connecting member electrically connected to each semiconductor region within its corresponding connecting hole, (f) a step for depositing a second insulating film, a third insulating film and a fourth insulating film having an etching selection ratio with respect to the third insulating film over the connecting member and depositing a first coating over the fourth insulating film, (g) a step for patterning a first resist film extending over the first coating in a first direction and etching the first coating under the existence of the first resist film, (h) a step for etching the fourth insulating film under the existence of the etched first coating with the third insulating film as a stopper and etching the third insulating film to thereby define a first trench extending in the first direction, (i) a step for forming a second conductive film for covering an inner surface of the first trench over the entire surface of the semiconductor substrate and subjecting the second conductive film to anisotropic etching to thereby form side walls comprised of the second conductive film over inner side walls of the first trench, (j) a step for etching the second insulating film under the existence of the first coating and the side walls to thereby define a second trench extending to its corresponding connecting member, (k) a step for forming a first conductive film for burying the first and second trenches over the entire surface of the semiconductor substrate, and (l) a step for removing the first conductive film other than those for the first and second trenches to thereby form a second interconnection electrically connected to its corresponding connecting member lying over one semiconductor region within the first and second trenches.

(3) A process for manufacturing a semiconductor device, according to the present invention is the semiconductor device manufacturing process described in the paragraph (2), wherein before the etching of a second insulating film, a second resist film having an opening extending in a second direction is patterned and a second insulating film is etched under the existence of the second resist film, first coating and side walls to thereby define a second trench.

(4) A process for manufacturing a semiconductor device, according to the present invention comprises (a) a step for forming isolation regions on a main surface of a semiconductor substrate and arranging a plurality of active regions each having a long side in a first direction, (b) a step for forming first interconnections each extending in a second direction orthogonal to the first direction and serving as a gate electrode of each MISFET over the main surface of the semiconductor substrate, (c) a step for forming a pair of semiconductor regions each serving as a source and drain of each MISFET in the active region between the first interconnections, (d) a step for forming a first insulating film for covering the first interconnections and defining each connecting hole in the first insulating film lying over at least one of the semiconductor regions, (e) a step for forming a connecting member electrically connected to each semiconductor region within its corresponding connecting hole, (f) a step for depositing a second insulating film over the connecting member and depositing a first coating over the second insulating film, (g) a step for patterning a first resist film extending in the first direction over the first coating and etching the first coating under the existence of the first resist film, (h) a step for forming a second conductive film for covering an inner surface of each patterned first coating over the entire surface of the semiconductor substrate and subjecting the second conductive film to anisotropic etching to thereby form side walls comprised of the second conductive film over each side wall of the first coating, (i) a step for etching the second insulating film under the existence of the first coating and the side walls to thereby define a second trench extending to its corresponding connecting member, (j) a step for forming a first conductive film for burying the second trench over the entire surface of the semiconductor substrate, and (k) a step for removing the first conductive film other than that for the second trench to thereby form a second interconnection electrically connected to its corresponding connecting member lying over one semiconductor region within the second trench.

(5) A process for manufacturing a semiconductor device, according to the present invention is the semiconductor device manufacturing process described in the paragraph (4), wherein in a step for etching a first coating, a second insulating film corresponding to a bed for the first coating is excessively etched so that the bottom of each side wall is formed so as to be deeper than the bottom of the first coating.

(6) A process for manufacturing a semiconductor device, according to the present invention is the semiconductor device manufacturing process described in any of the paragraph (1) through (5), wherein a first coating and a first conductive film are composed of the same material, and in a step for removing the first conductive film, the first coating or the first coating and side walls are removed together with the first conductive film.

(7) A process for manufacturing a semiconductor device, according to the present invention is the semiconductor device manufacturing process described in any of the paragraph (1) through (6), wherein a fifth insulating film having an etching selection ratio with respect to a second insulating film is formed over the surfaces of a first insulating film and a connecting member, and in a step for defining a second trench, the fifth insulting film is etched after the second insulating film is etched with the fifth insulating film as a stopper.

(8) A semiconductor device according to the present invention comprises a semiconductor substrate in which active regions each having a long side in a first direction are formed by isolation regions formed on a main surface thereof, a gate electrode formed over each active region with a gate insulating film interposed therebetween and extending in a second direction orthogonal to the first direction, a pair of semiconductor regions formed in the active regions on both sides of the gate electrode, a connecting plug formed in a first insulating film for covering the gate electrode and connected to one of the pair of semiconductor regions, a second insulating film formed over the first insulating film, trenches each defined in the second insulating film and extending in the first direction, and bit lines each connected to the connecting plug and formed within each trench, and wherein the trenches are made up of first trenches provided over the second insulating film and second trenches provided below the first trenches, side walls each comprised of a conductor are formed over inner side walls of the first trench, the width of the second trench is narrower than that of the first trench by the thicknesses of the side walls, and the second trenches are continuously defined in the first direction.

(9) A semiconductor device according to the present invention comprises a semiconductor substrate in which active regions each having a long side in a first direction are formed by isolation regions formed on a main surface thereof, a gate electrode formed over each active region with a gate insulating film interposed therebetween and extending in a second direction orthogonal to the first direction, a pair of semiconductor regions formed in the active regions on both sides of the gate electrode, a connecting plug formed in a first insulating film for covering the gate electrode and connected to one of the pair of semiconductor regions, a second insulating film formed over the first insulating film, trenches each defined in the second insulating film and extending in the first direction, and bit lines each connected to the connecting plug and formed within each trench, and wherein the trenches are made up of first trenches provided over the second insulating film and second trenches provided below the first trenches, side walls each comprised of a conductor are formed over inner side walls of the first trench, the width of the second trench is narrower than that of the first trench by the thicknesses of the side walls, the second trenches are defined in the first direction on a non-continual basis, and the second trench is defined only in a region connected to the connecting plug.

(10) A semiconductor device according to the present invention is the semiconductor device described in the paragraph (9), wherein a second trench is defined so as to be longer than the diameter of a connecting plug in a first direction.

(11) A semiconductor device according to the present invention is the semiconductor device described in any of the paragraphs (8) through (10), wherein a second insulating film has an upper layer insulating film and a lower layer insulating film, a first trench is defined in the upper layer insulating film, a second trench is defined in the lower layer insulating film, and a first intermediate insulating film different in etching rate from the upper layer insulating film is formed between the upper layer insulating film and the lower layer insulating film.

(12) A semiconductor device according to the present invention is the semiconductor device described in the paragraph (11), wherein a second intermediate insulating film different in etching rate from a lower layer insulating film is formed between the lower insulating film and a first insulating film.

(13) A semiconductor device according to the present invention is the semiconductor device described in any of the paragraphs (8) through (12), wherein a first MISFET constituting each memory cell and a second MISFET directly constituting a peripheral circuit are formed in a semiconductor substrate, and the width of each bit line in a region connected to each of source and drain regions of the second MISFET is formed so as to be broader than that of each bit line in a region connected to each of source and drain regions of the first MISFET.

(14) A semiconductor device according to the present invention comprises a semiconductor substrate in which active regions each having a long side in a first direction are formed by isolation regions formed on a main surface thereof, a gate electrode formed over each active region with a gate insulating film interposed therebetween and extending in a second direction orthogonal to the first direction, a pair of semiconductor regions formed in the active regions on both sides of the gate electrode, a connecting plug formed in a first insulating film for covering the gate electrode and connected to one of the pair of semiconductor regions, a second insulating film formed over the first insulating film, trenches each defined in the second insulating film and extending in the first direction, and bit lines each connected to the connecting plug and formed within each trench, and wherein the trenches are made up of first trenches provided over the second insulating film and second trenches provided below the first trenches, the second trenches are defined in the first direction on a non-continual basis, and the second trench is defined in a region connected to the connecting plug so as to be longer than the diameter of the connecting plug in the first direction.

Typical ones of various inventions of the present inventions have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1(*b*) is an equivalent circuit diagram of the DRAM according to the embodiment 1;

FIG. 3(*b*) is a partially sectional view of the DRAM according to one embodiment of the present invention;

FIG. 3(*c*) is a partially sectional view of the DRAM according to one embodiment of the present invention;

FIG. 3(*d*) is a partially sectional view of the DRAM according to one embodiment of the present invention;

FIG. 4(*b*) is a cross-sectional view illustrating one example of the process for manufacturing the DRAM according to the embodiment 1 in process order;

FIG. 4(*c*) is a plan view depicting one example of the process for manufacturing the DRAM according to the embodiment 1 in process order;

FIG. 5(*b*) is a plan view illustrating one example of the process for manufacturing the DRAM according to the embodiment 1 in process order;

FIG. 6(*b*) is a cross-sectional view showing one example of the process for manufacturing the DRAM according to the embodiment 1 in process order;

FIG. 6(*c*) is a cross-sectional view illustrating one example of the process for manufacturing the DRAM according to the embodiment 1 in process order;

FIG. 6(*d*) is a cross-sectional view depicting one example of the process for manufacturing the DRAM according to the embodiment 1 in process order;

FIG. 7(*b*) is a cross-sectional view illustrating one example of the process for manufacturing the DRAM according to the embodiment 1 in process order;

FIG. 7(*c*) is a cross-sectional view depicting one example of the process for manufacturing the DRAM according to the embodiment 1 in process order;

FIG. 7(*d*) is a cross-sectional view showing one example of the process for manufacturing the DRAM according to the embodiment 1 in process order;

FIG. 9(*b*) is a cross-sectional view illustrating one example of the process for manufacturing the DRAM according to the embodiment 1 in process order;

FIG. 9(*c*) is a cross-sectional view depicting one example of the process for manufacturing the DRAM according to the embodiment 1 in process order;

FIG. 9(*d*) is a cross-sectional view showing one example of the process for manufacturing the DRAM according to the embodiment 1 in process order;

FIG. 10(*b*) is a cross-sectional view illustrating one example of the process for manufacturing the DRAM according to the embodiment 1 in process order;

FIG. 10(*c*) is a cross-sectional view depicting one example of the process for manufacturing the DRAM according to the embodiment 1 in process order;

FIG. 10(*d*) is a cross-sectional view showing one example of the process for manufacturing the DRAM according to the embodiment 1 in process order;

FIG. 12(*b*) is a cross-sectional view illustrating one example of the process for manufacturing the DRAM according to the embodiment 1 in process order;

FIG. 12(*c*) is a cross-sectional view depicting one example of the process for manufacturing the DRAM according to the embodiment 1 in process order;

FIG. 12(*d*) is a cross-sectional view showing one example of the process for manufacturing the DRAM according to the embodiment 1 in process order;

FIG. 14(*b*) is a cross-sectional view illustrating one example of the process for manufacturing the DRAM according to the embodiment 1 in process order;

FIG. 14(*c*) is a cross-sectional view depicting one example of the process for manufacturing the DRAM according to the embodiment 1 in process order;

FIG. 14(*d*) is a cross-sectional view showing one example of the process for manufacturing the DRAM according to the embodiment 1 in process order;

FIG. 15(*b*) is a cross-sectional view illustrating one example of the process for manufacturing the DRAM according to the embodiment 1 in process order;

FIG. 15(*c*) is a cross-sectional view depicting one example of the process for manufacturing the DRAM according to the embodiment 1 in process order;

FIG. 15(*d*) is a cross-sectional view showing one example of the process for manufacturing the DRAM according to the embodiment 1 in process order;

FIG. 16(*b*) is a cross-sectional view illustrating one example of the process for manufacturing the DRAM according to the embodiment 1 in process order;

FIG. 16(*c*) is a cross-sectional view depicting one example of the process for manufacturing the DRAM according to the embodiment 1 in process order;

FIG. 16(*d*) is a cross-sectional view showing one example of the process for manufacturing the DRAM according to the embodiment 1 in process order;

FIG. 17(*b*) is a cross-sectional view illustrating one example of the process for manufacturing the DRAM according to the embodiment 1 in process order;

FIG. 17(*c*) is a cross-sectional view depicting one example of the process for manufacturing the DRAM according to the embodiment 1 in process order;

FIG. 17(*d*) is a cross-sectional view showing one example of the process for manufacturing the DRAM according to the embodiment 1 in process order;

FIG. 18(*b*) is a cross-sectional view illustrating one example of the process for manufacturing the DRAM according to the embodiment 1 in process order;

FIG. 18(*c*) is a cross-sectional view depicting one example of the process for manufacturing the DRAM according to the embodiment 1 in process order;

FIG. 18(*d*) is a cross-sectional view showing one example of the process for manufacturing the DRAM according to the embodiment 1 in process order;

FIG. 19(*b*) is a cross-sectional view illustrating one example of the process for manufacturing the DRAM according to the embodiment 1 in process order;

FIG. 19(*c*) is a cross-sectional view depicting one example of the process for manufacturing the DRAM according to the embodiment 1 in process order;

FIG. 19(*d*) is a cross-sectional view showing one example of the process for manufacturing the DRAM according to the embodiment 1 in process order;

FIG. 20(*b*) is a cross-sectional view illustrating one example of the process for manufacturing the DRAM according to the embodiment 1 in process order;

FIG. 20(*c*) is a cross-sectional view depicting one example of the process for manufacturing the DRAM according to the embodiment 1 in process order;

FIG. 21(*b*) is a cross-sectional view illustrating one example of the process for manufacturing the DRAM according to the embodiment 2 in process order;

FIG. 21(*c*) is a cross-sectional view depicting one example of the process for manufacturing the DRAM according to the embodiment 2 in process order;

FIG. 21(*d*) is a cross-sectional view showing one example of the process for manufacturing the DRAM according to the embodiment 2 in process order;

FIG. 23(*b*) is a cross-sectional view illustrating one example of the process for manufacturing the DRAM according to the embodiment 2 in process order;

FIG. 23(*c*) is a cross-sectional view depicting one example of the process for manufacturing the DRAM according to the embodiment 2 in process order;

FIG. 23(*d*) is a cross-sectional view showing one example of the process for manufacturing the DRAM according to the embodiment 2 in process order;

FIG. 25(*b*) is a cross-sectional view illustrating one example of the process for manufacturing the DRAM according to the embodiment 2 in process order;

FIG. 25(*c*) is a cross-sectional view depicting one example of the process for manufacturing the DRAM according to the embodiment 2 in process order;

FIG. 25(*d*) is a cross-sectional view showing one example of the process for manufacturing the DRAM according to the embodiment 2 in process order;

FIG. 26(*b*) is a cross-sectional view illustrating one example of the process for manufacturing the DRAM according to the embodiment 2 in process order;

FIG. 26(*c*) is a cross-sectional view depicting one example of the process for manufacturing the DRAM according to the embodiment 2 in process order;

FIG. 26(*d*) is a cross-sectional view showing one example of the process for manufacturing the DRAM according to the embodiment 2 in process order;

FIG. 28(*b*) is a cross-sectional view illustrating another example of the process for manufacturing the DRAM according to the embodiment 2 in process order;

FIG. 28(*c*) is a cross-sectional view depicting another example of the process for manufacturing the DRAM according to the embodiment 2 in process order;

FIG. 28(*d*) is a cross-sectional view showing another example of the process for manufacturing the DRAM according to the embodiment 2 in process order;

FIG. 29(*b*) is a cross-sectional view illustrating another example of the process for manufacturing the DRAM according to the embodiment 2 in process order;

FIG. 29(*c*) is a cross-sectional view depicting another example of the process for manufacturing the DRAM according to the embodiment 2 in process order;

FIG. 29(*d*) is a cross-sectional view showing another example of the process for manufacturing the DRAM according to the embodiment 2 in process order;

FIG. 31(*b*) is a cross-sectional view illustrating one example of the process for manufacturing the DRAM according to the embodiment 3 in process order;

FIG. 31(*c*) is a cross-sectional view depicting one example of the process for manufacturing the DRAM according to the embodiment 3 in process order;

FIG. 31(*d*) is a cross-sectional view showing one example of the process for manufacturing the DRAM according to the embodiment 3 in process order;

FIG. 31(*e*) is a cross-sectional view depicting one example of the process for manufacturing the DRAM according to the embodiment 3 in process order;

FIG. 31(*f*) is a cross-sectional view showing one example of the process for manufacturing the DRAM according to the embodiment 3 in process order;

FIG. 32(*b*) is a cross-sectional view illustrating one example of the process for manufacturing the DRAM according to the embodiment 3 in process order;

FIG. 32(*c*) is a cross-sectional view depicting one example of the process for manufacturing the DRAM according to the embodiment 3 in process order;

FIG. 32(*d*) is a cross-sectional view showing one example of the process for manufacturing the DRAM according to the embodiment 3 in process order;

FIG. 32(*e*) is a cross-sectional view depicting one example of the process for manufacturing the DRAM according to the embodiment 3 in process order;

FIG. 32(*f*) is a cross-sectional view showing another example of the process for manufacturing the DRAM according to the embodiment 3 in process order;

FIG. 33(*b*) is a cross-sectional view illustrating another example of the process for manufacturing the DRAM according to the embodiment 3 in process order;

FIG. 33(*c*) is a cross-sectional view depicting another example of the process for manufacturing the DRAM according to the embodiment 3 in process order;

FIG. 33(*d*) is a cross-sectional view showing another example of the process for manufacturing the DRAM according to the embodiment 3 in process order;

FIG. 33(*e*) is a cross-sectional view depicting another example of the process for manufacturing the DRAM according to the embodiment 3 in process order;

FIG. 33(*f*) is a cross-sectional view showing another example of the process for manufacturing the DRAM according to the embodiment 3 in process order;

FIG. 36(*b*) is a cross-sectional view illustrating another example of the process for manufacturing the DRAM according to the still further embodiment of the present invention in process order;

FIG. 36(*c*) is a cross-sectional view showing another example of the process for manufacturing the DRAM according to the still further embodiment of the present invention in process order;

FIG. 36(*d*) is a cross-sectional view depicting another example of the process for manufacturing the DRAM according to the still further embodiment of the present invention in process order;

FIG. 37(*b*) is a cross-sectional view illustrating another example of the process for manufacturing the DRAM according to the still further embodiment of the present invention in process order;

FIG. 37(*c*) is a cross-sectional view depicting another example of the process for manufacturing the DRAM according to the still further embodiment of the present invention in process order; and FIG. 37(*d*) is a cross-sectional view illustrating another example of the process for manufacturing the DRAM according to the still further embodiment of the present invention in process order.

DESCRIPTION OF THE PREFERRED EMB0DIMENTS

Figure 1A:
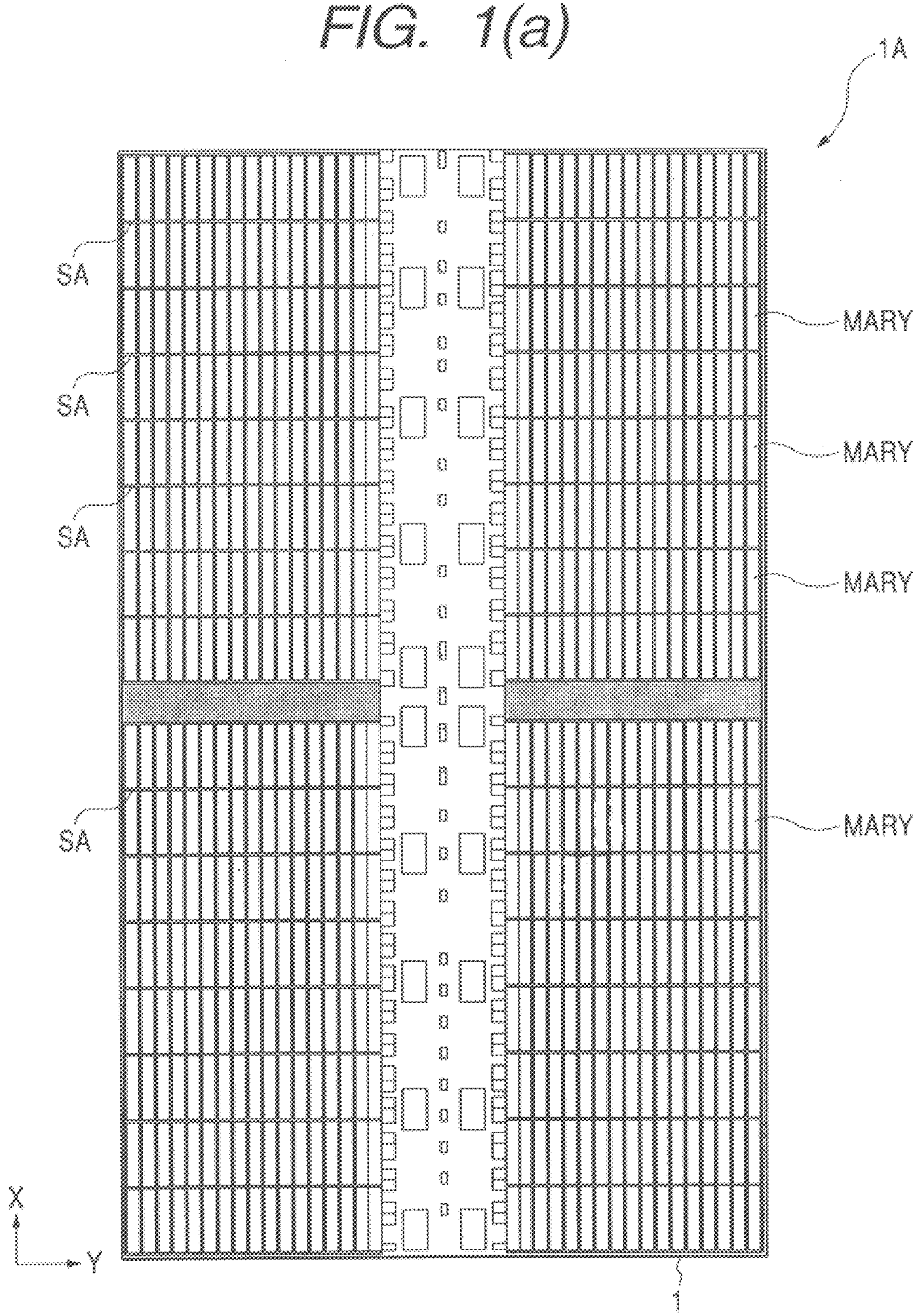
FIG. 1(*a*) is a plan view showing one example of the overall semiconductor chip with a DRAM according to an embodiment 1 formed therein.

Preferred embodiments of the present invention will hereinafter be described in detail with reference to the accompanying drawings. Incidentally, members or components having the same function in all the drawings for describing the embodiments are identified by the same reference numerals and their repetitive description will be omitted.

Figure 1B:
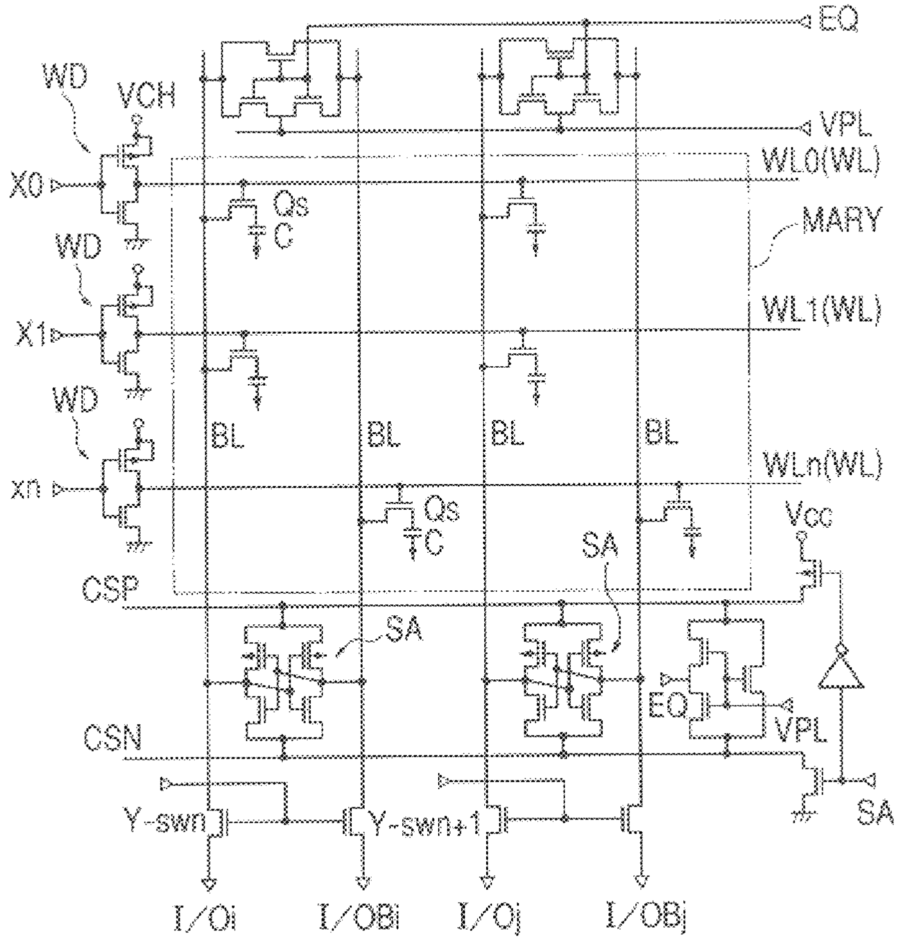

FIG. 1(*a*) is a plan view showing one example of the entire semiconductor chip with a DRAM according to an embodiment 1 formed therein. As shown in the drawing, a large number of memory arrays MARYs are placed in matrix form over a main surface of a semiconductor chip 1A comprised of monocrystalline silicon along an X direction (corresponding to the longitudinal direction of the semiconductor chip 1A: first direction) and a Y direction (corresponding to the transverse direction of the semiconductor chip 1A: second direction). Sense amplifiers SA are placed between the memory arrays MARYs adjacent to one another along the X direction. Control circuits such as word drivers WD, data line selection circuits, etc., input/output circuits, bonding pads, etc. are placed in the central portion of the main surface of the semiconductor chip 1A.

FIG. 1(*b*) is an equivalent circuit diagram of the DRAM according to the present embodiment 1. As shown in the drawing, each memory array (MARY) of the DRAM comprises a plurality of word lines WL ($WL_0$, $WL_1$, $WL_n$, . . . ) placed in matrix form and a plurality of bit lines BL, and a plurality of memory cells placed in points where they intersect respectively. Each memory cell, which stores one-bit information therein, comprises one capacitor C and one selection MISFET Qs electrically connected in series with the capacitor C. One of the source and drain of each selection MISFET Qs is electrically connected to the capacitor C and the other thereof is electrically connected to its corresponding bit line BL. One end of each word line WL is electrically connected to its corresponding word driver WD, and one end of each bit line BL is electrically connected to its corresponding sense amplifier SA.

Figure 2:
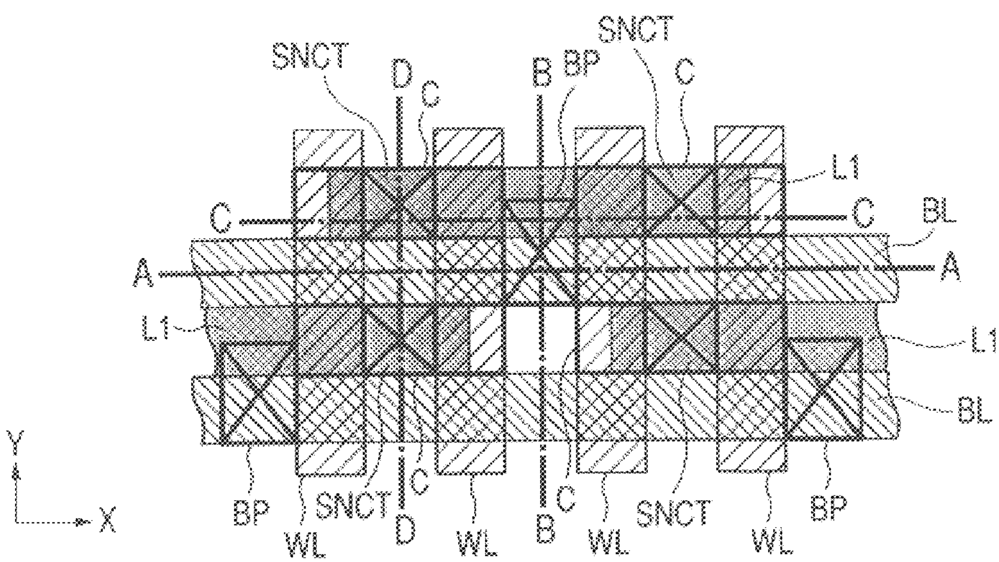
FIG. 2 is a partly enlarged plan view of a memory array MARY shown in FIG. 1.
Figure 3A:
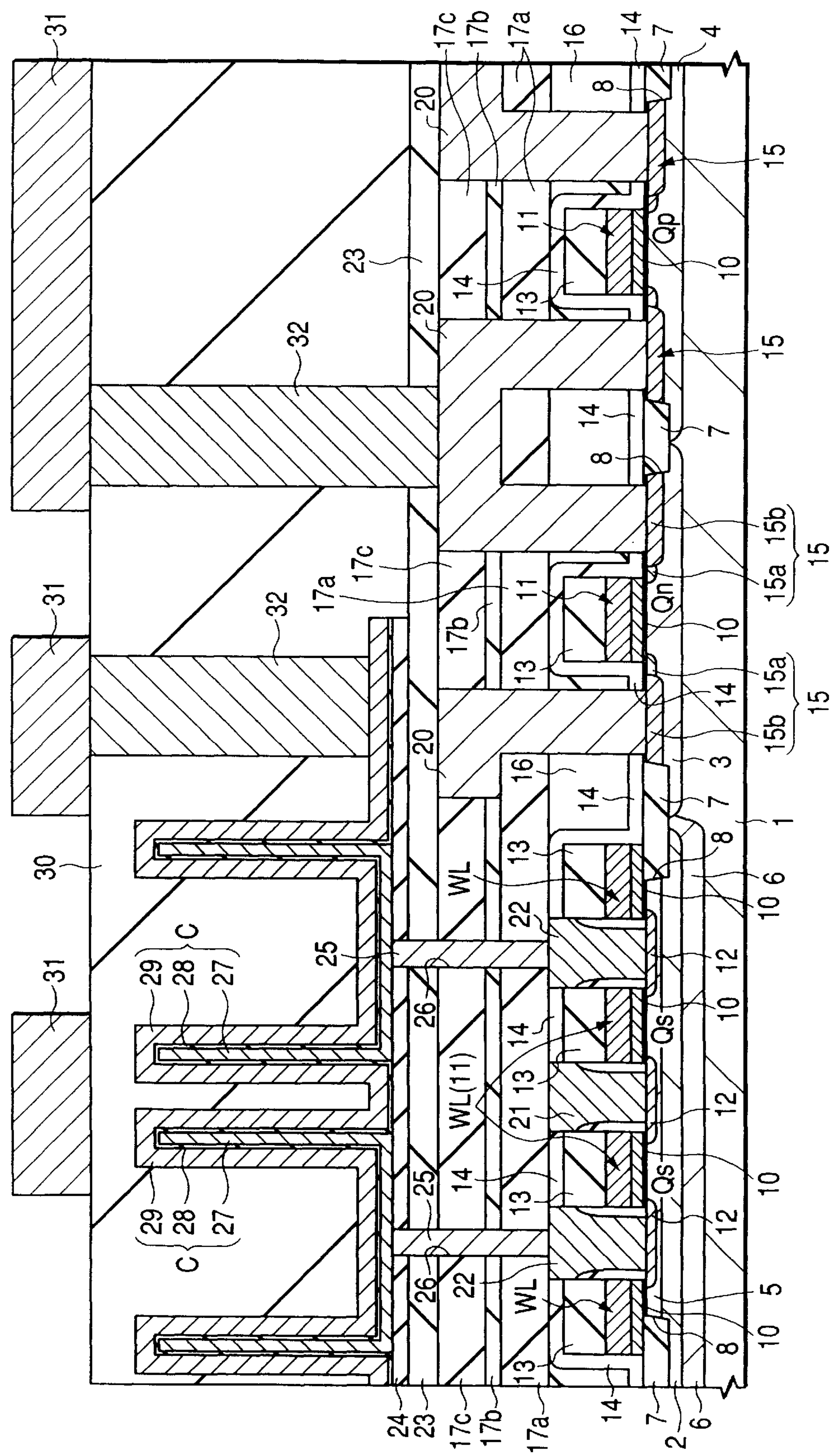
FIG. 3(*a*) is a partially sectional view of a DRAM according to one embodiment of the present invention.
Figure 3D:
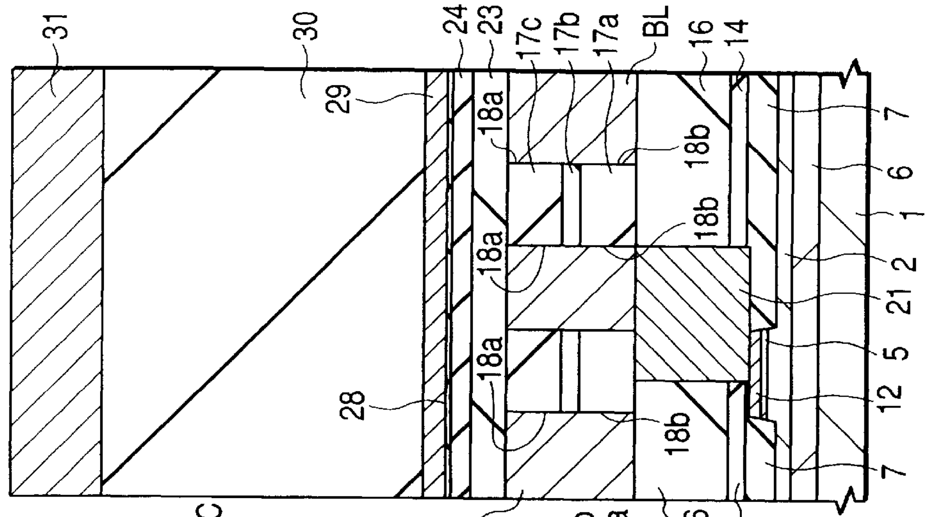
Figure 3C:
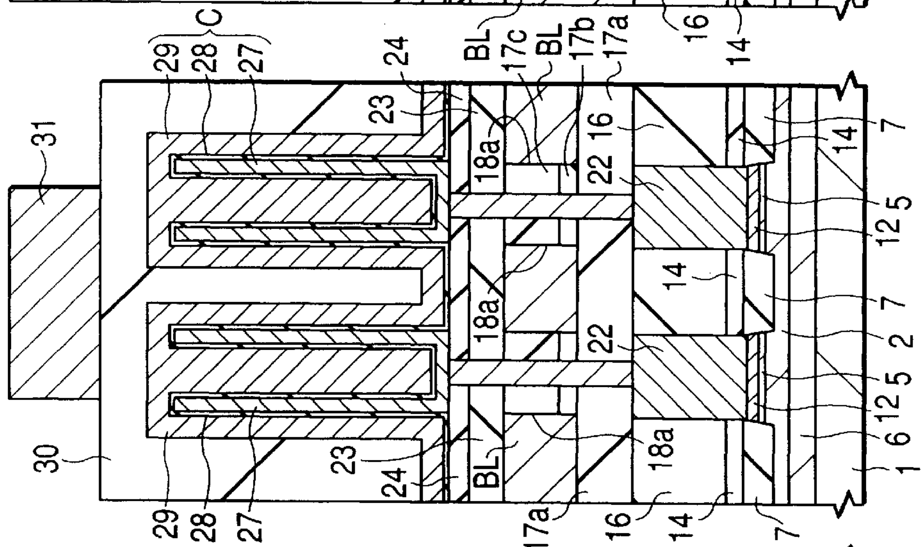
Figure 3B:
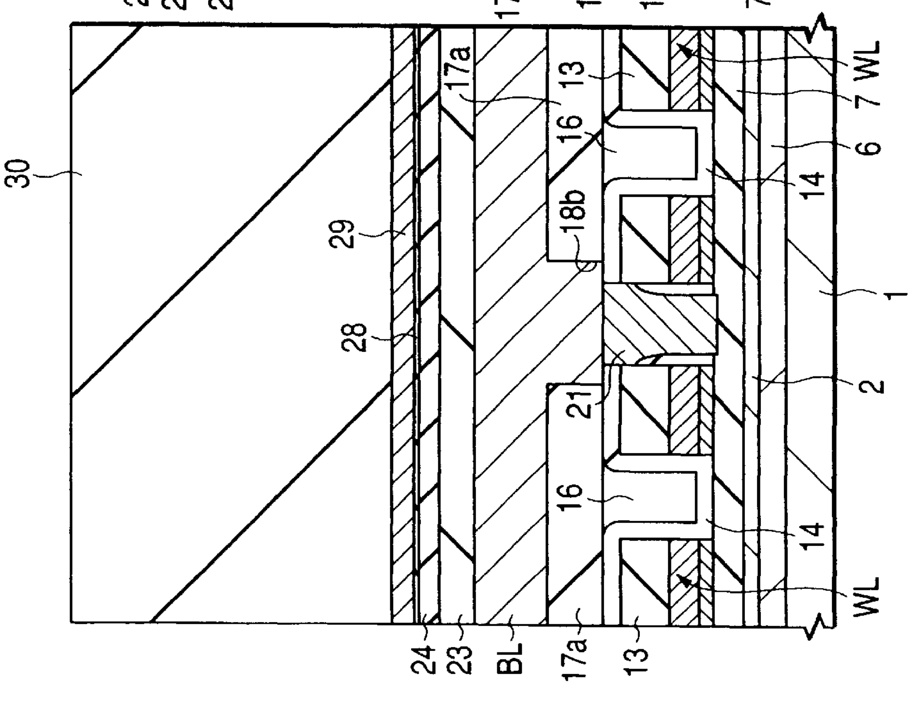

FIG. 2 is a partially enlarged plan view of each memory array MARY shown in FIG. 1. Incidentally, the present plan view and subsequent plan views show patterns which constitute members respectively, and do not represent the forms of actual members. Namely, the patterns illustrated in the drawing are drawn in the form of a rectangle or square, whereas the vertical angle of each actual member is shaped in a circle or at an obtuse angle. Active regions L1 are placed in the memory array MARY. Word lines WL are formed in the Y direction (second direction) and bit lines BL are formed in the X direction (first direction). In regions in which the word lines WL and the active regions L1 respectively overlaps each other, the word lines WL function as gate electrodes of each individual selection MISFETs Qs. Connecting plugs BP electrically connected to their corresponding bit lines BL are formed in regions in the active regions L1, which are interposed between regions which serve as the gate electrodes for the gate lines WL, i.e., the central portions of the active regions L1. Each connecting plug BP has a shape long in the Y direction so as to be spread over the active region L1 and the bit line BL. The central portion of each active region L1 and each bit line are electrically connected to each other through its corresponding connecting plug BP. Regions at both ends of each active region L1 are electrically connected to their corresponding capacitors C through capacitive electrode connecting holes SNCT.

In the present embodiment, the bit lines BL and the active regions L1 are respectively shaped in linear forms extending in the X direction. Since they are shaped in the linear forms in this way, interference by exposure light can be lessened and a processing margin can be improved, upon photolithography at the time of the processing of the bit lines BL and the active regions L1.

FIG. 3 is a partly sectional view of the DRAM according to the present embodiment. FIGS. 3(*a*), 3(*b*), 3(*c*) and 3(*d*) respectively show a cross section taken along line C—C in FIG. 2, a cross section taken along line A—A in FIG. 2, a cross section taken along line D—D in FIG. 2 and a cross section taken along line B—B in FIG. 2. In FIG. 3(*a*), a memory cell region of the DRAM is illustrated on the left side, and a peripheral circuit region is shown on the right side. In the present embodiment, a manufacturing technique using a 0.18 μm design rule is illustrated as an example.

A p type well 2 for the memory cell region, and a p type well 3 and an n type well 4 for the peripheral circuit region are formed over a main surface of a semiconductor substrate 1. The semiconductor substrate 1 is composed of p type monocrystalline silicon having a resistivity of 10 Ω·cm, for example. Further, a threshold voltage control layer 5 is formed over a main surface of the p type well 2, and an n type deep well 6 is formed so as to surround the p type well 2. Incidentally, the threshold voltage control layers may be formed even over other respective wells.

Isolation regions 7 are respectively formed over the main surfaces of the respective wells. Each isolation region 7 is composed of a silicon oxide film and formed so as to be embedded in a shallow groove or trench 8 defined in the main surface of the semiconductor substrate 1. Each shallow trench 8 has a depth of 0.3 μm, for example. A silicon oxide film subjected to thermal oxidation may be formed on an inner wall of the shallow trench 8.

Selection MISFETs Qs of the DRAM are formed over the main surface of the p type well 2. Further, an n channel MISFET Qn and a p channel MISFET Qp are respectively formed over main surfaces of the p type well 3 and the n type well 4.

Each selection MISFET Qs has a gate electrode 11 formed over the main surface of the p type well 2 with a gate insulator 10 interposed therebetween, and semiconductor regions 12 formed over the main surface of the p type well 2 on both sides of the gate electrode 11.

Each gate insulator 10 is comprised of a silicon oxide film formed by thermal oxidation, which has a thickness of from 7 nm to 8 nm, for example.

The gate electrode 11 can be formed as a film obtained by stacking a polycrystalline silicon film having a thickness of, for example, 50 nm and a tungsten silicide ($WSi_2$) film having a thickness of 100 nm on each other. For example, phosphorus (P) can be introduced into the polycrystalline silicon film on the order of $3\times10^{20}$ atoms/$cm^3$. Incidentally, other silicide films such as a cobalt silicide (CoSi) film, a titanium silicide (TiSi) film, etc. other than the tungsten silicide film may be used. Further, the gate electrode 11 may be formed as a film by laminating, for example, a polycrystalline silicon film having a thickness of 70 nm, a titanium nitride film having a thickness of 50 nm and a tungsten film having a thickness of 100 nm on each other. A tungsten nitride film may be used in place of the titanium nitride film.

An n type impurity such as arsenic (As) or phosphorus is introduced into each semiconductor region 12.

Cap insulators or insulating films 13 each composed of a silicon nitride film are formed over their corresponding gate electrodes 11 of the selection MISFETs Qs. Further, the upper layers of the cap insulating films 13 are covered with a silicon nitride film 14. The thickness of each cap insulating film 13 is 200 nm, for example, and the thickness of the silicon nitride film 14 is 30 nm, for example. The silicon nitride film 14 is formed even over side walls of the gate electrodes 11 and used for self-alignment processing at the time that each connecting hole to be described later is defined. Incidentally, the gate electrode 11 of each selection MISFET Qs serves as the word line WL of the DRAM. A part of each word line WL is formed over the upper surface of each isolation region 7.

On the other hand, the n channel MISFET Qn and p channel MISFET Qp are respectively formed over the main surfaces of the respective p type well 3 and n type well 4 and are respectively made up of gate electrodes 11 formed through gate insulators or insulating films 10, and semiconductor regions 15 formed over the main surfaces of the respective wells on both sides of the gate electrodes 11. The gate insulators 10 and gate electrodes 11 are similar to those described above. Each semiconductor region 15 comprises a low-density impurity region 15*a* and a high-density impurity region 15*b*, which forms a so-called an LDD (Lightly Doped Drain) structure. As an impurity to be introduced into the semiconductor region 15, an n type or p type impurity is introduced therein according to the conduction type of each MISFET.

Cap insulators 13 composed of a silicon nitride film are provided at layers above the gate electrodes 11 of the n channel MISFET Qn and p channel MISFET Qp. Further, the upper layers of the cap insulators 13 and the side walls of the gate electrodes 11 and cap insulators 13 are covered with a silicon nitride film 14. The cap insulators 13 and the silicon nitride film 14 are similar to those described above.

Insulating films 16 are embedded in gaps defined between the adjacent gate electrodes 11 of the selection MISFETs Qs, n channel MISFET Qn and p channel MISFET Qp. Each insulating film 16 can be formed as a film obtained by stacking on each other, for example, an SOG film and a TEOS oxide film obtained by flattening a silicon oxide film (hereinafter called TEOS oxide film) formed by a plasma CVD method with, for example, TEOS (Tetraethoxysilane) as a material gas by using a CMP (Chemical Mechanical Polishing) method.

Insulating films 17*a*, 17*b* and 17*c* are formed over the insulating film 16. The insulating films 17*a* and 17*c* are respectively composed of, for example, the TEOS oxide film, and wiring grooves or trenches 18*b* are comprised of a silicon nitride film. As will be described later, each wiring trench 18*b* serves as an etching stopper used upon execution of etching for defining each wiring trench in the insulating film 17*c*.

Wiring grooves or trenches 18*a* are defined in the insulating films 17*b* and 17*c*, and the wiring trenches 18*b* are defined in the insulating film 17*a*. The bit lines BL and first layer interconnections 20 are formed inside the wiring trenches 18*a* and 18*b* respectively. Each bit line BL is electrically connected to its corresponding connecting plug 21 to be described later through the wiring trench 18*b*.

As will be described later, the bit lines BL and the first layer interconnections 20 are simultaneously formed by using the CMP method. While the bit lines BL and the first layer interconnections 20 are respectively composed of, for example, a tungsten film, they may use another metal such as a copper film or the like.

Each bit line BL is electrically connected to its corresponding semiconductor region 12 shared between one pair of MISFETs Qs, through the connecting plug 21. As shown even in the plan view of FIG. 2, the connecting plugs 21 are formed long in the Y direction so as to be superimposed on the pattern of each active region L1 and the pattern of each bit line BL.

Connecting plugs 22 connected to their corresponding capacitors are respectively formed over the other semiconductor regions 12 of the selection MISFETs Qs. The connecting plugs 21 and 22 can be respectively formed as a polycrystalline silicon film in which an n type impurity, e.g. phosphorus is introduced therein on the order of $2\times10^{20}$ atmos/$cm^3$.

Incidentally, the first layer interconnections (bit lines BL) are directly connected to their corresponding high-density impurity regions 15*b* of the n channel MISFET Qn and p channel MISFET Qp formed in the peripheral circuit region (peripheral circuit region). Incidentally, a silicide film composed of cobalt, titanium, tantalum, tungsten or the like can be formed over the surface of each high-density impurity region 15*b*.

The bit lines BL and first layer interconnections 20 are covered with an interlayer insulator 23. The interlayer insulator 23 can be formed as the TEOS oxide film, for example.

An insulator or insulating film 24 composed of a silicon nitride film is formed over the memory cell region corresponding to a layer above the interlayer insulator 23. Further, each capacitor C for information storage is formed thereon. As will be described later, the insulating film 24 is a thin film which serves as an etching stopper used upon formation of a lower electrode 27 of each capacitor C.

The capacitor C comprises the lower electrode 27 electrically connected to its corresponding connecting plug 22 through a connecting plug 25, a capacitive insulating film 28 composed of, for example, a silicon nitride film and tantalum oxide, and a plate electrode 29 composed of, for example, titanium nitride. Each connecting plug 25 is formed within its corresponding capacitive electrode connecting hole 26.

An insulating film 30 comprised of, for example, the TEOS oxide film is formed over each capacitor C. Incidentally, an insulting film may be formed over the interlayer insulator 23 in the peripheral circuit region at the same layer as that for the capacitor C. The insulating film permits prevention of the occurrence of a step-like offset or step between the memory cell region and the peripheral circuit region due to the height of each capacitor C and makes allowance for a focal depth of photolithography, thereby making it possible to stabilize the process and cope with micro-fabrication.

Second layer interconnections 31 are formed over the insulating film 30. Each of plugs 32 connects between the second layer interconnection 31 and the upper electrode 29 or first layer interconnection 20. The second layer interconnections 31 can be constructed as a film obtained by stacking, for example, a titanium nitride film, an aluminum film and the titanium nitride film on each other. The plugs 32 can be formed as a film obtained by stacking, for example, a titanium film, a titanium nitride film and a tungsten film on each other.

Incidentally, third layer interconnections or fourth and more wiring layers may further be provided over the second layer interconnections 31 through an interlayer insulator. However, their description will be omitted.

A process for manufacturing the DRAM according to the present embodiment 1 will next be described with reference to the drawings. FIGS. 4 through 19 are respectively cross-sectional views or plan views showing one example of the process for manufacturing the DRAM according to the present embodiment 1 in process order. Incidentally, the cross-sectional views respectively show a cross-section taken along line C—C in FIG. 2 and a cross-section of a peripheral circuit portion unless indicated in particular.

Figure 4A:
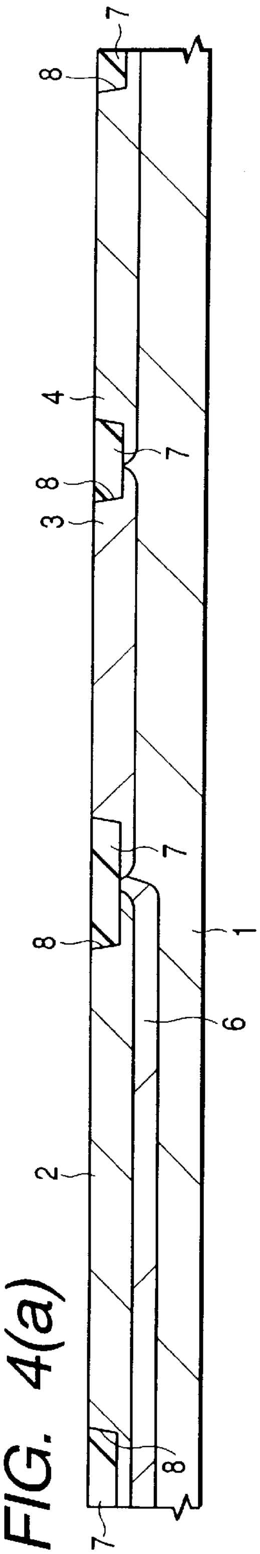
FIG. 4(*a*) is a cross-sectional view showing one example of a process for manufacturing the DRMA according to the embodiment 1 in process order.
Figure 4B:
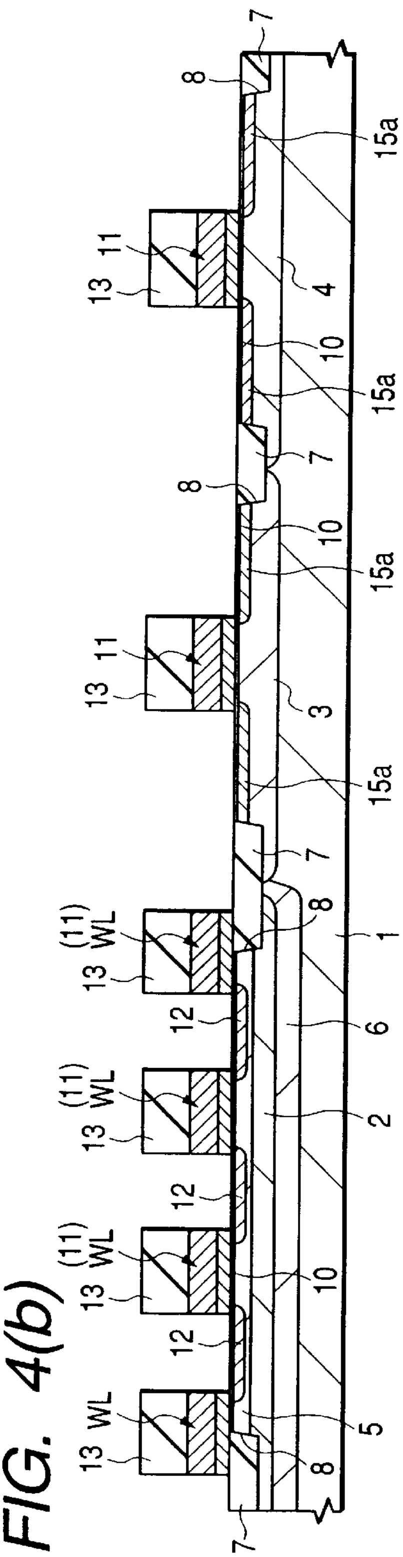
Figure 4C:
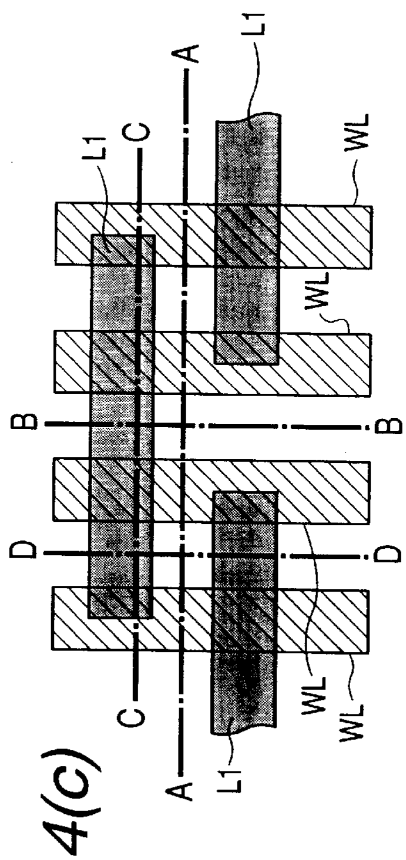

As shown in FIG. 4(*a*), a p type semiconductor substrate 1 having a resistivity of about 10 Ω·cm, for example, is first prepared. Shallow trenches 8 each having a depth of 0.3 $\mu$m are defined in a main surface of the semiconductor substrate 1. Thereafter, the semiconductor substrate 1 is subjected to thermal oxidation and thereby a silicon oxide film may be formed thereon. Further, a silicon oxide film is deposited thereon and polished by the CMP method to leave the silicon oxide films within the shallow trenches 8, thereby forming isolation regions 7.

Incidentally, patterns of active regions L1, which are surrounded by the isolation regions 7 at this time, are linear plane or flat patterns as shown in FIG. 4(*c*). Therefore, the factors such as interference by exposure light, that have reduced the accuracy of processing of each shallow trench 8, can be eliminated to the utmost upon processing of each shallow trench 8 by photolithography, and the shallow trench 8 can be processed with satisfactory accuracy even in the vicinity of a processing limit of the photolithography.

Next, phosphorus ions are injected with a photoresist as a mask to thereby form a deep well 6. Thereafter, the ions of phosphorus are ion-implanted with a photoresist as a mask to thereby form an n type well 4. Further, boron ions are ion-implanted with a photoresist as a mask to thereby form p type wells 2 and 3. Furthermore, boron difluoride ($BF_2$) ions may be ion-implanted in the entire surface of the semiconductor of substrate 1.

Next, gate insulators 10 are formed in the active regions in which the p type wells 2 and 3 are formed, by a thermal oxidation method as shown in FIG. 4(*b*). Further, the ions of boron are ion-implanted in each memory cell region of the DRAM under the conditions of an acceleration energy of 20 keV and a dose of about $3\times10^{12}/cm^2$, thereby forming a threshold voltage control layer 5 for each selection MISFET Qs. The threshold voltage control layer 5 is capable of adjusting the threshold voltage of each selection MISFET Qs to about 0.7V.

Next, a polycrystalline silicon film in which, for example, phosphorus has been introduced therein as an impurity with a concentration of $3\times10^{20}/cm^3$, is formed over the entire surface of the semiconductor substrate 1 with a thickness of 50 nm. Next, a tungsten silicide film is deposited thereon with a thickness of 100 nm, for example. Further, a silicon nitride film is deposited thereon with a thickness of 200 nm, for example. The polycrystalline silicon film and the silicon nitride film can be formed by, for example, a CVD (Chemical Vapor Deposition) method, and the tungsten silicide film can be formed by a sputtering method. Thereafter, the silicon nitride film, tungsten silicide film and polycrystalline silicon film can be subjected to patterning by a photolithography technique and an etching technique to thereby form gate electrodes 11 (word lines WL) and cap insulating films or insulators 13. Patterns of the word lines (cap insulators 13 are also similar to them) at this time are illustrated in FIG. 4(*c*). The word lines WL are patterned in linear form. It is understood that photolithography can be easily carried out even at its processing limit.

With the cap insulators 13 and gate electrodes 11 and photoresists as masks, an impurity, e.g., arsenic (As) or phosphorus is next ion-implanted in a memory cell forming region and a region in which each n channel MISFET Qn in a peripheral circuit region is formed, thereby forming semiconductor regions 12 and low-density impurity regions 15*a* for the n channel MISFETs Qp. Thereafter, an impurity, e.g., boron (B) is ion-implanted in a region in which each p channel MISFET Qp in the peripheral circuit region is formed, thereby forming low-density impurity regions 15*a* for each p channel MISFET Qp.

Figure 5A:
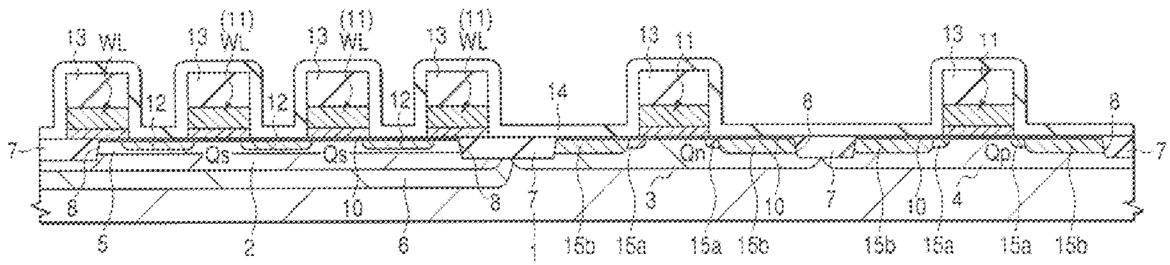
FIG. 5(*a*) is a cross-sectional view showing one example of the process for manufacturing the DRAM according to the embodiment 1 in process order.
Figure 5B:
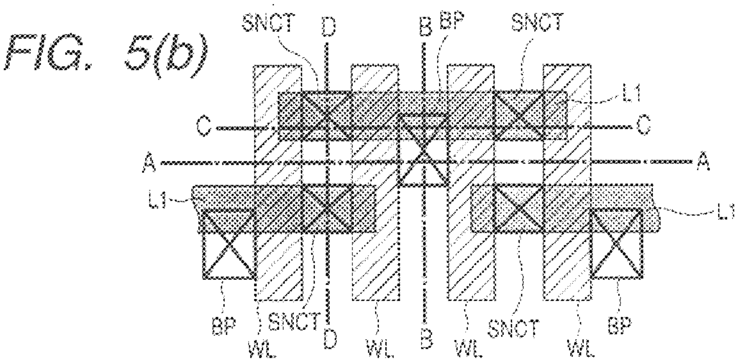
Figures 6A, 6B, 6C, 6D:
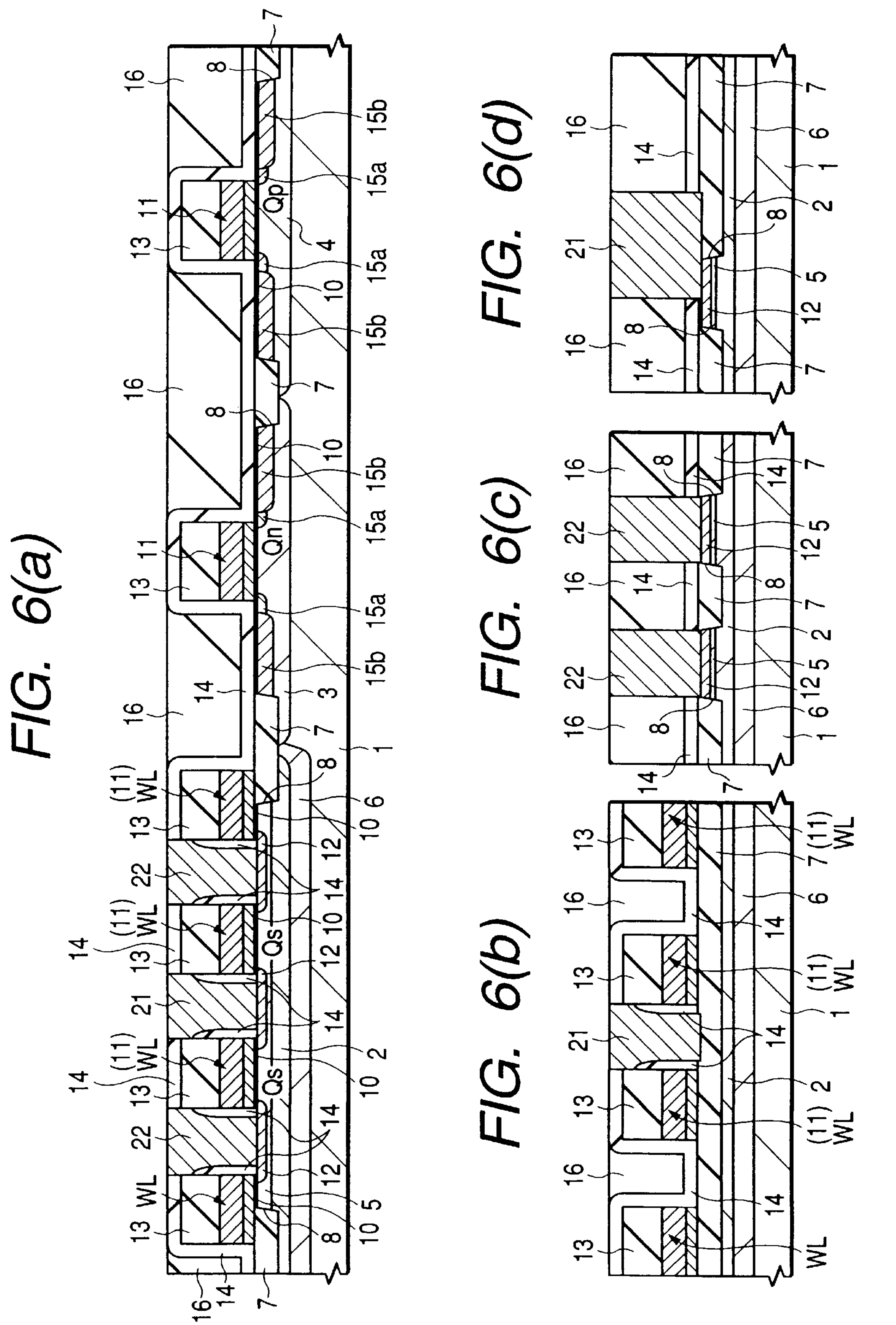
FIG. 6(*a*) is a cross-sectional view depicting one example of the process for manufacturing the DRAM according to the embodiment 1 in process order.

Next, a silicon nitride film 14 is deposited over the entire surface of the semiconductor substrate 1 with a thickness of 30 nm, for example as shown in FIG. 5(*a*). Incidentally, the silicon nitride film 14 is subjected to anisotropic etching with a photoresist film formed only in the memory cell forming region as a mask, whereby the silicon nitride film 14 is left only over the semiconductor substrate 1 in each memory cell region and at the same time side wall spacers may be formed on side walls of the gate electrodes 11 in the peripheral circuit region.

A photoresist film is next formed over the memory cell forming region and the region in which each n channel MISFET Qn in the peripheral circuit region is formed. The impurity, e.g., boron is ion-implanted with the formed photoresist film and the silicon nitride film 14 as masks to thereby form high-density impurity regions 15*b* for each p channel MISFET Qp. Further, the photoresist film is formed over the memory cell forming region and the region in which each p channel MISFET Qp in the peripheral circuit region is formed. The impurity, e.g., phosphorus is ion-implanted with the resultant photoresist film and the silicon nitride film 14 as masks, thereby forming high-density impurity regions 15*b* for each n channel MISFET Qn.

Next, a silicon oxide film having a thickness of 400 nm, for example is formed by the CVD method, and the silicon oxide film is polished and flattened by the CMP (Chemical Mechanical Polishing) method to thereby form insulating films 16.

Thereafter, connecting holes corresponding to patterns BP for connecting plugs 21 and patterns SNCT for connecting plugs 22, which are shown in FIG. 5(*b*), are defined and subjected to plug-implantation. Thereafter, a polycrystalline silicon film doped with an impurity is deposited and polished by the CMP method to thereby form the connecting plugs 21 and 22 (see FIG. 6). Incidentally, FIGS. 6(*a*), 6(*b*), 6(*c*) and 6(*d*) respectively show a cross-section taken along line C—C, a cross-section taken along line A—A, a cross-section taken along line D—D and a cross-section taken along line B—B in FIG. 2. FIGS. 7, 9, 10, 12 and 14 through 19 are hereafter similar to the above.

According to the plug-implantation, the phosphorus ions can be set to an acceleration energy of 50 keV and a dose of $1\times10^{13}/cm^2$, for example. The introduction of the impurity in the polycrystalline silicon film can be carried out by introducing phosphorus having a concentration of $2\times10^{20}/cm^3$ therein by the CVD method. Incidentally, the connecting holes are defined by two-stage etching and are capable of preventing excessive etching of the semiconductor substrate 1. Further, the connecting plugs 21 and 22 can be also formed by an etchback method.

Figures 7A, 7B, 7C, 7D:
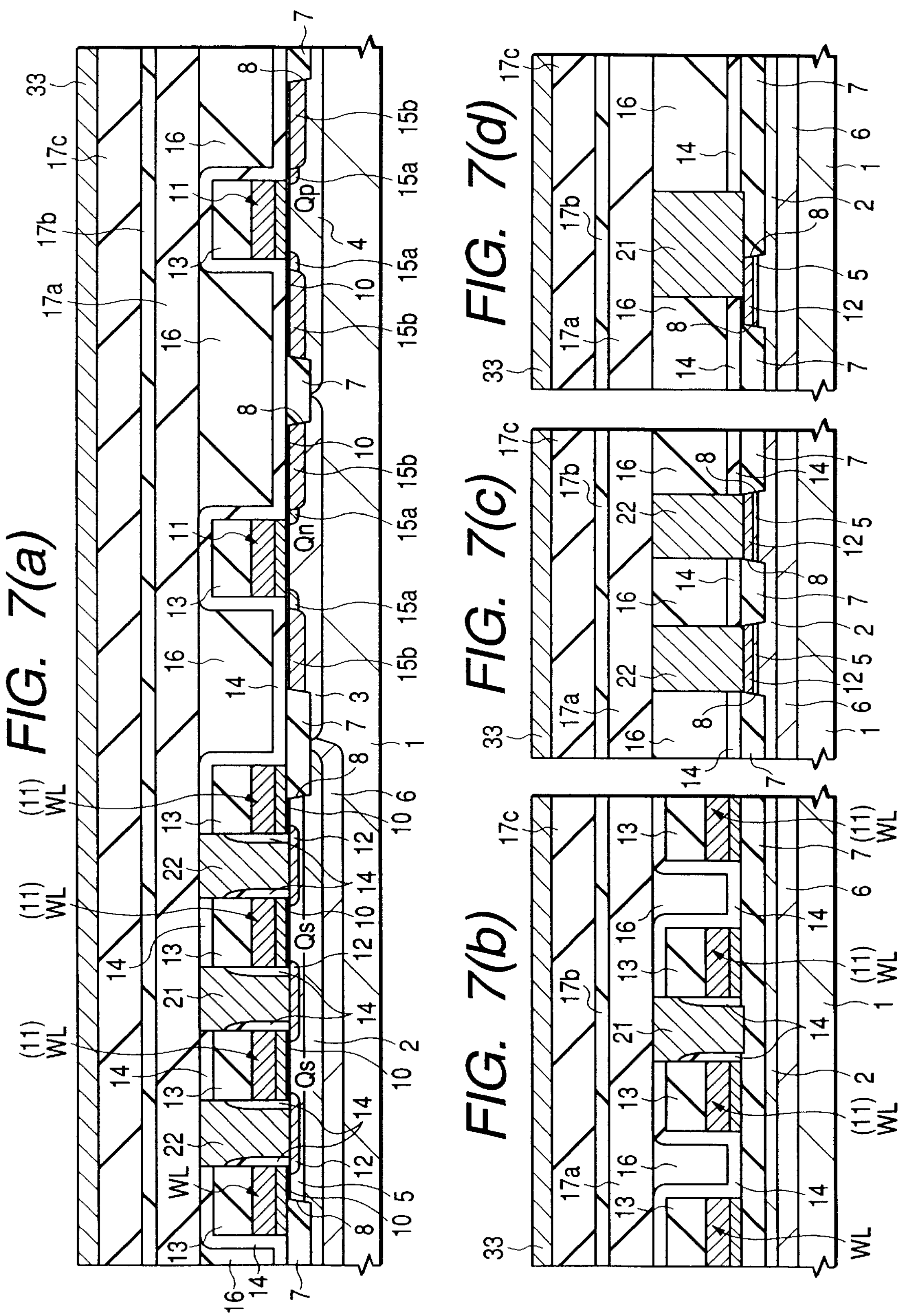
FIG. 7(*a*) is a cross-sectional view showing one example of the process for manufacturing the DRAM according to the embodiment 1 in process order.

Next, insulating films 17*a*, 17*b* and 17*c* for wiring formation are successively formed and a tungsten film 33 is formed over the insulating film 17*c* (see FIG. 7). A silicon oxide film, a silicon nitride film and the silicon oxide film are applicable as the insulating films 17*a*, 17*b* and 17*c* respectively. The silicon oxide film and the silicon nitride film can be formed by the CVD method or sputtering method.

Figure 8:
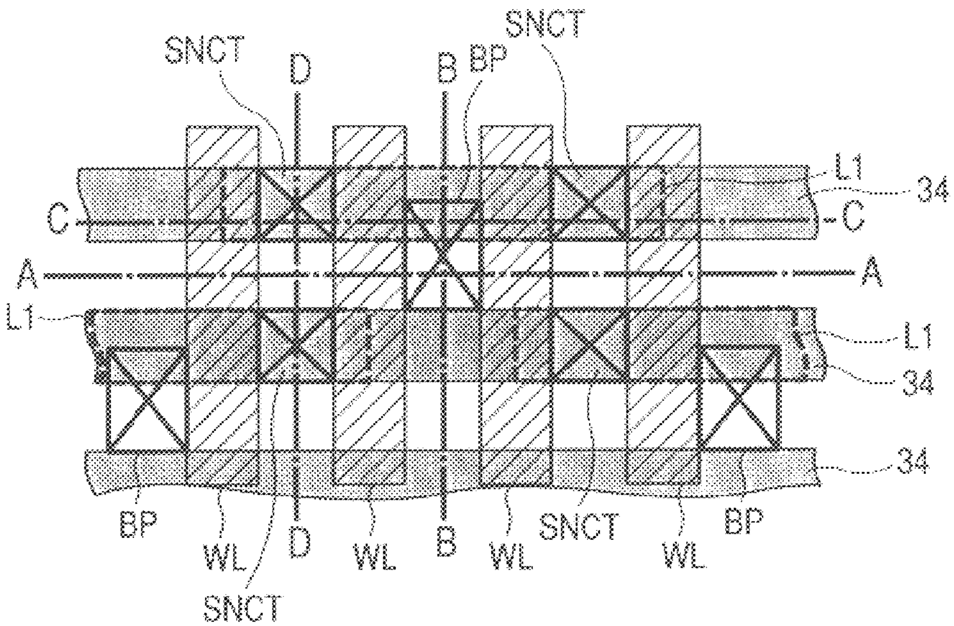
FIG. 8 is a plan view illustrating one example of the process for manufacturing the DRAM according to the embodiment 1 in process order.
Figure 9A:
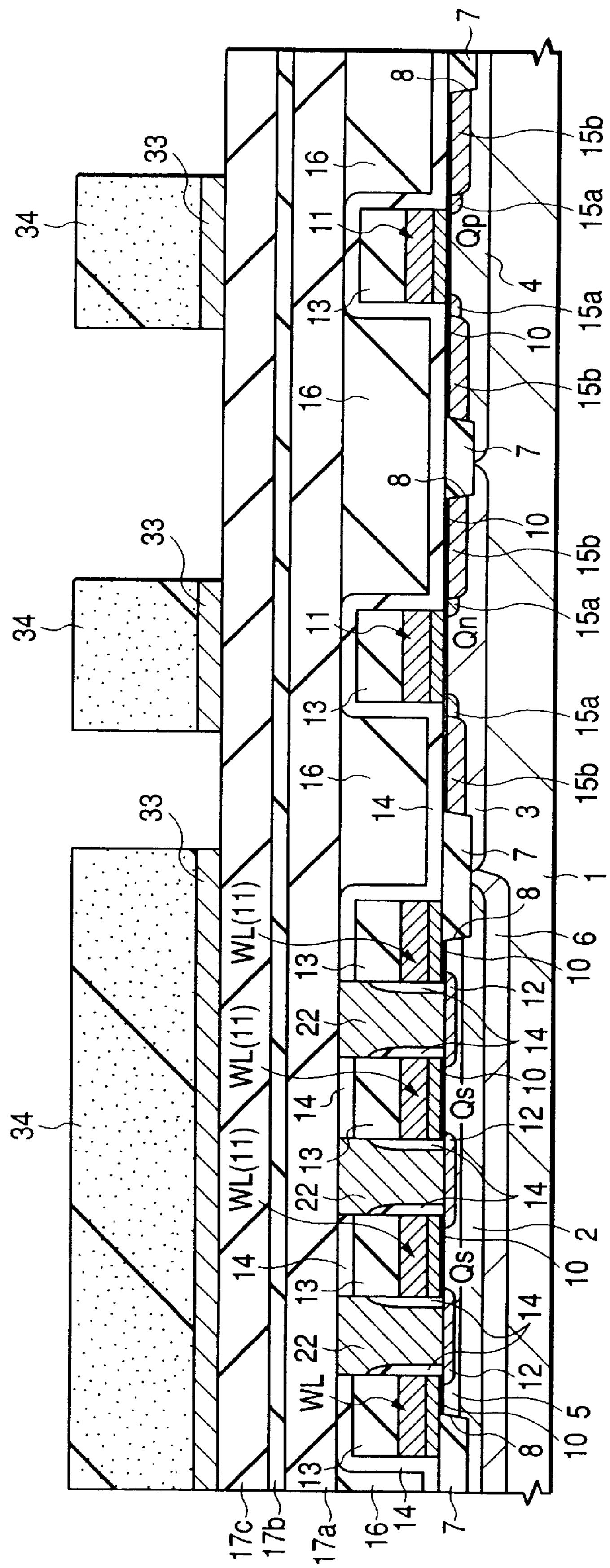
FIG. 9(*a*) is a cross-sectional view showing one example of the process for manufacturing the DRAM according to the embodiment 1 in process order.
Figures 9B, 9C, 9D:
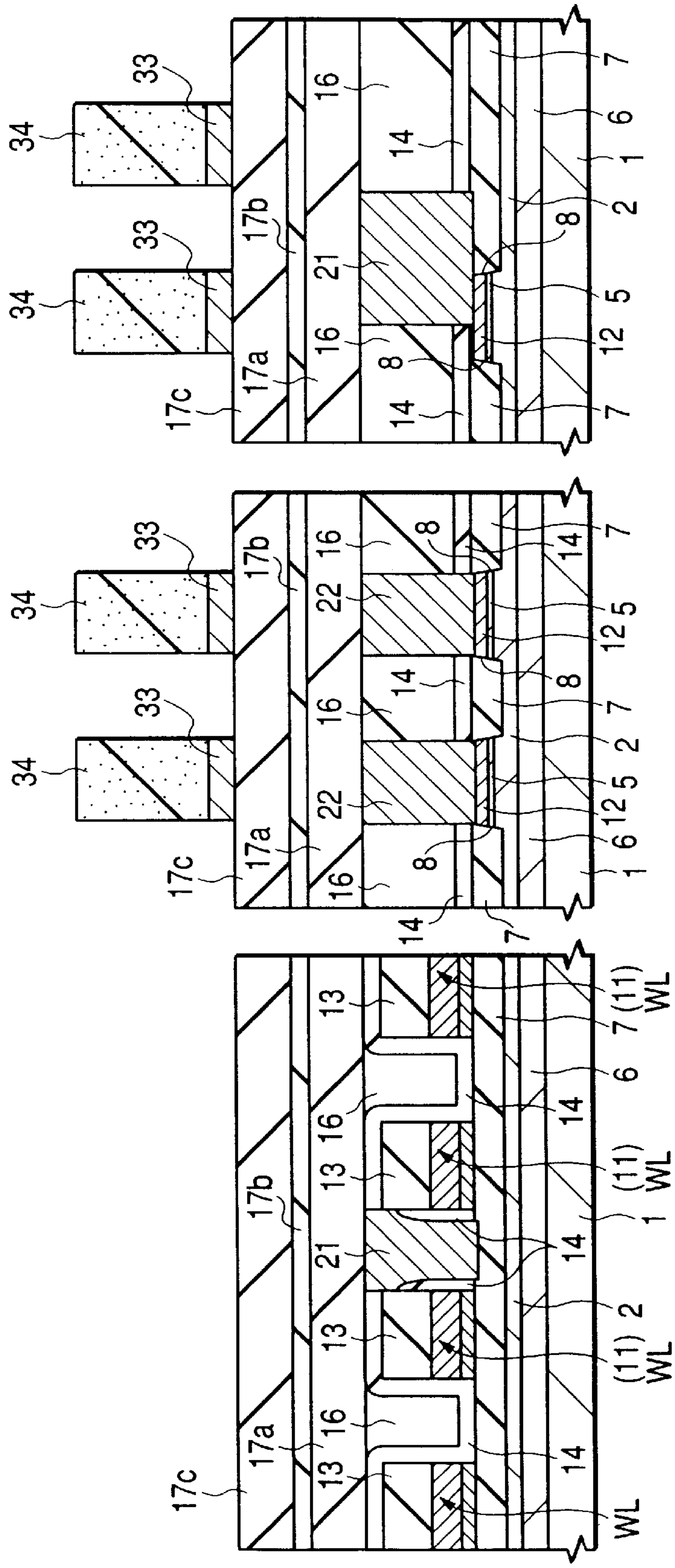

Next, photoresist films 34 are formed over the tungsten film 33. The photoresist films 34 are formed over regions in which the bit lines BL are formed as shown in FIGS. 8 and 9, so as to have openings. Namely, each photoresist film 34 is linearly formed in the memory cell forming region. Therefore, the diffraction of exposure light, etc. are hard to occur even in the case of micro-patterning, and exposure can be carried out with high accuracy, thus offering an advantage to scaling-down or miniaturization.

Next, the tungsten film 33 is etched with the photoresist films 34 as masks (see FIG. 9). The patterned tungsten films 33 are used as masks upon etching of the insulating film 17*c*. As will be described later, the tungsten films 33 also serve as parts of masks upon defining wiring trenches 18*b* in the insulating film 17*a*.

Figure 10A:
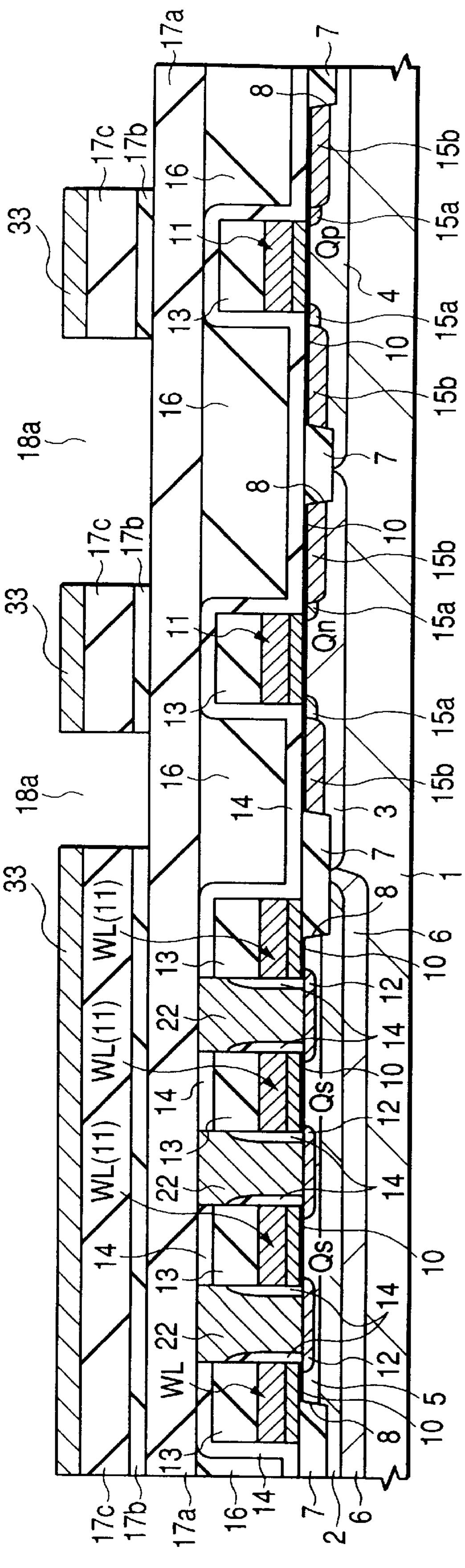
FIG. 10(*a*) is a cross-sectional view depicting one example of the process for manufacturing the DRAM according to the embodiment 1 in process order.
Figures 10B, 10C, 10D:
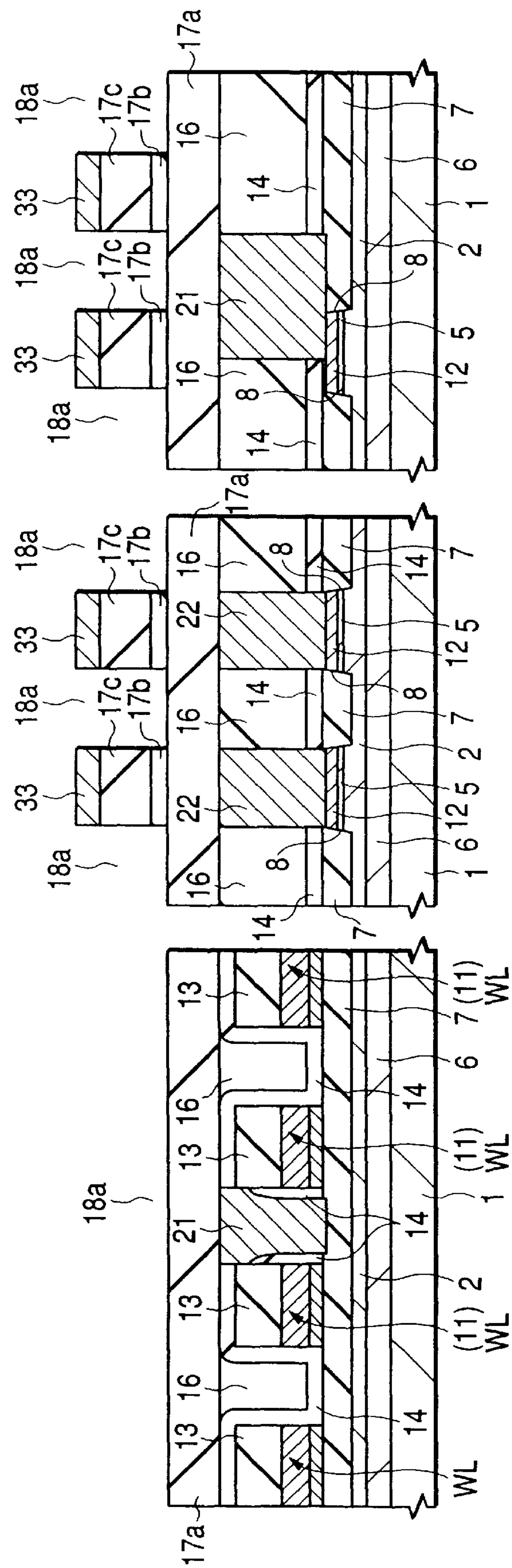
Figure 12A:
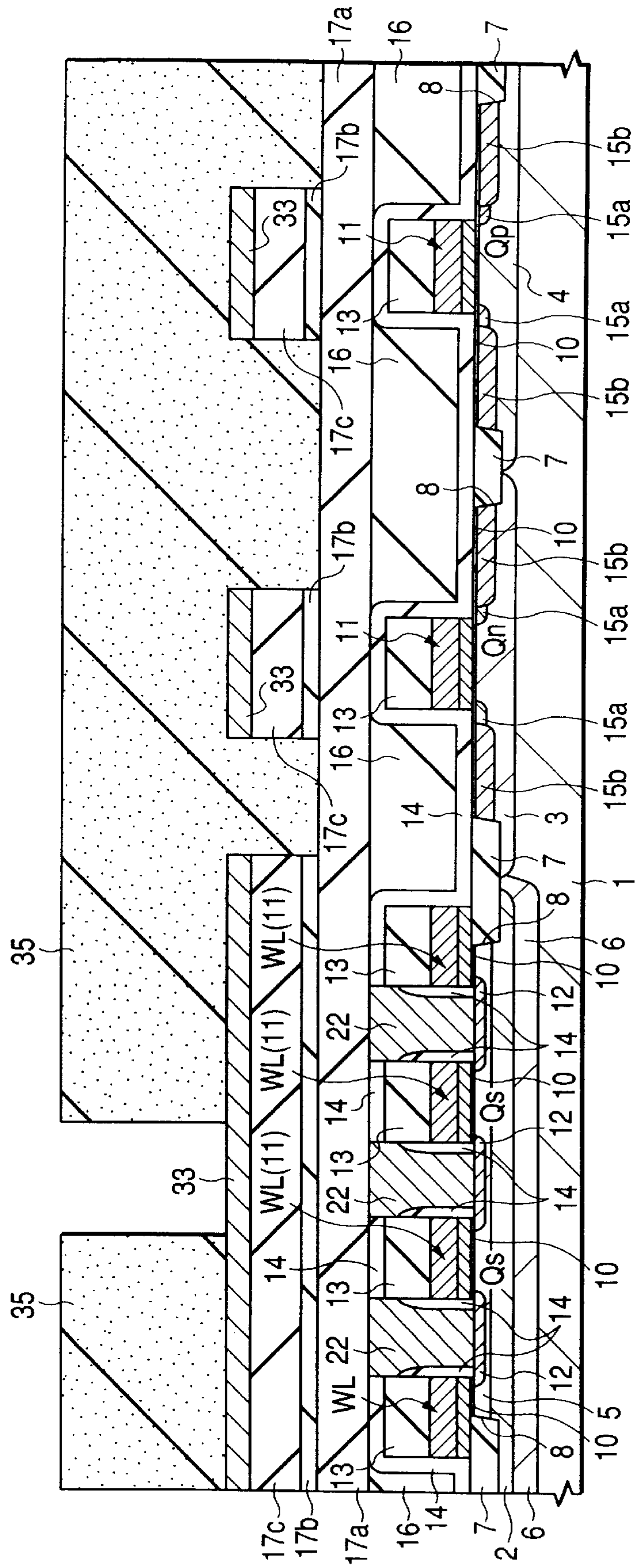
FIG. 12(*a*) is a cross-sectional view showing one example of the process for manufacturing the DRAM according to the embodiment 1 in process order.
Figures 12B, 12C, 12D:
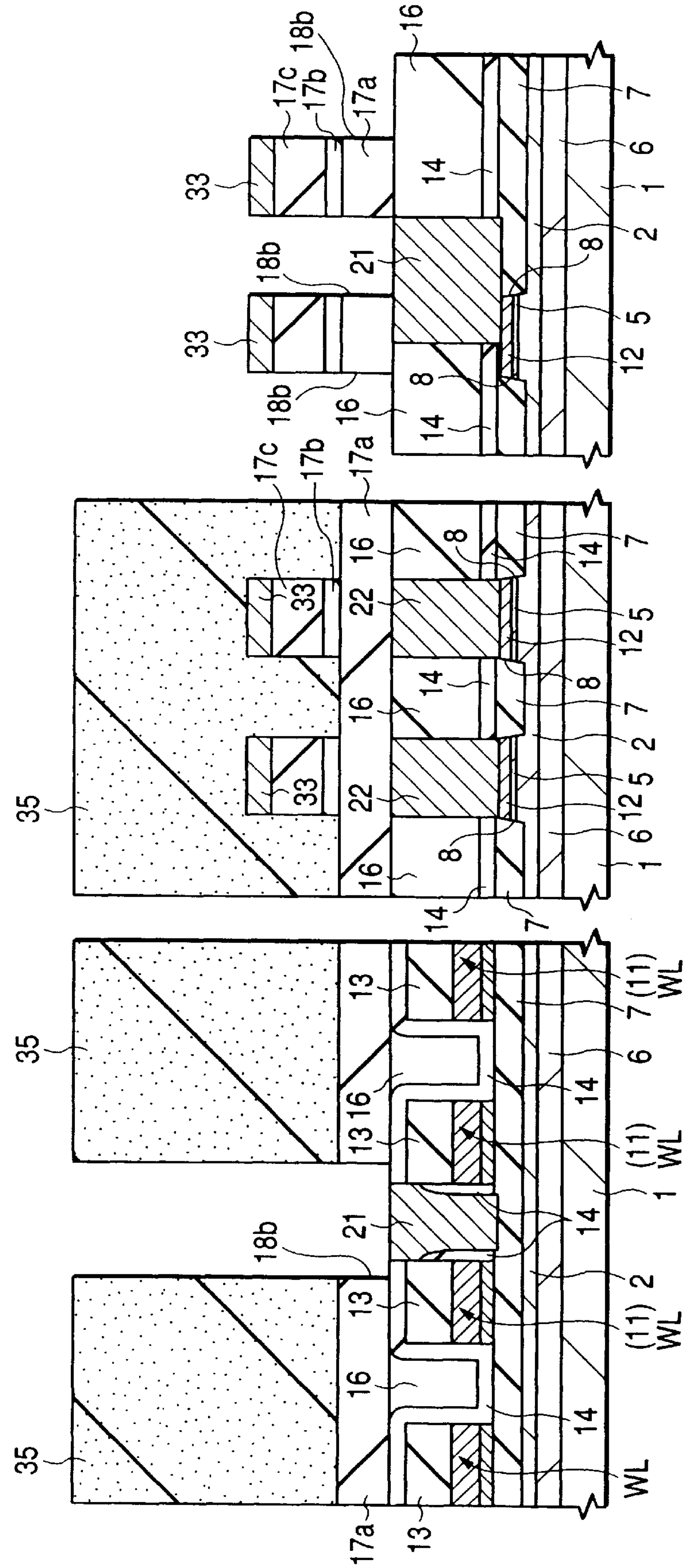

After the removal of the photoresist films 34, the insulating films 17*c* and 17*b* are next etched with the patterned tungsten films 33 as the masks to thereby define wiring trenches 18*a* in the insulating film 17*c* (see FIG. 10).

Upon defining each wiring trench 18*a,* the insulating film 17*c* with the tungsten films 33 as the masks is first etched as first etching. The first etching is carried out under the condition that the etching rate of the insulating film 17*c* (e.g., silicon oxide film) is high and the etching rate of the insulating film 17*b* (e.g., silicon nitride film) is low. Namely, the insulating film 17*b* (e.g., silicon nitride film) serves as an etching stopper for the insulating film 17*c* (e.g., silicon oxide film) upon the first etching. Owing to the provision of such an insulating film 17*b,* sufficient overetching can be carried out upon the first etching. The ununiformity of the etching rate in a semiconductor wafer in an etching process appears as a variation in etching depth. However, even if the variation lying within the wafer exists in the etching rate upon the first etching, the etching depth can be made uniform by carrying out sufficient overetching and allowing the insulating film 17*b* to act as the etching stopper. Next, the insulating film 17*b* is etched as second etching. The second etching is carried out under the condition that the etching rate of the insulating film 17*b* (e.g., silicon nitride film) is low. The insulating film 17*b* can be made thinner than the insulating film 17*c.* Owing to the formation of the insulating film 17*b* thinly in this way, excessive etching of the insulating film 17*a* used as a bed can be lessened because the thickness of the insulating film 17*b* is relatively thin even if overetching is done upon the second etching. Namely, the etching for the insulating films 17*c* and 17*b* is divided into two stages and the etching is carried out under the above-described condition, whereby the depth of each wiring trench 18*a* can be made uniform and the wiring trench 18*a* can be reliably formed.

Figure 11:
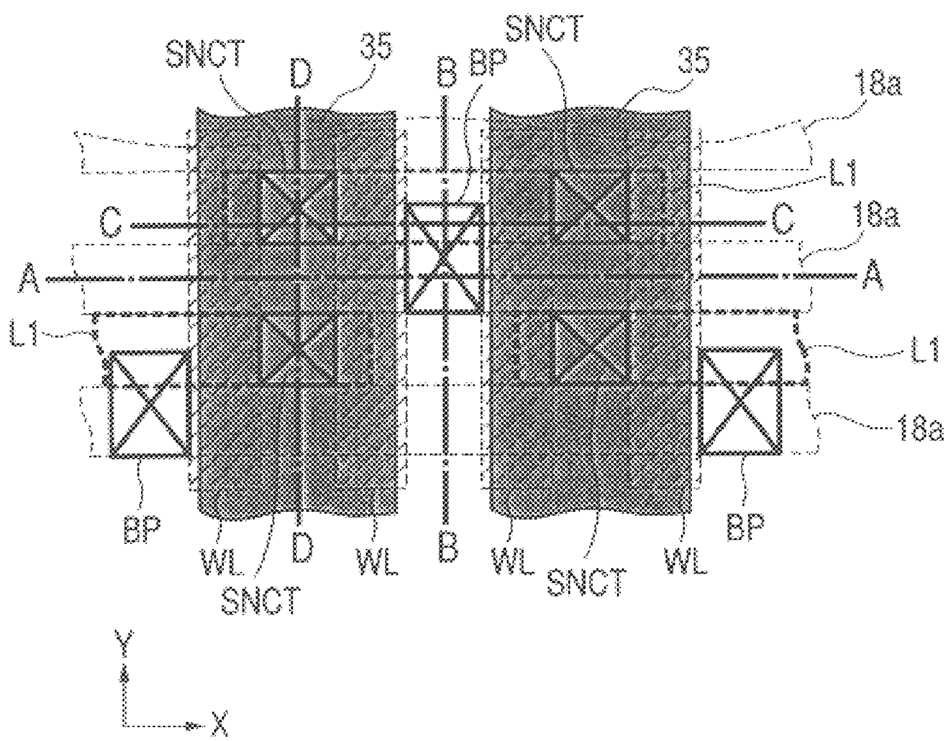
FIG. 11 is a plan view illustrating one example of the process for manufacturing the DRAM according to the embodiment 1 in process order.

Next, photoresist films 35 are formed as shown in FIG. 11. Further, the insulting film 17*a* is etched under the existence of the photoresist films 35 and the tungsten film 33 (see FIG. 12). Thus, each wiring trench 18*b* is defined. The photoresist films 35 are linearly formed in parallel in a Y direction (corresponding to the direction in which each word line WL extends) as shown in the drawing. Namely, the photoresist films 35 are formed in stripe form so as not to cover regions in which connecting plugs BP (plugs 21) for connecting central portions of active regions L1 and bit lines BL are formed and so as to cover capacitive electrode connecting holes SNCT lying in regions corresponding to both ends of each individual active regions L1 in reverse.

On the other hand, the tungsten films 33 still exist at this stage. Therefore, the insulating films 17*a,* 17*b* and 17*c* lying in the regions in which the tungsten films 33 are formed, are not etched even if the photoresist films 35 do not exit. In other words, the etched regions of the insulating film 17*a* result in regions in which no tungsten films 33 are formed and which are not covered with the photoresist films 35. Namely, the etching at this stage is effected only on the bottom of each wiring trench 18*a* uncovered with the photoresist film 35.

By performing etching in this way with the photoresist films 35 and the tungsten films 33 as the masks, the wiring trenches 18*b* are formed in the Y direction (corresponding to the direction in which each word line WL extends) in self-alignment with the wiring trenches 18*a*. As will be described later, the bit lines BL are formed in the wiring trenches 18*a*. Since the bit lines BL and the plugs 21 are connected to one another through the wiring trenches 18*b,* the wiring trenches 18*b* serve as bit line connecting holes respectively. Namely, the wiring trenches 18*b* serving as the bit line connecting holes can be formed in self-alignment with the bit lines BL respectively, and electrical connections between the bit lines BL and the plugs 21 can be implemented with ease and a high degree of reliability.

It is also possible to reduce the accuracy of the masks for defining the bit line connecting holes. Namely, the alignment of the wiring trenches 18*b* used as the bit line connecting holes in the Y direction is unnecessary because they are already self-aligned by the wiring trenches 18*a* (tungsten films 33). Further, if patterning is done so that upper portions of the plugs 21 are defined or opened, it is enough for the photoresist films 35, and it is unnecessary to improve the accuracy of their processing. The width (corresponding to the width of each region in which no photoresist film 35 is formed) of opening of each photoresist film 35 can be formed so as to be larger than that of each plug 21. The alignment for the formation of each photoresist film 35 may be shifted in the X direction by a margin of its width. Even if such a displacement or shift occurs, the performance of the DRAM is not hindered so long as the bit lines BL are connected to the plugs 21 through the wiring trenches 18*b.*

Figure 13:
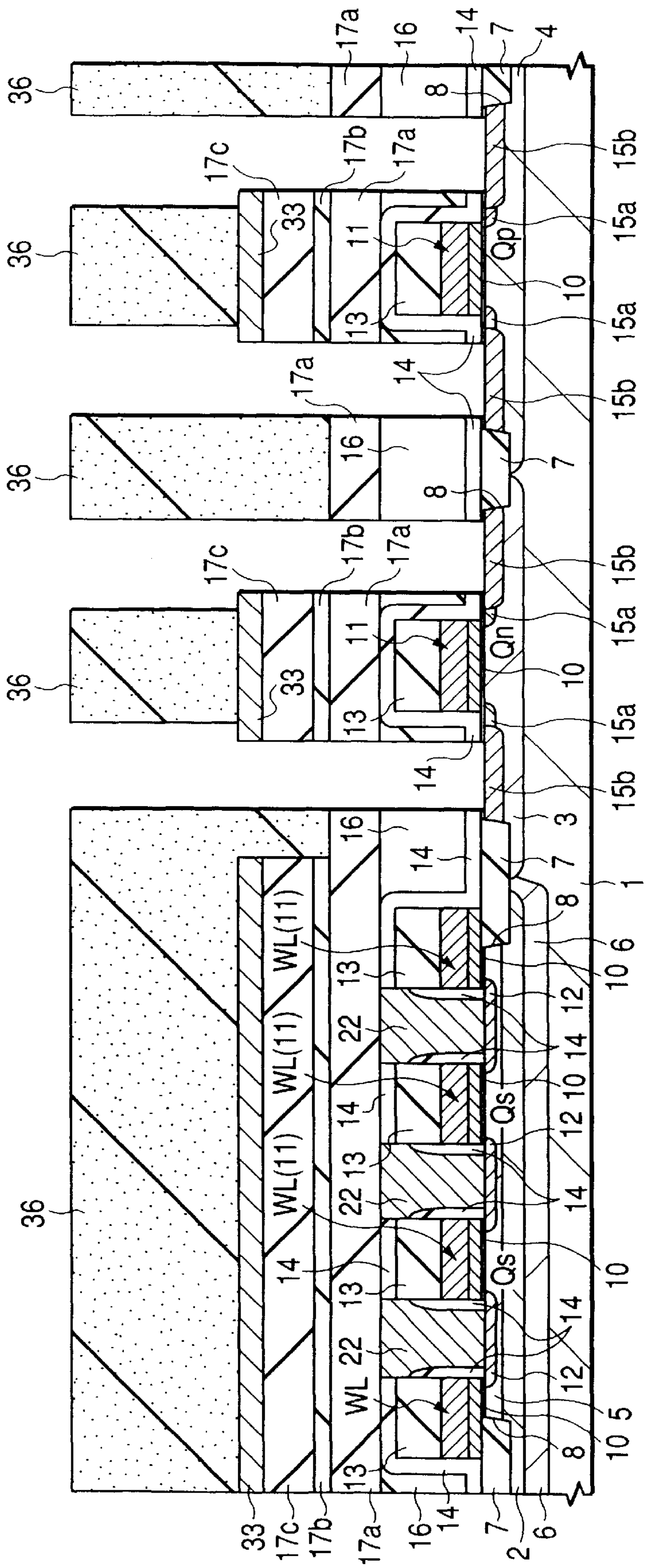
FIG. 13 is a cross-sectional view illustrating one example of the process for manufacturing the DRAM according to the embodiment 1 in process order.
Figure 14A:
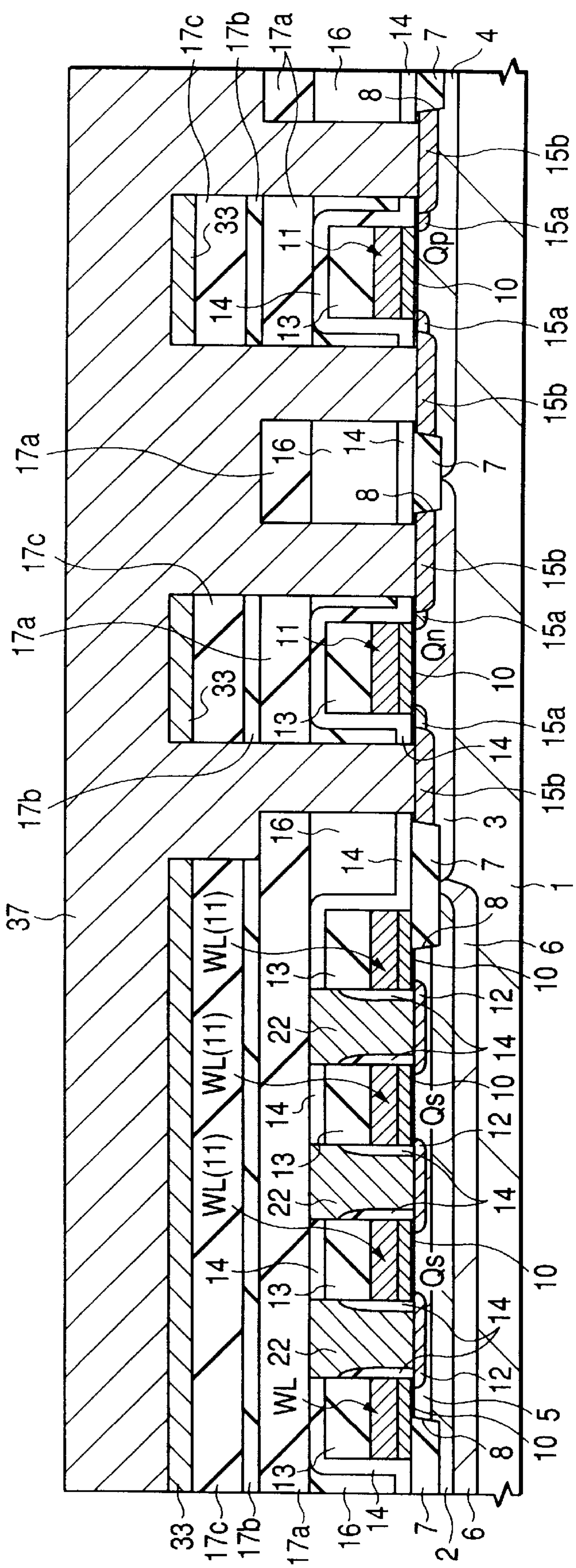
FIG. 14(*a*) is a cross-sectional view showing one example of the process for manufacturing the DRAM according to the embodiment 1 in process order.
Figure 14B:
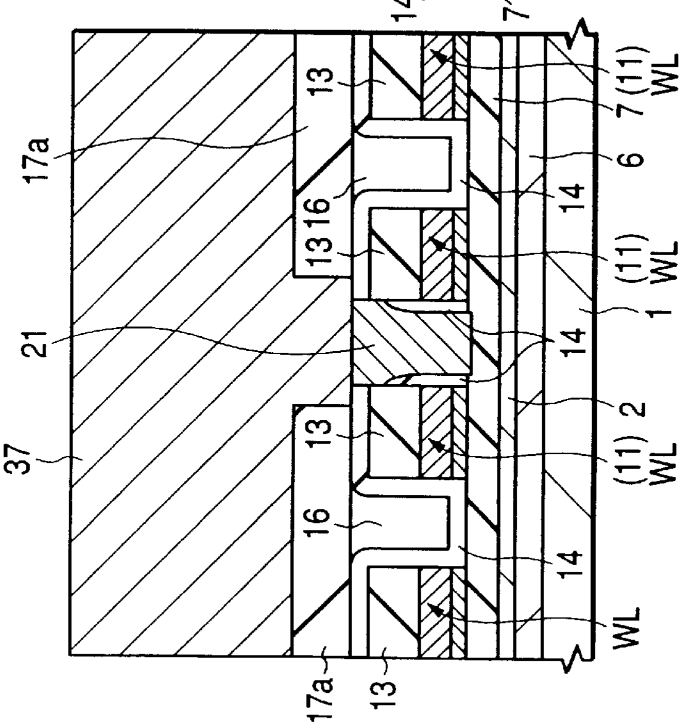
Figure 14C:
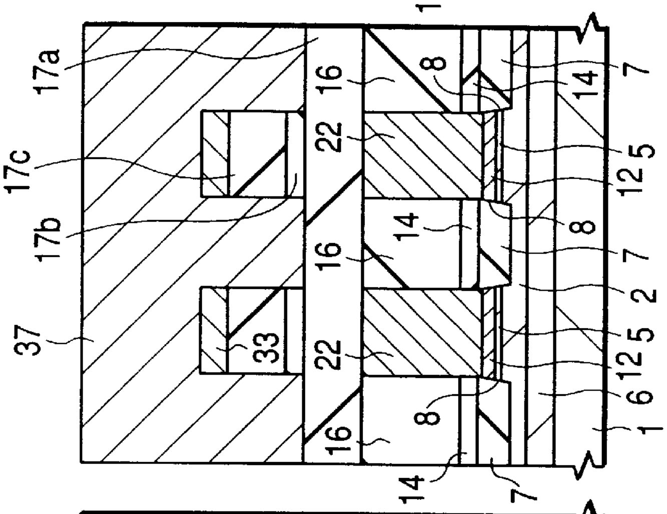
Figure 14D:
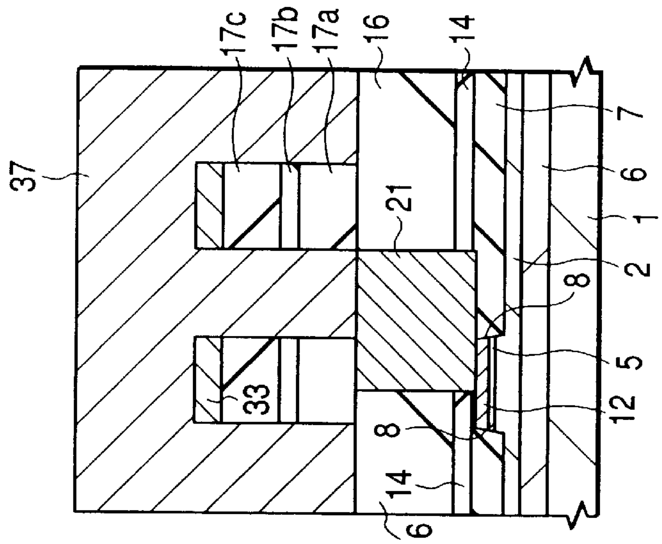

Next, a photoresist film 36 is formed as shown in FIG. 13, so that connecting holes connected to source-to-drain regions (high-density impurity regions 15*b*) of MISFETs in the peripheral circuit region are defined or opened. Incidentally, a process for defining the connecting holes allows prevention of excessive etching of isolation regions 7 over the surface of the semiconductor substrate 1 by executing etching corresponding to two stages of first etching with the silicon nitride film 14 as a stopper and second etching for etching the silicon nitride films 14. The connecting holes are used to directly connect first layer interconnections 20 to their corresponding high-density impurity regions 15*b.* Thus, wiring resistance in the peripheral circuit region is reduced so that the performance of the DRAM can be improved. Incidentally, the connecting plugs may be formed in advance in the regions in which the connecting holes are defined.

Incidentally, the thicknesses of the insulating films 17*a,* 17*b* and 17*c* can be set to, for example, 200 nm, 50 nm and 200 nm respectively. Further, the depths of the wiring trenches 18*a* and 18*b* can be set to, for example, 250 nm and 200 nm respectively. The width of each wiring trench 18*a* can be se to 180 nm.

Next, a tungsten film 37 having a thickness of 300 nm is formed over the entire surface of the semiconductor substrate 1 by the sputtering method, for example (see FIG. 14). While the tungsten film 37 is illustrated as an example here, another metal film, e.g., a copper film or the like may be used. However, the metal film may preferably be a high melting metal if a reduction in reliability due to thermal diffusion of metal atoms into the semiconductor substrate 1 is taken into consideration. For example, molybdenum, tantalum, niobium or the like may be mentioned as an illustrative example.

Figures 15A, 15B, 15C, 15D:
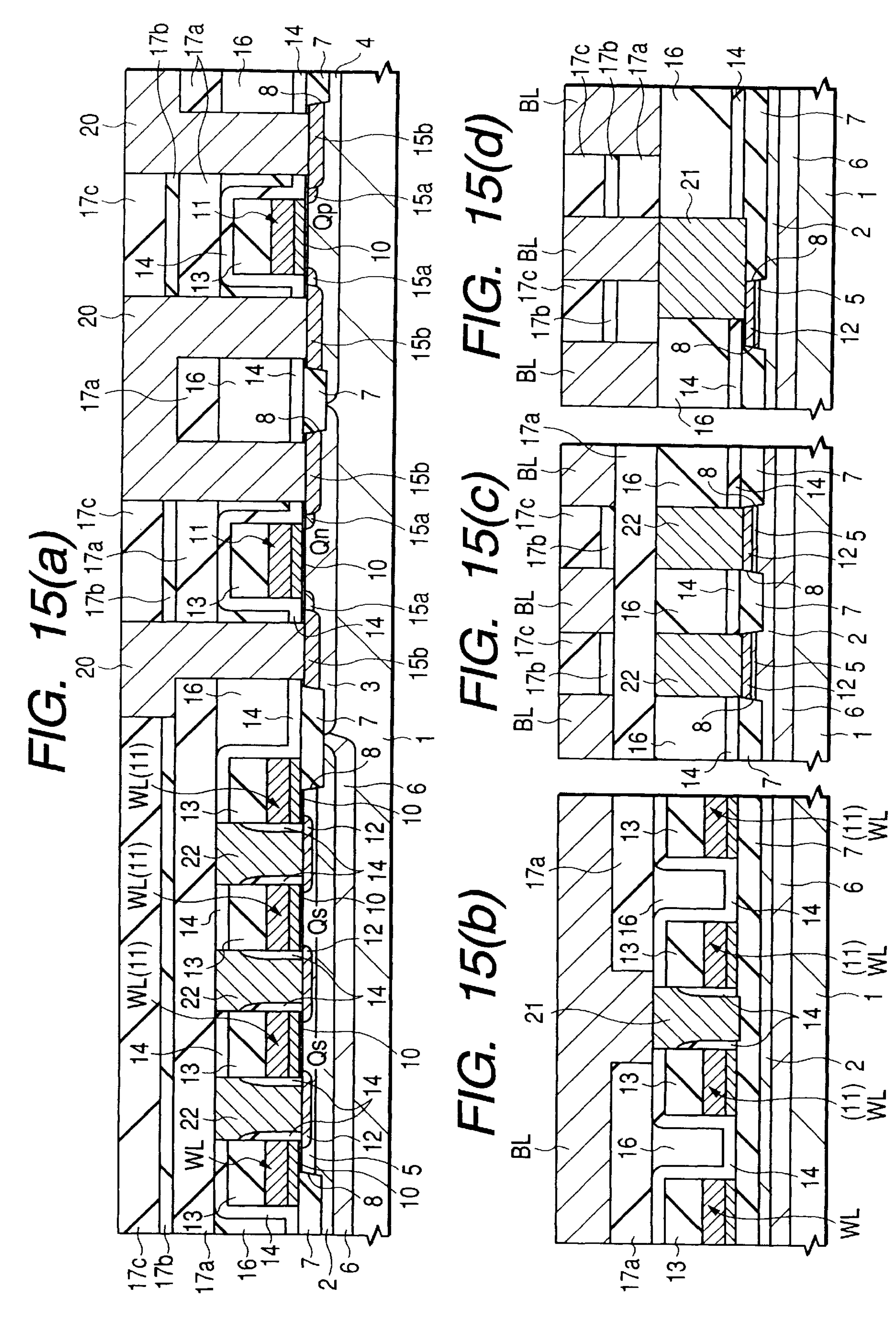
FIG. 15(*a*) is a cross-sectional view depicting one example of the process for manufacturing the DRAM according to the embodiment 1 in process order.

Next, the tungsten films 37 and the tungsten films 33 are polished by the CMP method, for example to thereby remove the tungsten films 33 and the tungsten films 37 other than those for the wiring trenches 18*a*, whereby the bit lines BL and first layer interconnections 20 are formed (see FIG. 15). Incidentally, the etchback method can be also used for the removal of the tungsten films 37.

Next, a silicon oxide film is deposited over the entire surface of the semiconductor substrate 1 by the CVD method, for example. The resultant silicon oxide film is polished and flattened by the CMP method to thereby form an interlayer insulator 23. Thereafter, a silicon nitride film 24 and a polycrystalline silicon film 38 are deposited over the entire surface of the semiconductor substrate 1. Phosphorus having a concentration of, for example, $3\times10^{20}/cm^3$ can be introduced into the polycrystalline silicon film 38 and the thickness thereof is 100 nm, for example.

Next, openings are defined in the polycrystalline silicon film 38 in the form of the patterns of SNCT as shown in FIG. 2. The diameter of each opening is 0.22 $\mu$m, for example. Thereafter, a polycrystalline silicon film similar to the polycrystalline silicon film 38 is deposited over the entire surface of the semiconductor substrate 1 with a thickness of 70 nm and subjected to anisotropic etching to thereby form side wall spacers 39 on side walls of each opening. The width of each side wall spacer 39 is about 70 nm and the diameter of each opening referred to above is reduced to 80 nm by the side wall spacers 39.

Figure 16A:
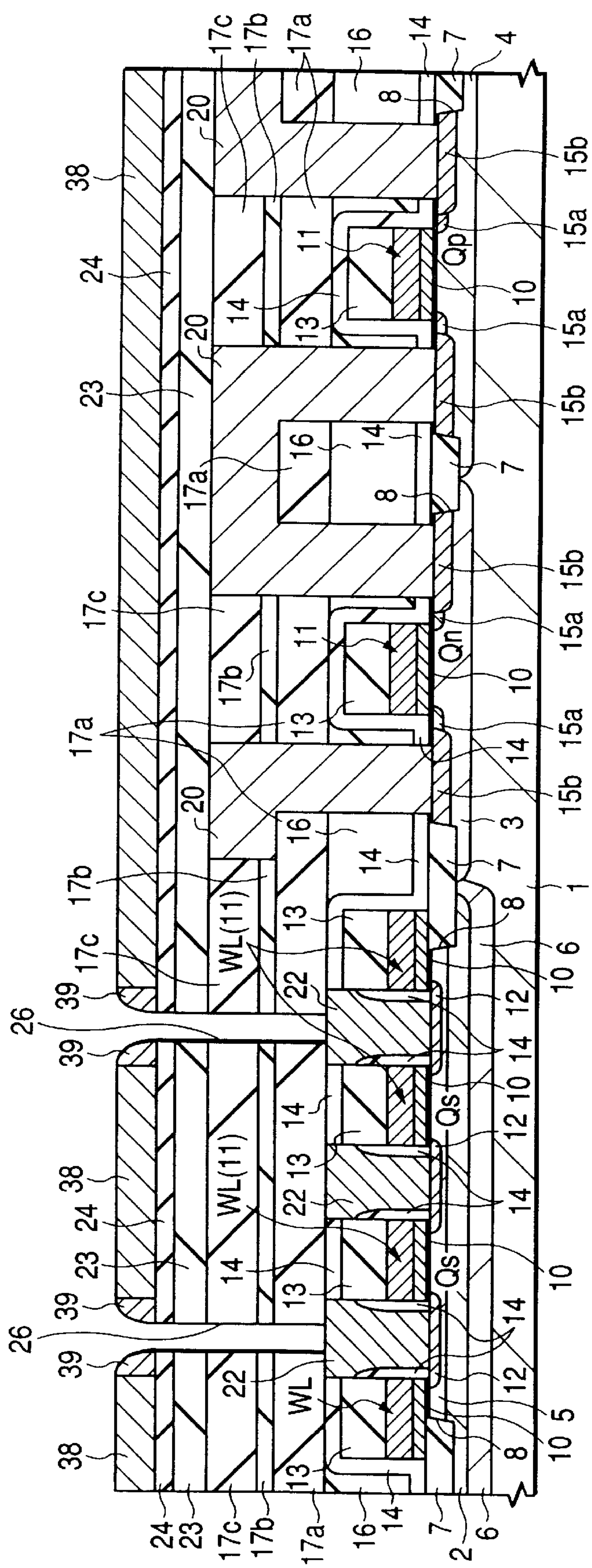
FIG. 16(*a*) is a cross-sectional view depicting one example of the process for manufacturing the DRAM according to the embodiment 1 in process order.
Figures 16B, 16C, 16D:
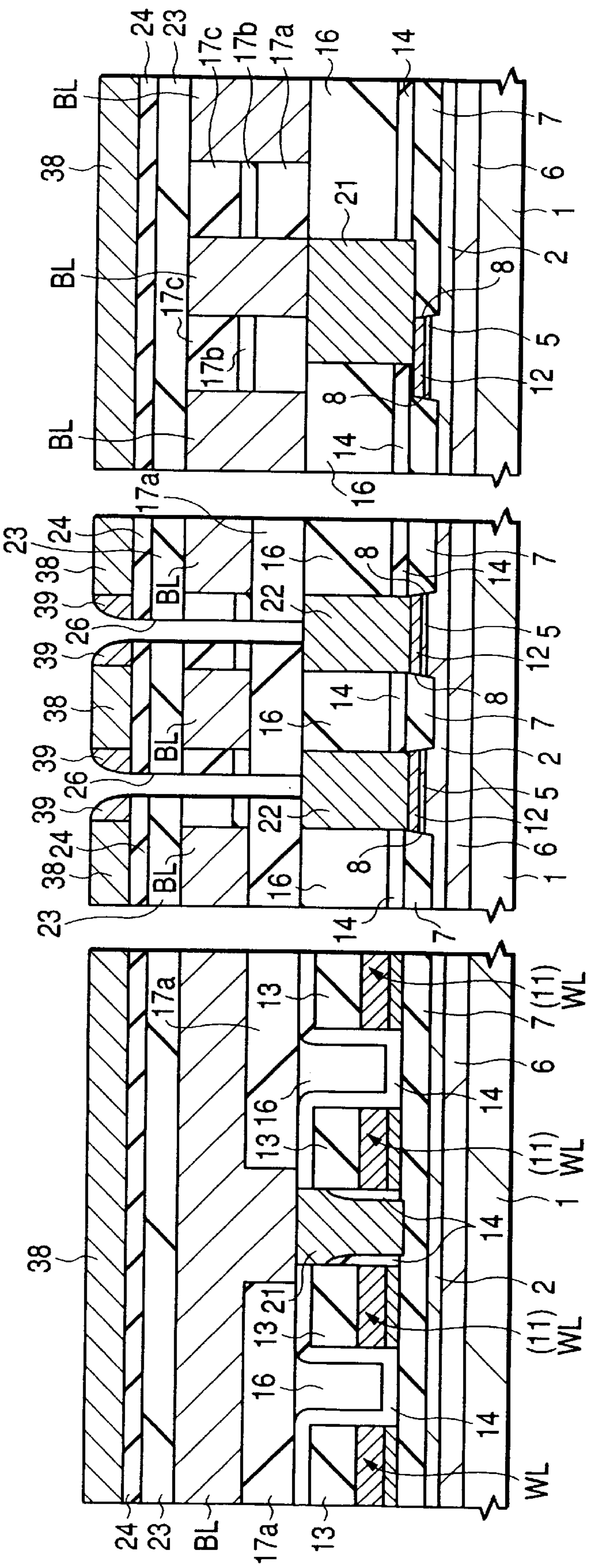
Figure 17A:
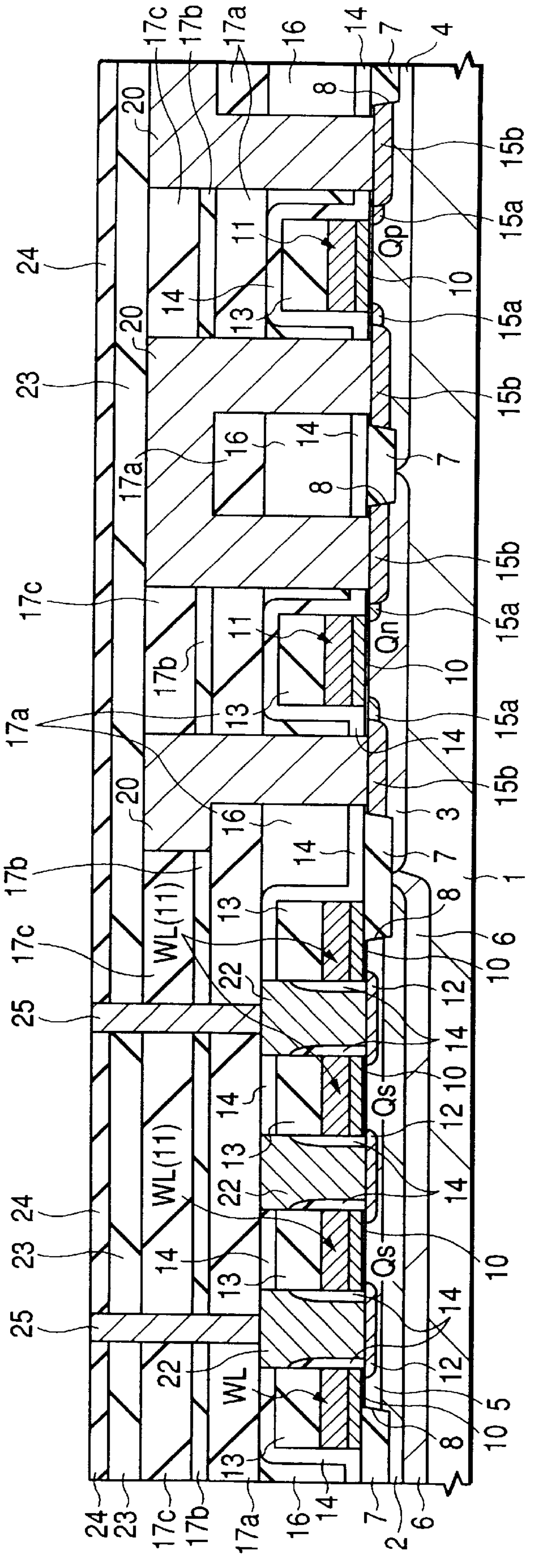
FIG. 17(*a*) is a cross-sectional view depicting one example of the process for manufacturing the DRAM according to the embodiment 1 in process order.
Figures 17B, 17C, 17D:
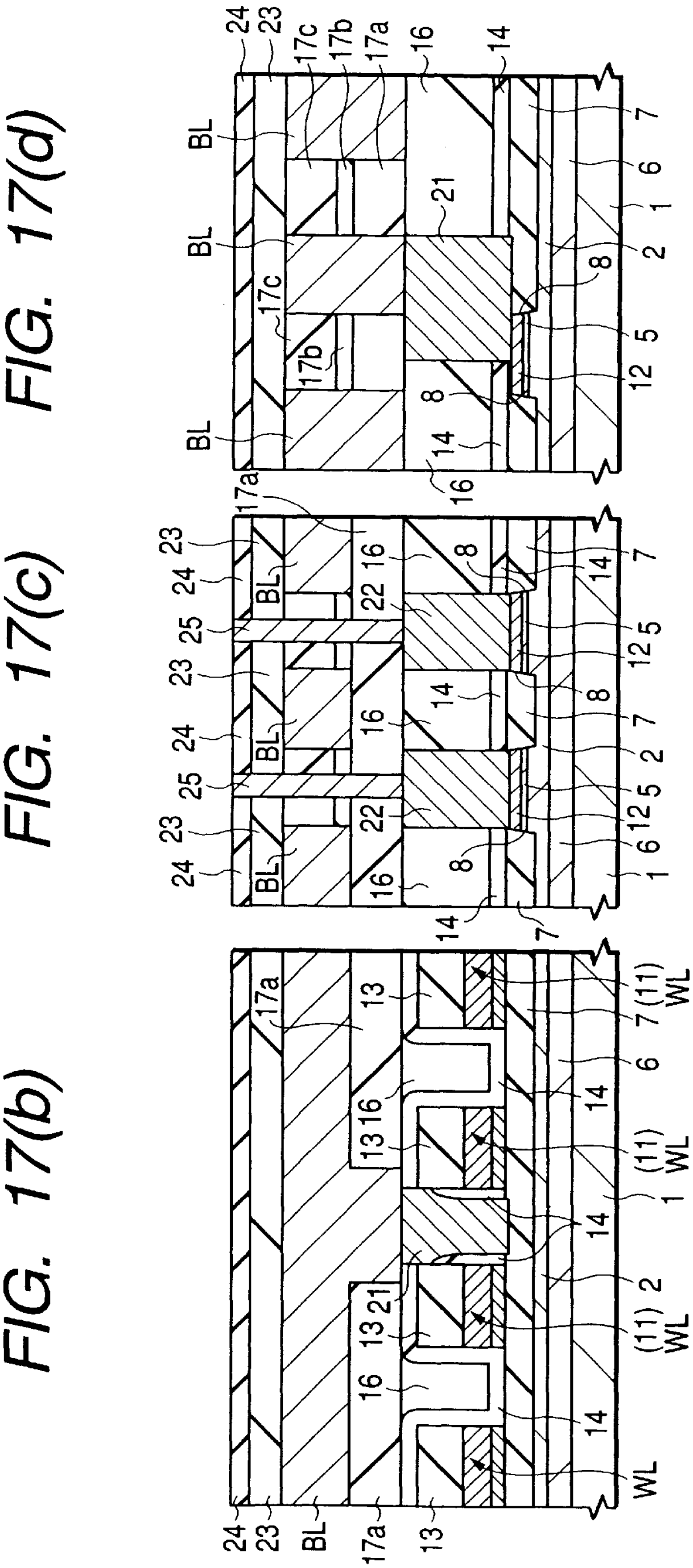
Figure 18A:
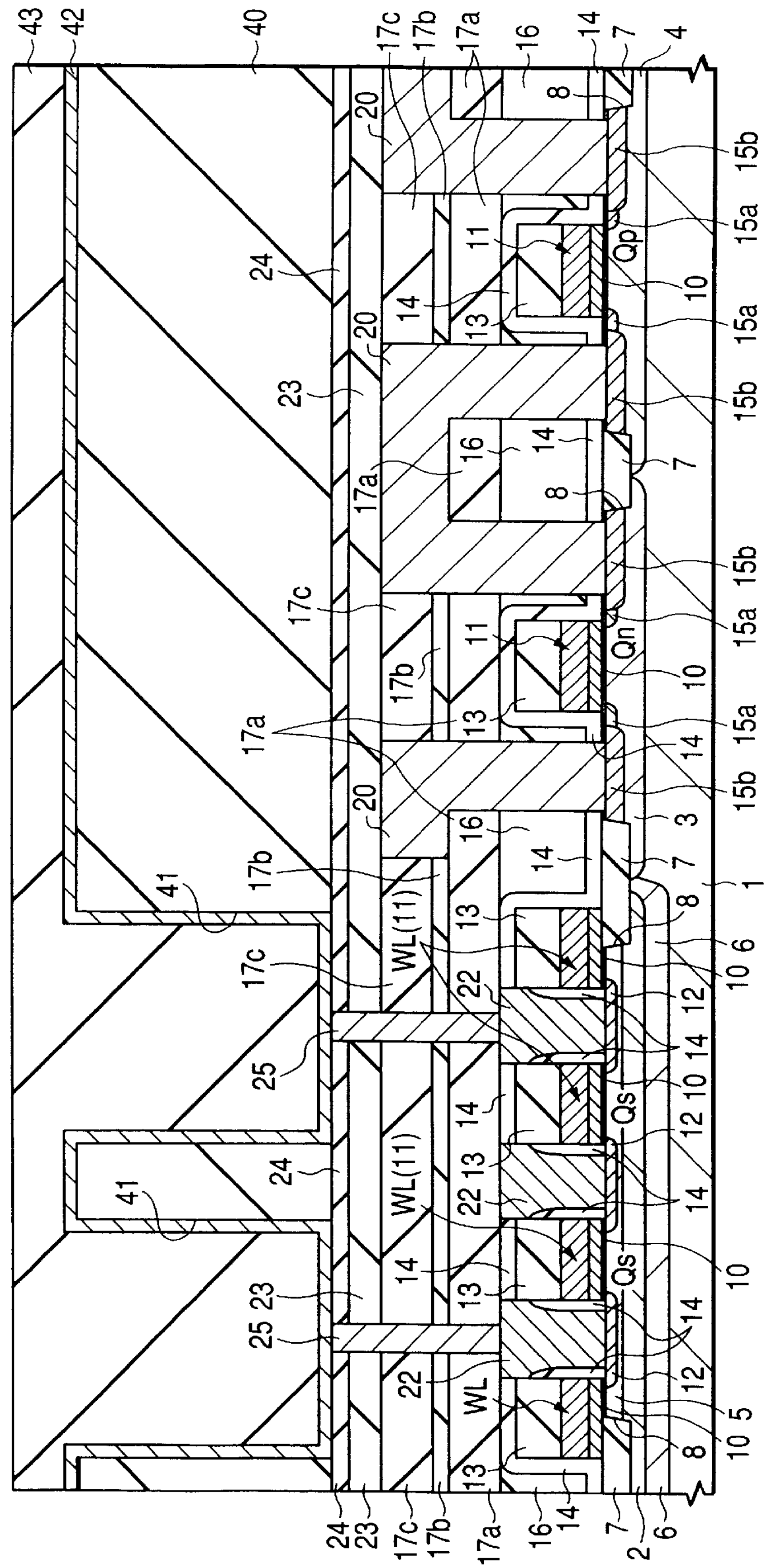
FIG. 18(*a*) is a cross-sectional view depicting one example of the process for manufacturing the DRAM according to the embodiment 1 in process order.
Figure 18D:
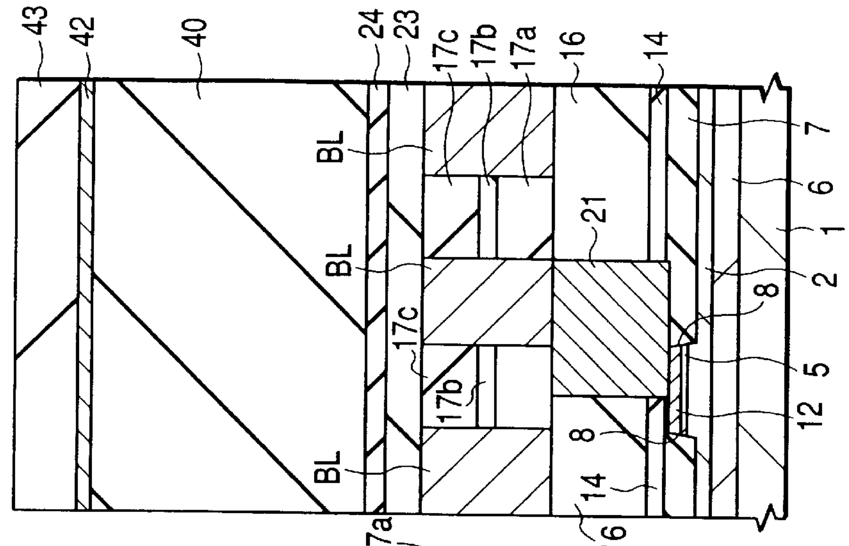
Figure 18C:
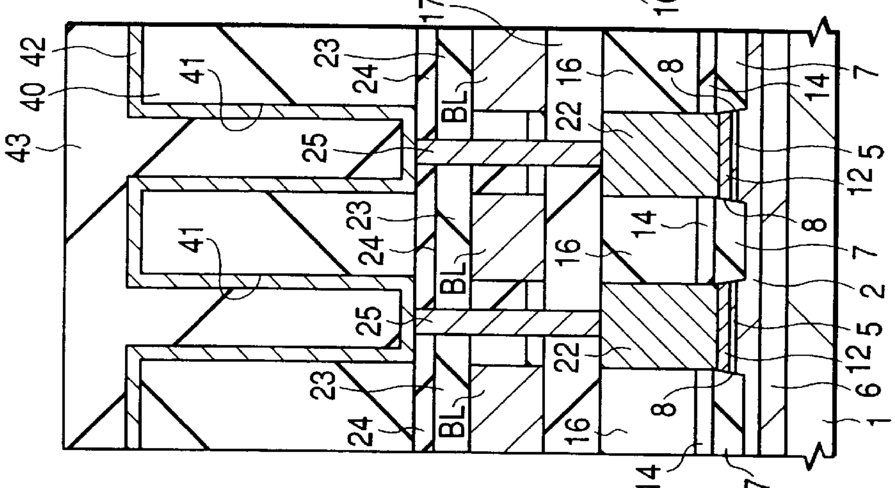
Figure 18B:
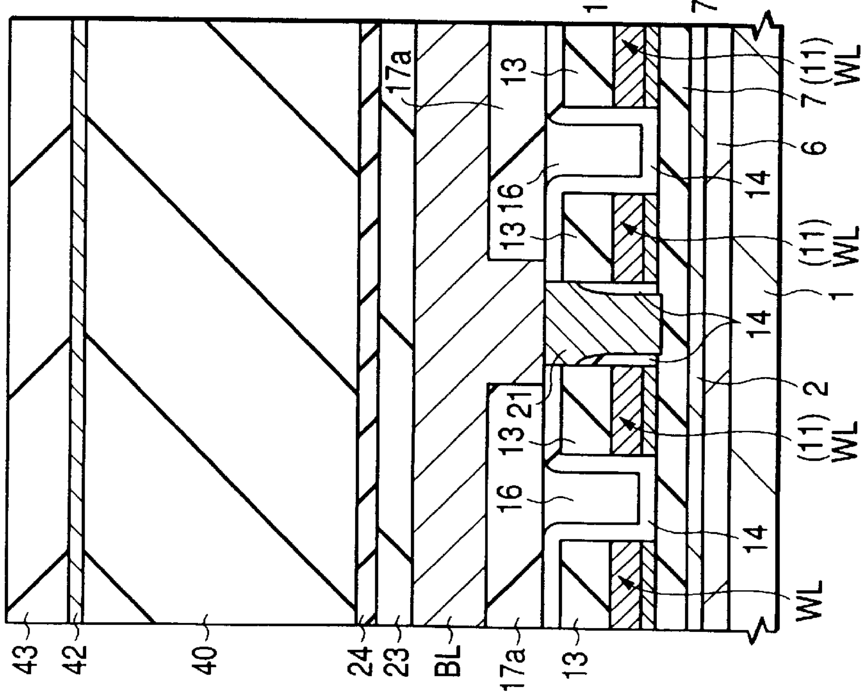
Figure 19A:
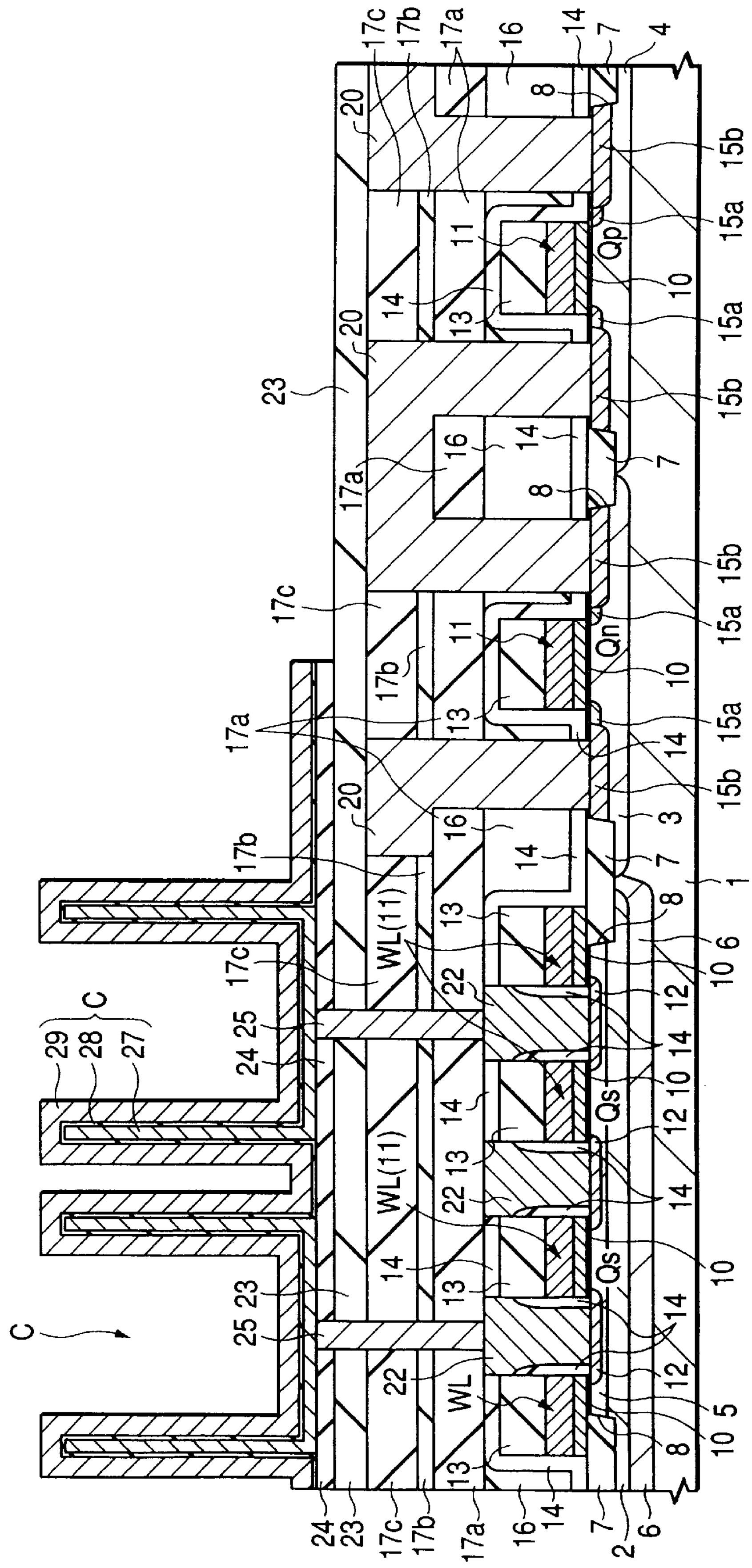
FIG. 19(*a*) is a cross-sectional view depicting one example of the process for manufacturing the DRAM according to the embodiment 1 in process order.
Figures 19B, 19C, 19D:
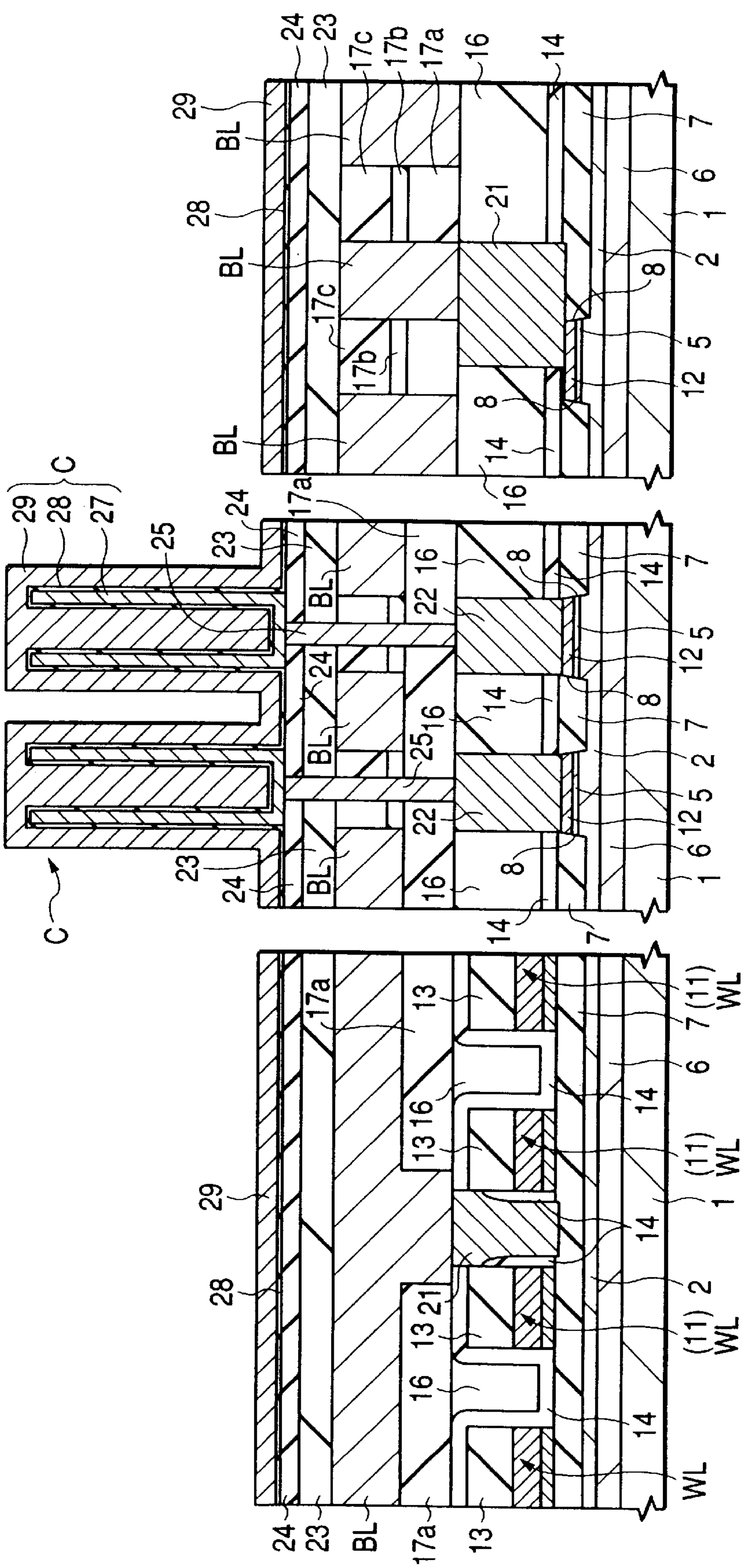

The polycrystalline silicon films 38 and the side wall spacers 39 are next etched as hard masks to thereby form capacitive electrode connecting holes 26 (see FIG. 16). The diameter of each capacitive electrode connecting hole 26 is 80 nm and the depth thereof is about 300 nm.

Thus, even if a shift in alignment or misalignment occurs in the mask for defining each opening referred to above, it is not brought into contact with each bit line BL because the diameter of each capacitive electrode connecting hole 26 can be formed small.

Next, a polycrystalline silicon film for burying each capacitive electrode connecting hole 26 is deposited. The polycrystalline silicon film, polycrystalline silicon films 38 and side wall spacers 39 are removed by the CMP method or etchback method to thereby form connecting plugs 25 inside the capacitive electrode connecting holes 26 (see FIG. 17). Phosphorus having a concentration of, for example, $3\times10^{20}/cm^3$ can be introduced into each connecting plug 25. Incidentally, when the polycrystalline silicon films, polycrystalline silicon films 38 and side wall spacers 39 are removed, the silicon nitride films 24 can be allowed to function as etch stopper films for the CMP method or etchback method.

Next, an insulating film 40 composed of a silicon oxide film is deposited by the CVD method, for example, and grooves or trenches 41 are defined in regions in which capacitors C are formed. The insulating film 40 can be deposited by plasma CVD and the thickness thereof is set as 1.2 $\mu$m, for example.

A polycrystalline silicon film 42 for covering the trenches 41 is deposited over the entire surface of the semiconductor substrate 1, and a silicon oxide film 43 is deposited over the entire surface of the semiconductor substrate 1 (see FIG. 18). The polycrystalline silicon film 42 can be doped with phosphorus and the thickness thereof can be set to 0.03 $\mu$m. Since the thickness of the polycrystalline silicon film 42 is sufficiently thinner than the size of each trench 41, the polycrystalline silicon film 42 is deposited even inside the trenches 41 with satisfactory step coverage. The silicon oxide film 43 is deposited so as to be embedded inside the trenches 41. If the embeddability thereof inside the trenches 41 is taken into consideration, then the silicon oxide film 43 can be formed as a silicon oxide film obtained by the CVD method using the SOG film or TEOS.

Next, the silicon oxide film 43 and the polycrystalline silicon film 42 lying over the insulating film 40 are removed to form lower electrodes 27 for the capacitors C. The removal of the silicon oxide film 43 and the polycrystalline silicon film 42 can be carried out by the etchback method or CMP method. Thereafter, the resultant product is subjected to wet etching to thereby remove the silicon oxide film 43 and insulating film 40 which remain inside the lower electrodes 27. As a result, the lower electrodes 27 are exposed or made bare. Incidentally, a photoresist film is formed in the peripheral circuit region and the insulating film 40 may be left in the peripheral circuit region with the photoresist film as a mask. Incidentally, each silicon nitride film 24 serves as an etching stopper in the present wet etching process.

Next, the surface of each lower electrode 27 is subjected to nitriding or acid nitriding. Thereafter, a tantalum oxide film is deposited to form a capacitive insulating film 28. The deposition of the tantalum oxide film can be carried out by a CVD method with an organic tantalum gas as a material. The tantalum oxide film at this stage has an amorphous structure. Now, the tantalum oxide film is subjected to thermal treatment to be formed as crystallized (polycrystallized) tantalum oxide film ($Ta_2O_5$), and the capacitive insulating film 28 may be formed as a more rugged dielectric. Thereafter, a titanium nitride film formed as a plate electrode 29 is deposited by the CVD method, and the titanium nitride film and polycrystallized tantalum oxide film are patterned using a photoresist film to form the capacitive insulating film 28 and the plate electrode 29. Each capacitor C comprised of the lower electrodes 27, capacitive insulating film 28 and plate electrode 29 is formed in this way (see FIG. 19). Incidentally, the plate electrode 29 may be formed as a polycrystalline silicon film containing phosphorus having a concentration of $4\times10^{20}/cm^3$, for example.

Thereafter, an insulating film 30 is formed over the entire surface of the semiconductor substrate 1. Connecting holes are defined in the insulating film 30. Further, for example, a titanium film, a titanium nitride film and a tungsten film are successively deposited over the insulating film 30 containing the connecting holes. They are removed by the CMP method or etchback method to form plugs 32. Afterwards, a laminated film comprised of, for example, a titanium nitride film, an aluminum film and a titanium nitride film is deposited over the insulating film 30 and subjected to patterning to thereby form second layer interconnections 31. Thus, the DRAM shown in FIG. 3 is substantially completed. Further, since upper wiring layers can be formed in a manner similar to the second layer interconnections 31, their detailed description will be omitted.

According to the DRAM of the present embodiment, since the tungsten films 33 serving as the masks for defining the wiring trenches 18*a* in which the bit lines BL are formed, and the photoresist films 35 formed in stripe form in the Y direction (corresponding to the direction of each word line WL) are etched as masks, the wiring trenches 18*b* functioning as the bit line connecting holes can be formed in self-alignment with the bit lines BL. Thus, the electrical connections between the bit lines BL and the plugs 21 can be implemented with ease and a high degree of reliability.

Figure 20A:
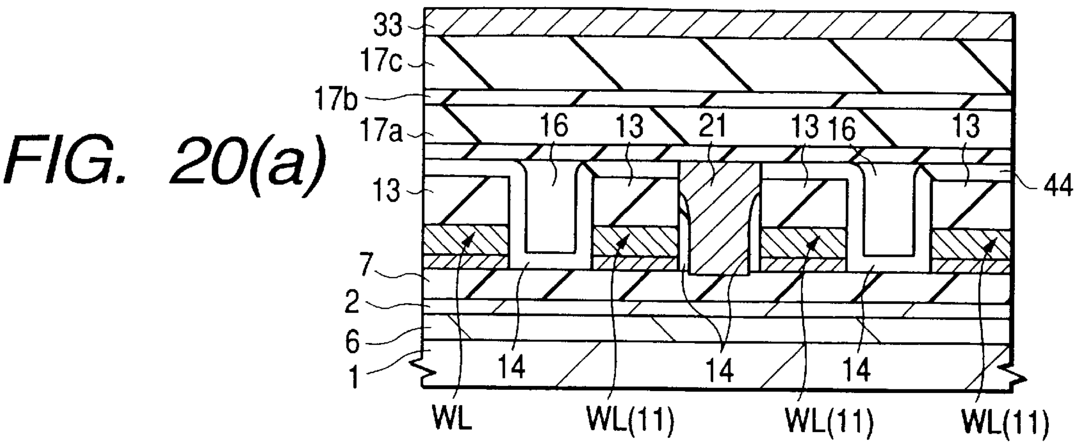
FIG. 20(*a*) is a cross-sectional view depicting one example of the process for manufacturing the DRAM according to the embodiment 1 in process order.
Figure 20B:
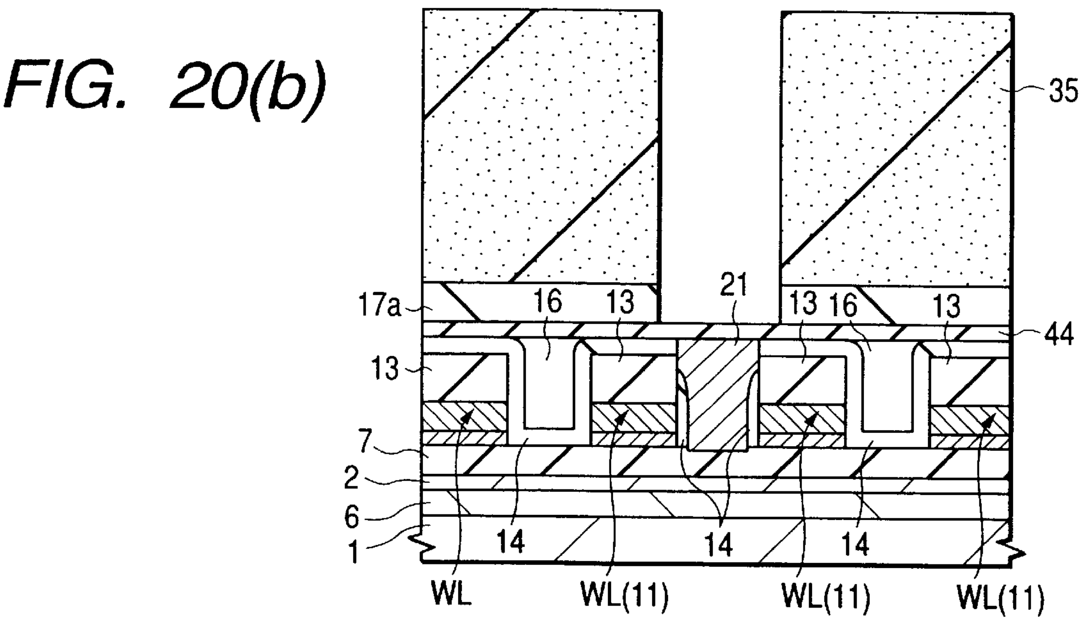
Figure 20C:
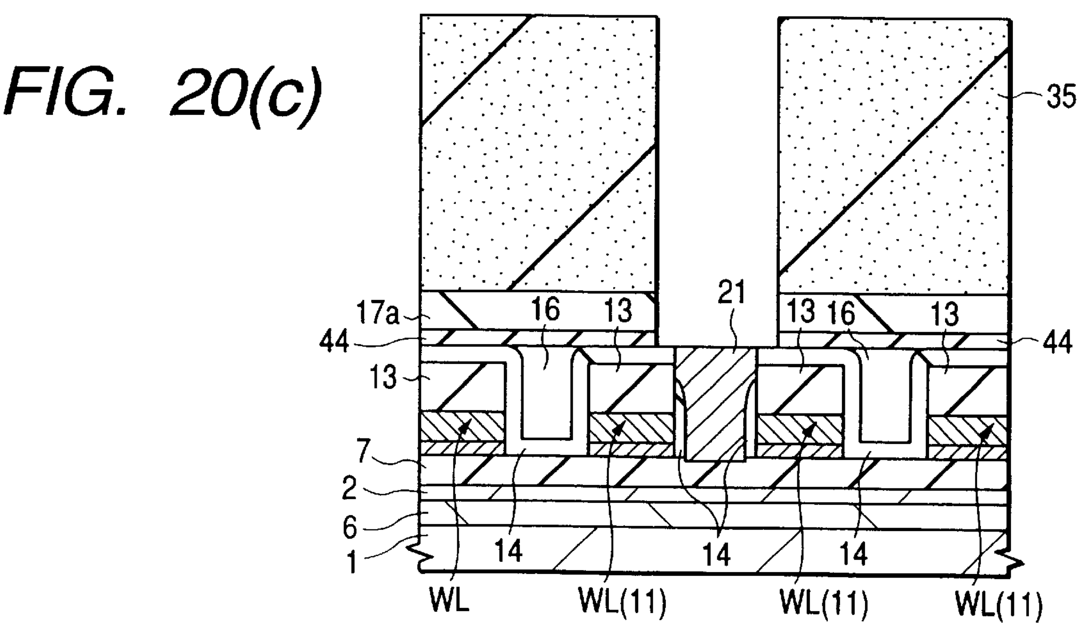
Figure 21A:
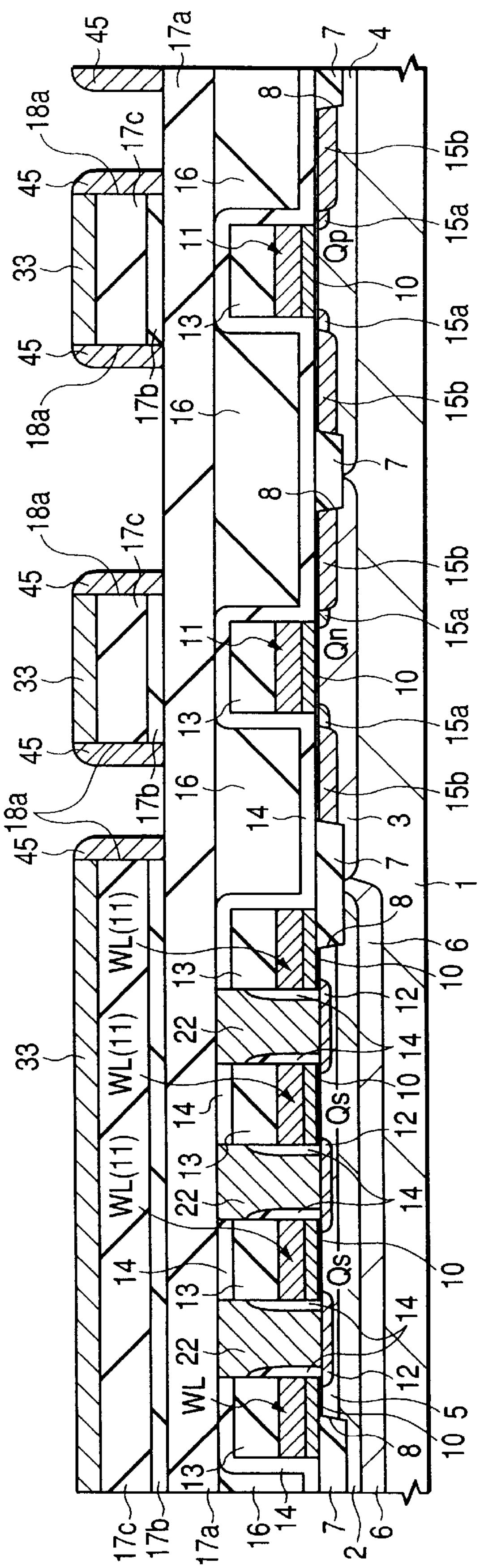
FIG. 21(*a*) is a cross-sectional view showing one example of a process for manufacturing a DRAM according to an embodiment 2 in process order.
Figures 21B, 21C, 21D:
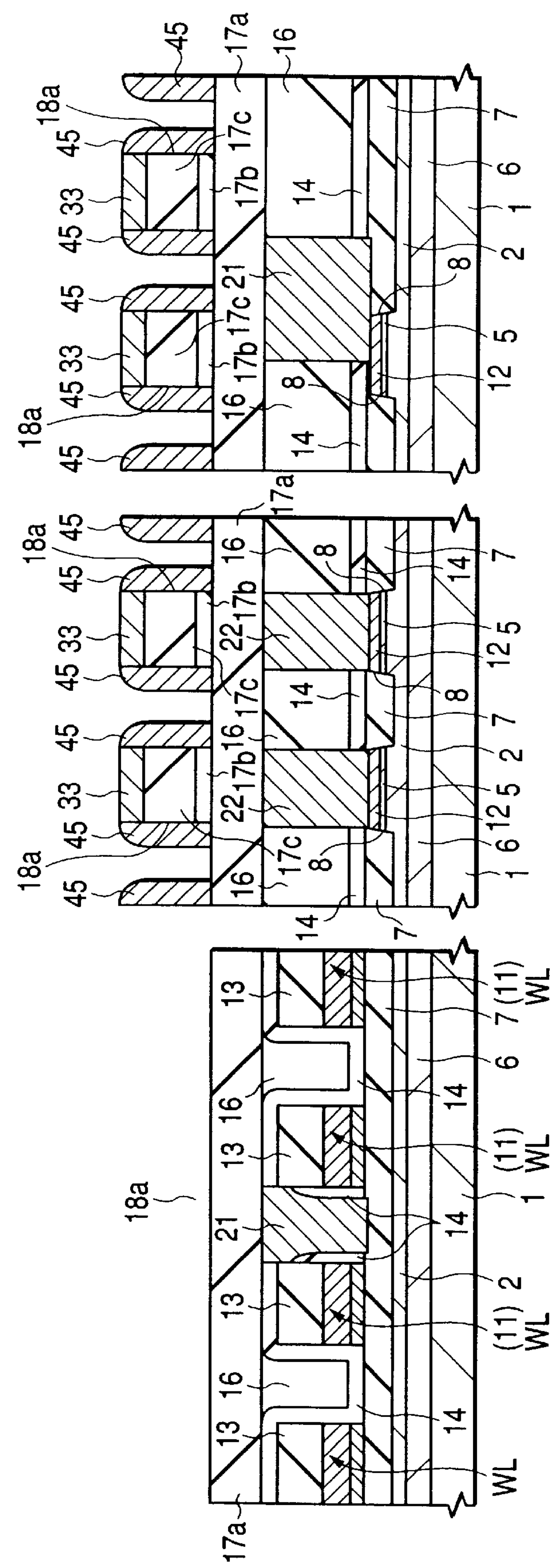

Incidentally, an insulating film 44 having an etching selection ratio with respect to the insulating film 17*a* can be formed between the insulating film 16 and the insulating film 17*a* as shown in FIG. 20. FIGS. 20(*a*), 20(*b*) and 20(*c*)

are respectively cross-sectional views showing such a case in process order. FIG. 20(*a*) corresponds to the process of FIG. 7(*b*) and FIG. 20(*c*) corresponds to the process of FIG. 12(*b*). For example, a silicon nitride film can be illustratively shown as the insulating film 44. The thickness thereof is 50 nm, for example.

Owing to the provision of the insulating film 44 in this way, the etching used upon defining the wiring trenches 18*b* can be carried out according to two-stage etching in a manner similar to the etching for the wiring trenches 18*a*. It is thus possible to prevent excessive etching of the wiring trenches 18*b*.

(Embodiment 2)

FIGS. 21 through 26 are respectively cross-sectional views or plan views showing one example of a process for manufacturing a DRPM, according to the present embodiment 2. Incidentally, FIGS. 21(*a*), 21(*b*), 21(*c*) and 21(*d*), FIGS. 23(*a*), 23(*b*), 23(*c*) and 23(*d*), FIGS. 25(*a*), 25(*b*), 25(*c*) and 25(*d*), and FIGS. 26(*a*), 26(*b*), 26(*c*) and 26(*d*) show the cross-section taken along line C—C, the cross-section taken along line A—A, the cross-section taken along line D—D and the cross-section taken along line B—B in FIG. 2, respectively.

The DRAM according to the present embodiment is different from that according to the embodiment 1 in the structure of each bit line BL (first layer interconnections 20) and its manufacturing method or process. Thus, only their dissimilar portions will be explained.

Process steps for manufacturing the DRAM according to the present embodiment are similar to those up to the process step of FIG. 10 in the embodiment 1.

Figure 22:
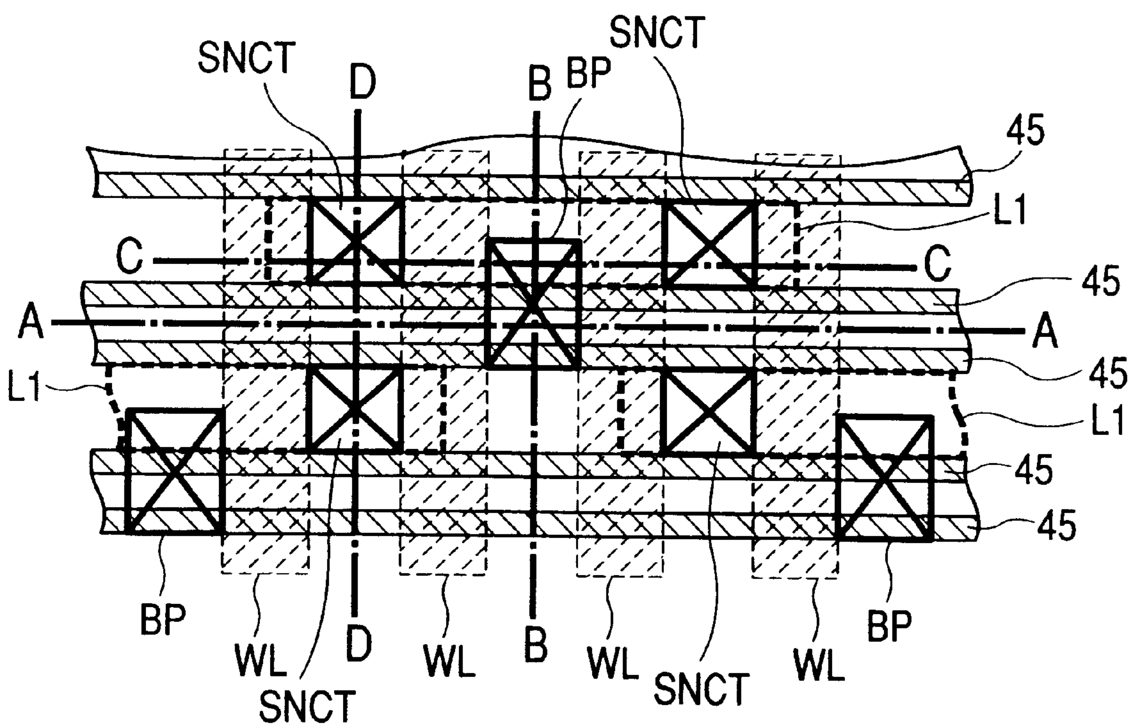
FIG. 22 is a plan view illustrating one example of the process for manufacturing the DRAM according to the embodiment 2 in process order.

Thereafter, a tungsten film for burying wiring trenches 18*a* is deposited over the entire surface of the semiconductor substrate 1. The thickness of the tungsten film is set to the extent that it is deposited inside each wiring trench 18*a* with a good coating characteristic, e.g., 60 nm. The tungsten film is anisotropically etched to thereby form side wall spacers 45 composed of tungsten over inner side walls of the wiring trenches 18*a* (see FIG. 21). Flat patterns of the wiring trenches 18 at this time and the side wall spacers 45 formed on their inner side walls are shown in FIG. 22. Wiring trenches 18*b* are respectively defined in regions interposed between the adjacent side wall spacers 45 as will next be described. The width of each wiring trench 18*b* is about 60 nm.

Figure 23A:
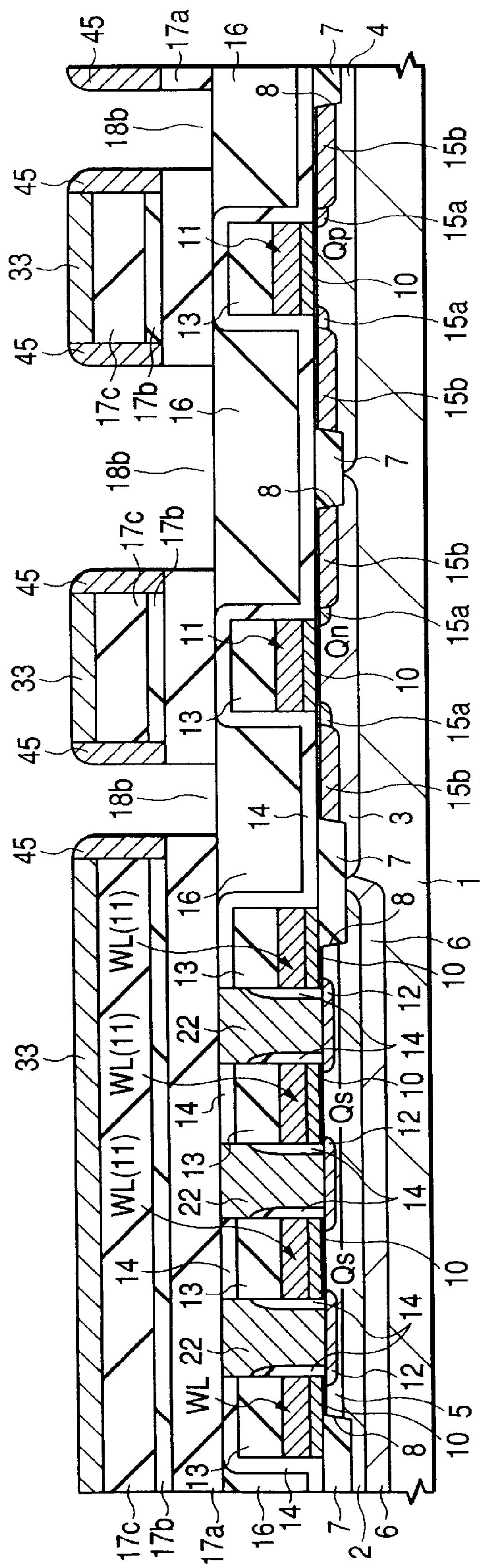
FIG. 23(*a*) is a cross-sectional view showing one example of the process for manufacturing the DRAM according to the embodiment 2 in process order.
Figures 23B, 23C, 23D:
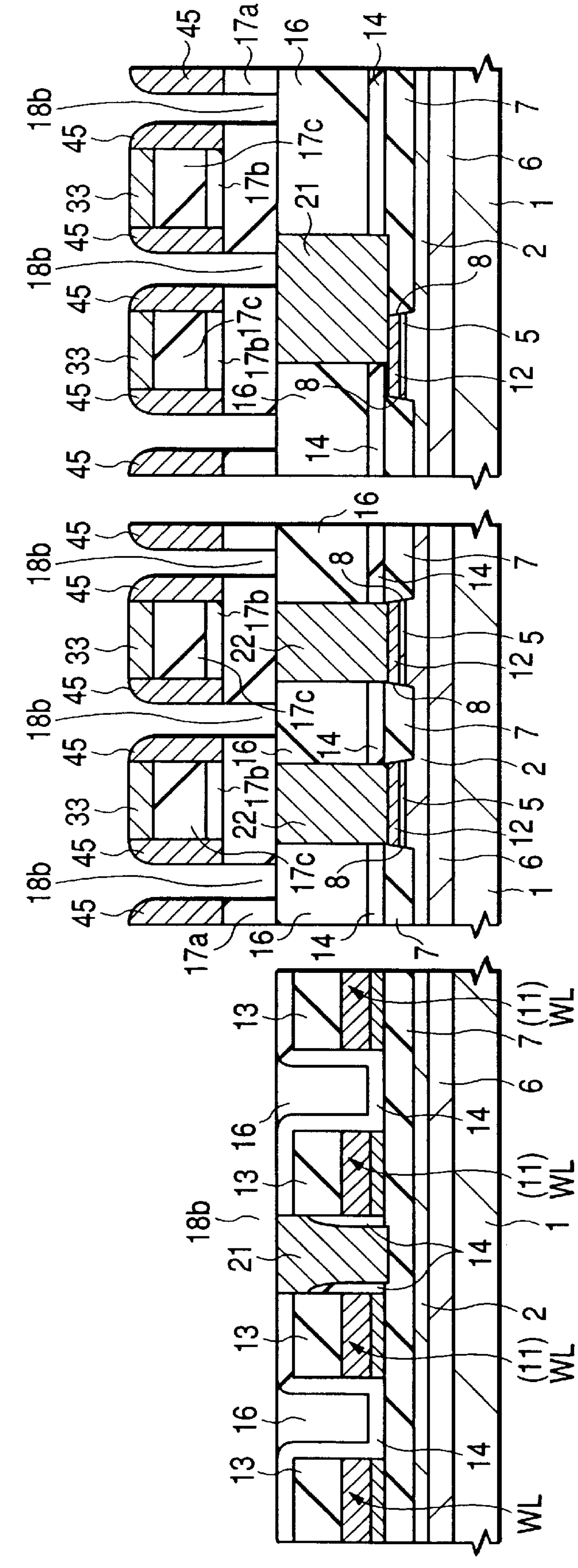

Next, an insulating film 17*a* is etched with each tungsten film 33 and side wall spacers 45 as masks to thereby form wiring grooves or trenches 18*b* (see FIG. 23). Incidentally, no photoresist films are used upon the present etching. Namely, since the etching is carried out with the tungsten film 33 and side wall spacers 45 as the masks without having to use the photoresist films, the wiring trenches 18*b* are continuously formed in an X direction (corresponding to the direction in which each bit line BL extends) in a manner similar to the wiring trenches 18*a*. As will be described later, part of the bit line BL is formed in each wiring trench 18*b* and electrically connected to its corresponding plug 21. However, even if the wiring trenches 18*b* are formed so as to continuously extend in the X direction in this way, the wiring trenches 18*b* do not make plugs 22 bare. Namely, the width of each wiring trench 18*b* is narrow due to the formation of the side wall spacers 45. Therefore, the bit lines BL are not connected to the plugs 22 and the insulation of the bit lines BL from the plugs 22 is maintained.

Further, the part of each bit line BL formed in the wiring trench 18*b* can be considered to be a sort of bit line connecting portion. Namely, the wiring trenches 18*b* can be considered to be bit line connecting holes. When they are considered in this way, the bit line connecting holes are defined in self-alignment with the wiring trenches 18*a*, i.e., bit lines BT, and hence micro-fabrication is made easy in a manner similar to the embodiment 1.

In the present embodiment, the sort of bit line connecting holes can be defined without having to use the photoresist film and the process can be simplified.

Figure 24:
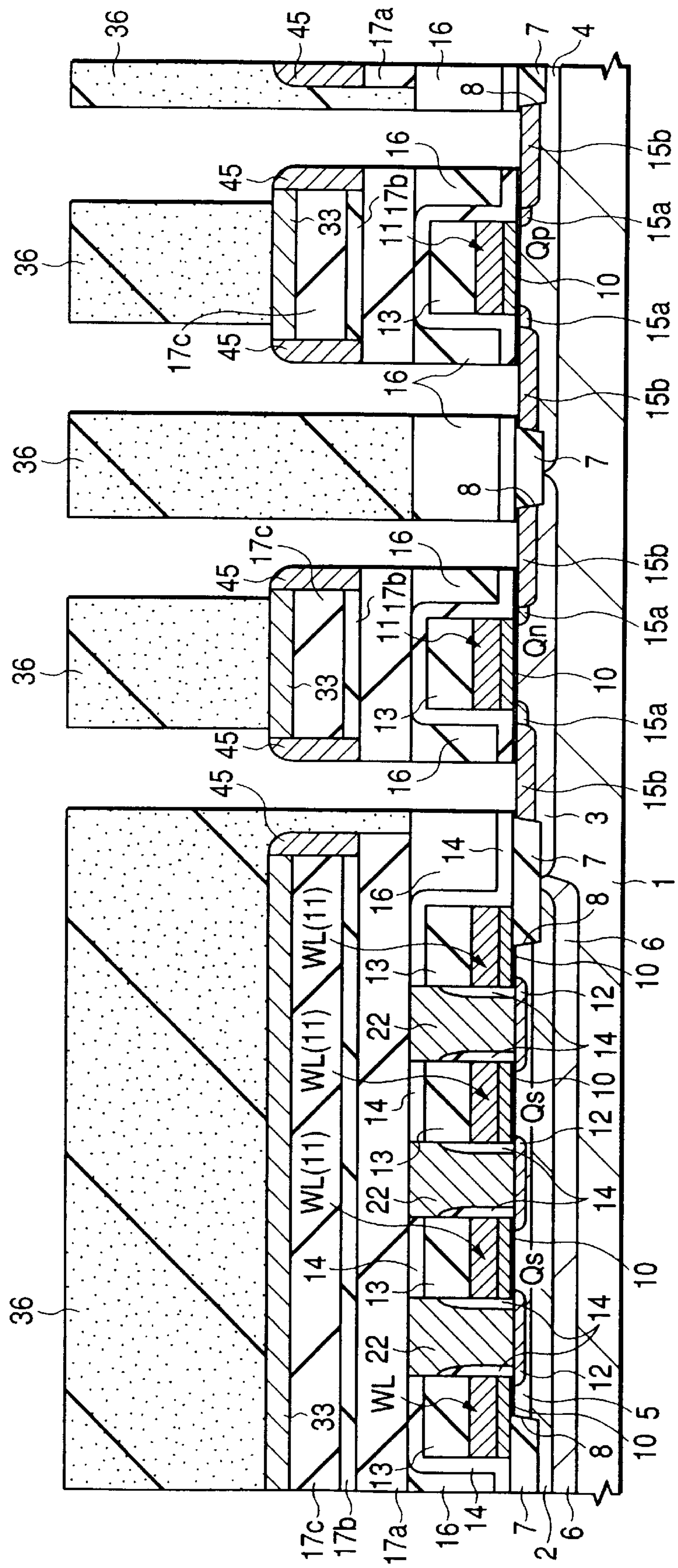
FIG. 24 is a cross-sectional view illustrating one example of the process for manufacturing the DRAM according to the embodiment 2 in process order.

Next, a photoresist film 36 is formed as shown in FIG. 24, and connecting holes connected to source-to-drain regions (high-density impurity regions 15*b*) of MISFETs in a peripheral circuit region are defined or opened. This process step is similar to the process step of FIG. 13 in the embodiment 1.

Figure 25A:
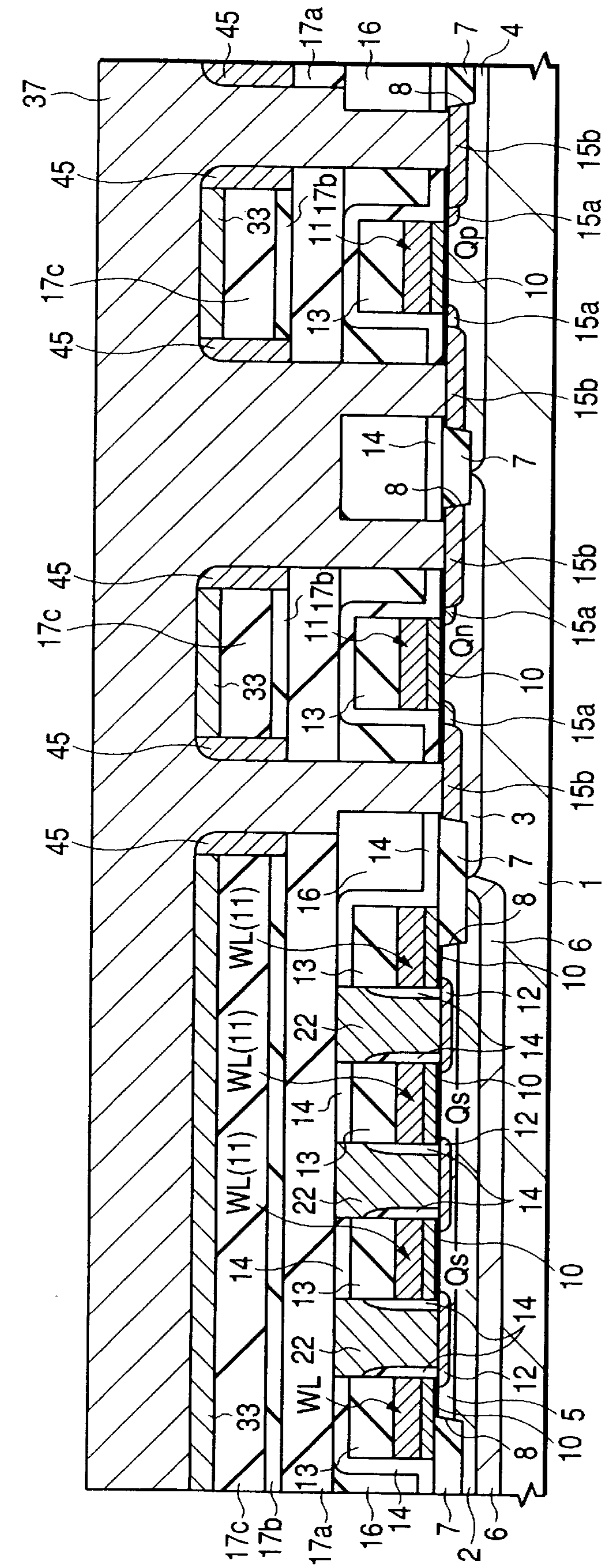
FIG. 25(*a*) is a cross-sectional view showing one example of the process for manufacturing the DRAM according to the embodiment 2 in process order.
Figures 25B, 25C, 25D:
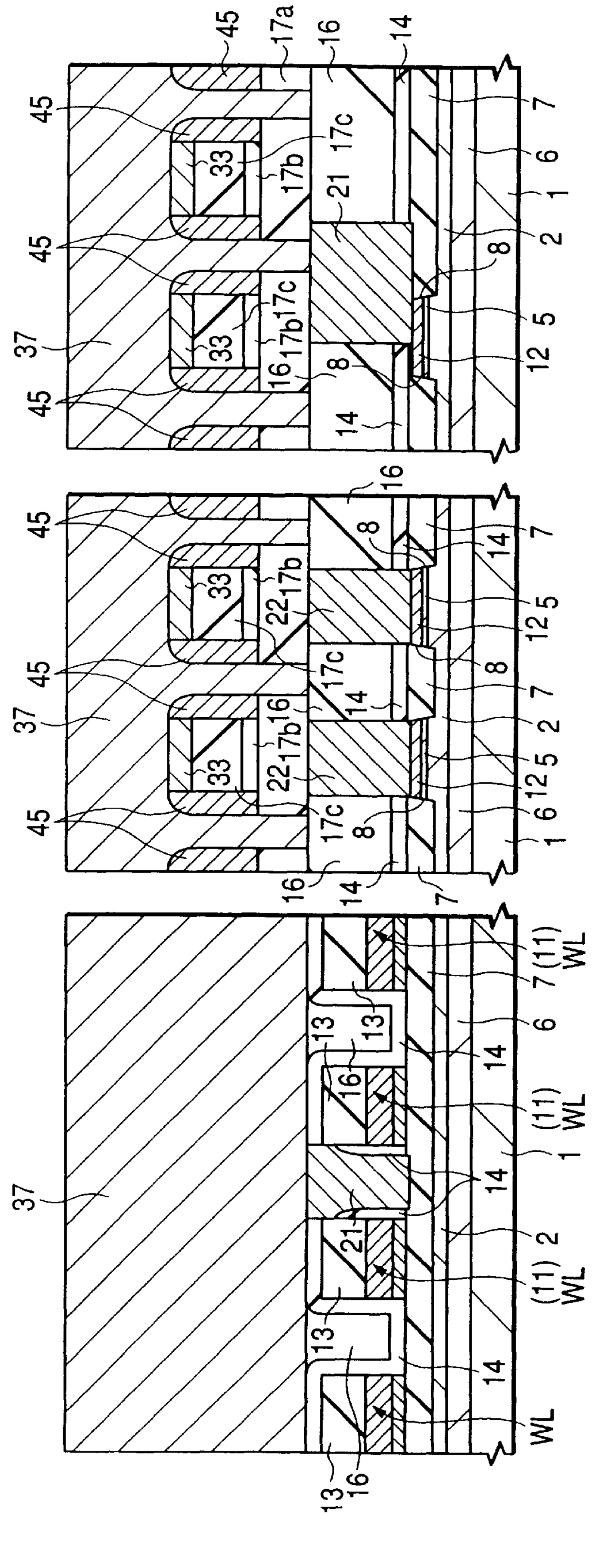
Figures 26A, 26B, 26C, 26D:
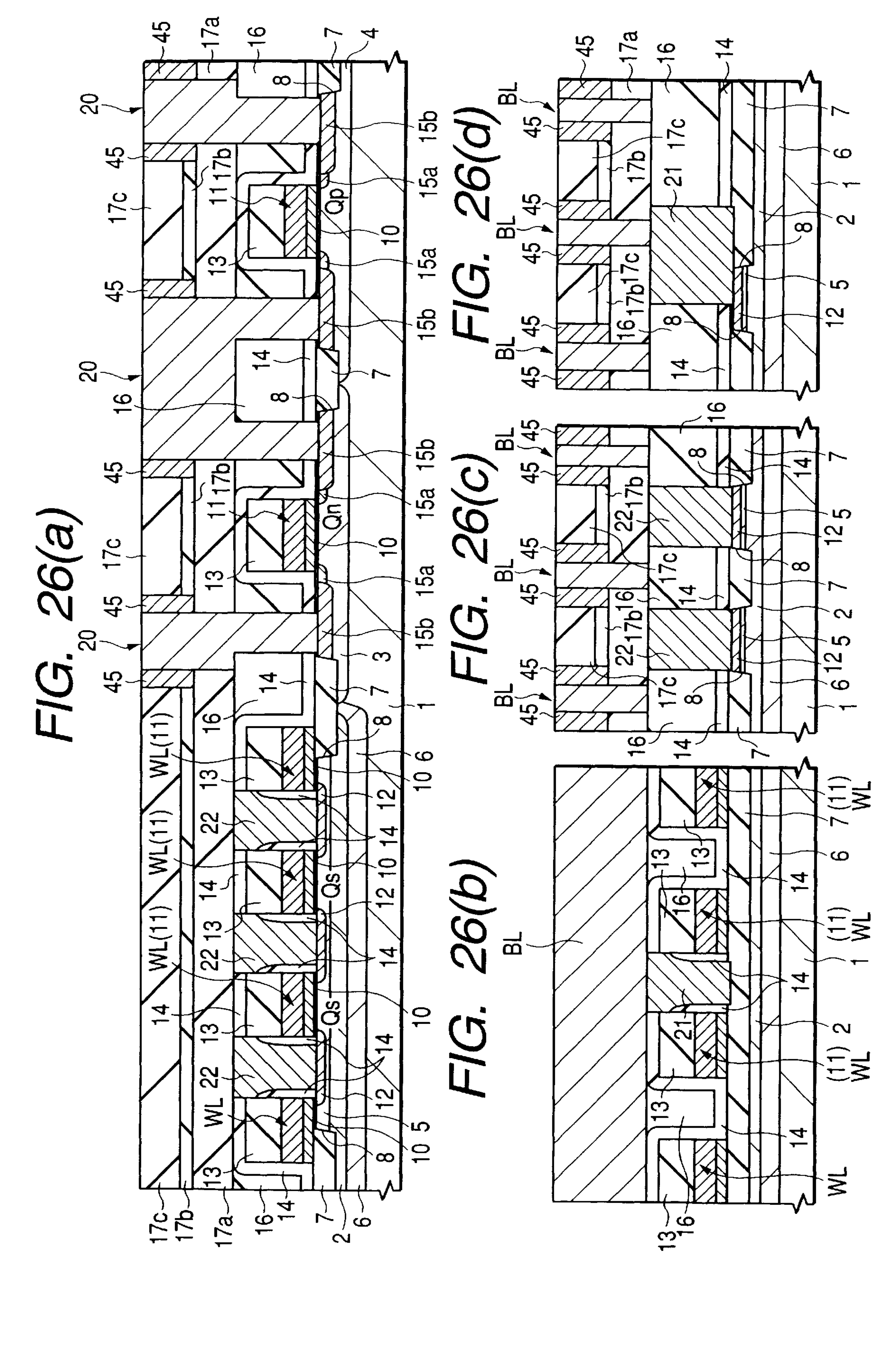
FIG. 26(*a*) is a cross-sectional view depicting one example of the process for manufacturing the DRAM according to the embodiment 2 in process order.

Next, a tungsten film 37 having a thickness of 300 nm is formed over the entire surface of the semiconductor substrate 1 by, for example, a sputtering method in a manner similar to the embodiment 1 (see FIG. 25). The tungsten film 37 and tungsten film 33 are polished by a CMP method, for example (see FIG. 26). At this time, the upper portions of the side wall spacers 45 are also polished so that the surfaces thereof are flattened. Thus, the bit lines BL each comprised of the side wall spacers 45 and tungsten film 37, and first layer interconnections 20 are formed.

Subsequent process steps are similar to those employed in the embodiment 1.

According to the DRAM of the present embodiment, since the side wall spacers 45 are formed on the inner side walls of the wiring trenches 18*a* and the wiring trenches 18*b* are formed using these as the masks, it is unnecessary to form the photoresist film. Therefore, the wiring trenches 18*b* can be formed in self-alignment with the wiring trenches 18*a* and the process can be simplified. Further, since the side wall spacers 45 are composed of tungsten capable of being used as parts of the interconnections (bit lines BL and first layer interconnections 20), the height (depth of each wiring trench 18*a*) of each interconnection can be lowered. Thus, wiring-to-wiring capacitance or capacitance between the interconnections is reduced so that the performance of the DRAM such as an improvement in the sensitivity for the detection of stored charges can be improved. Since the width of each wiring trench 18*b* is narrow, the width of the portion of each bit line BL, which is connected to each plug 21, is formed narrowly. Therefore, the contribution of the capacitance between the interconnections in the region in which the wiring width is narrow, can be less reduced.

Figure 27:
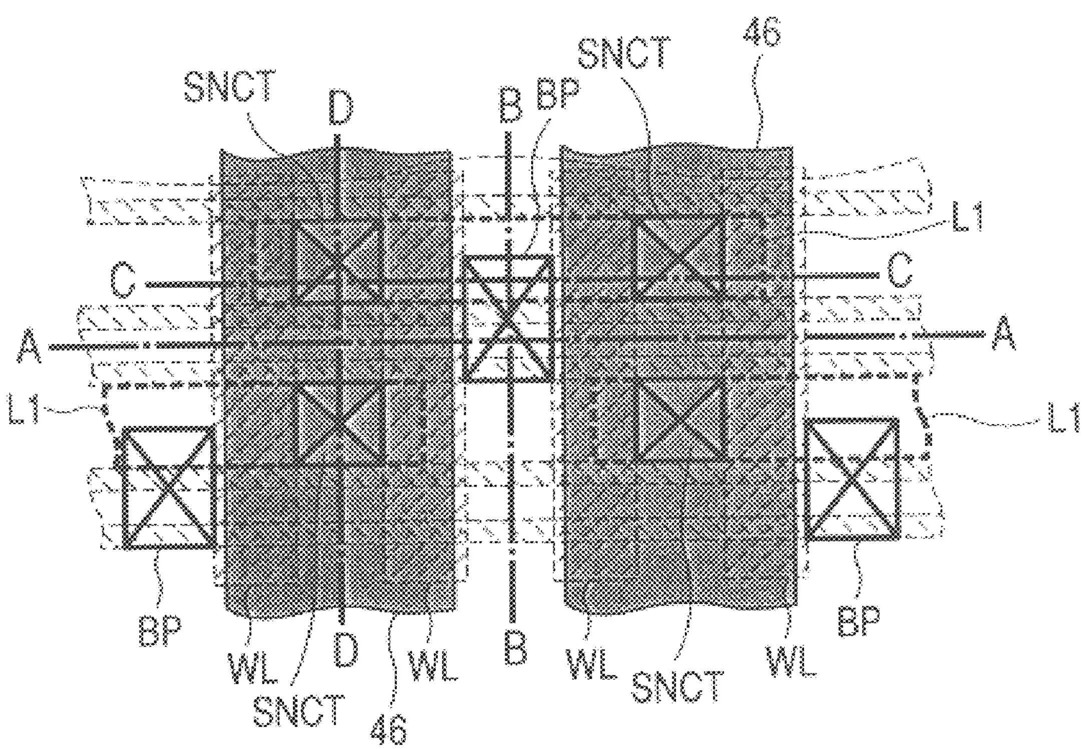
FIG. 27 is a plan view illustrating another example of the process for manufacturing the DRAM according to the embodiment 2 in process order.
Figure 28A:
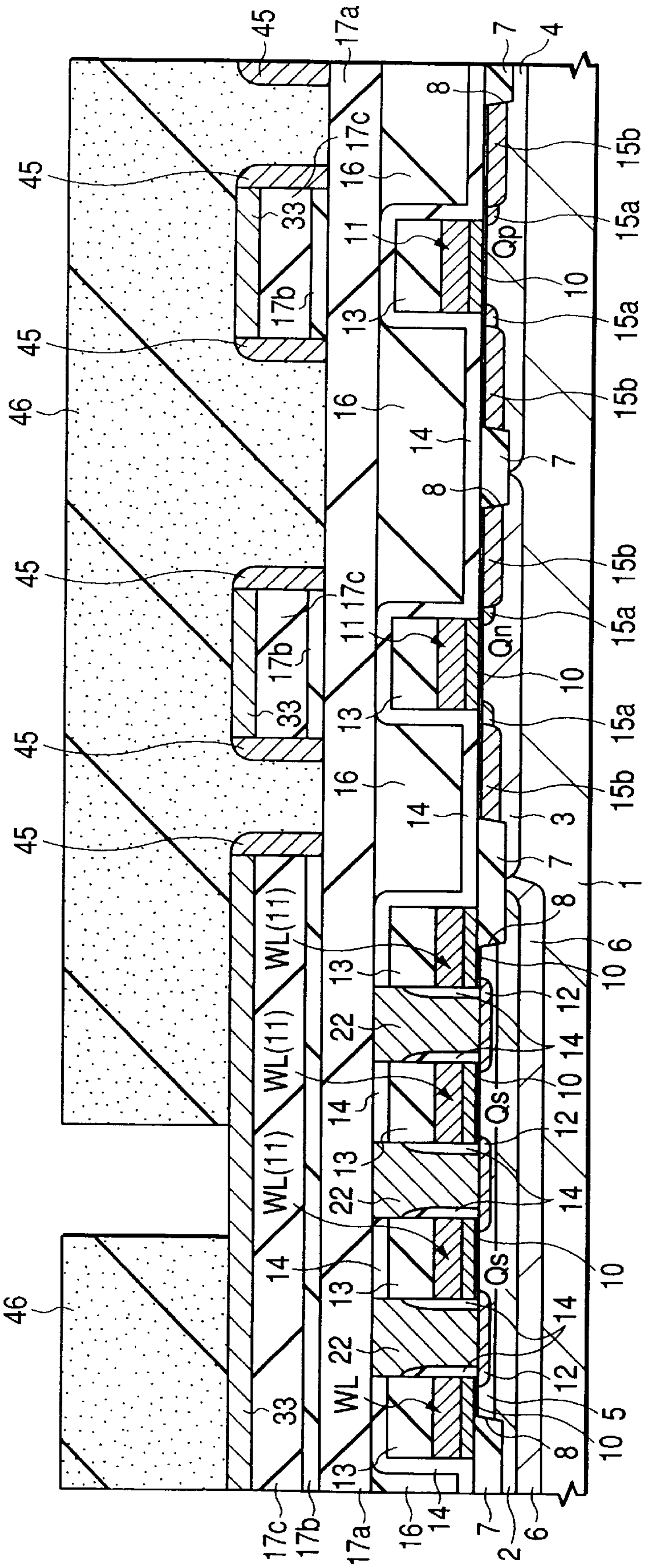
FIG. 28(*a*) is a cross-sectional view showing another example of the process for manufacturing the DRAM according to the embodiment 2 in process order.
Figures 28B, 28C, 28D:
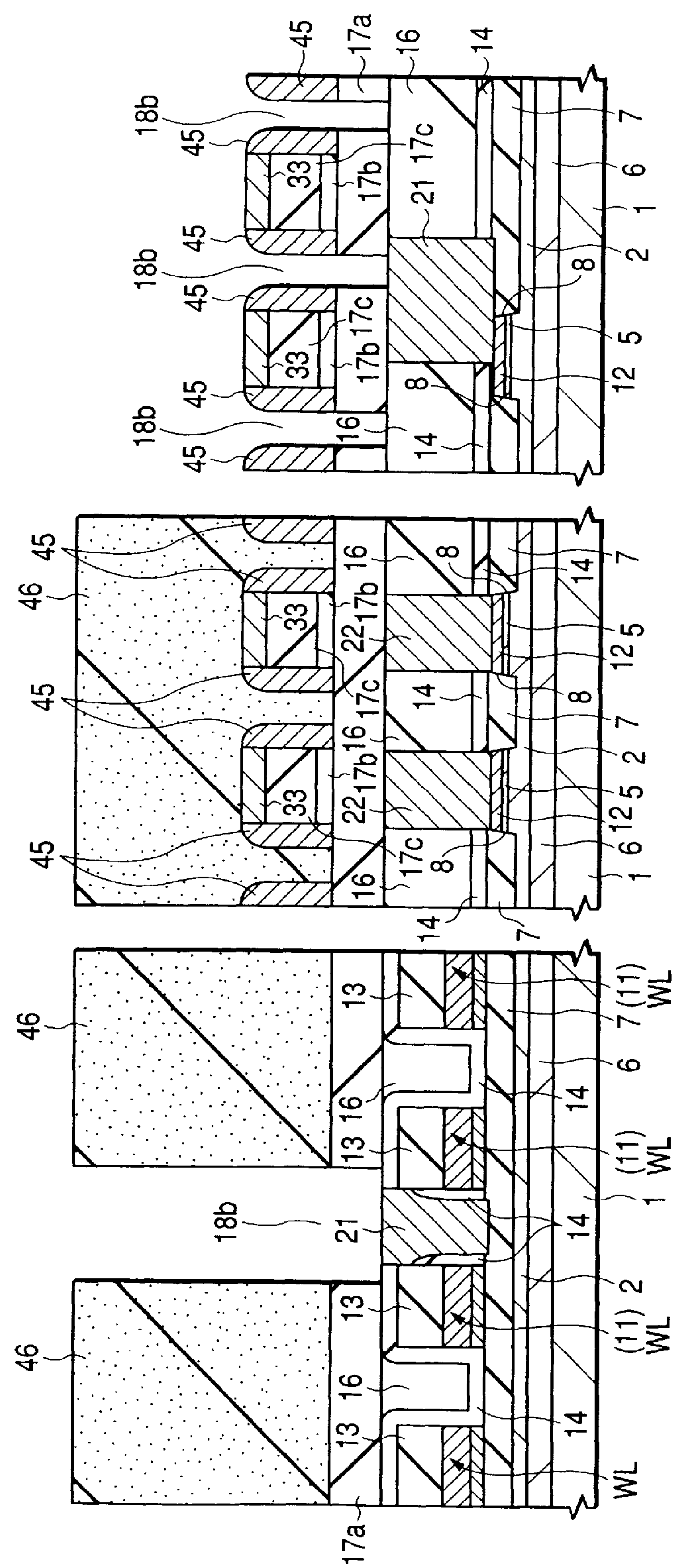
Figures 29A, 29B, 29C, 29D:
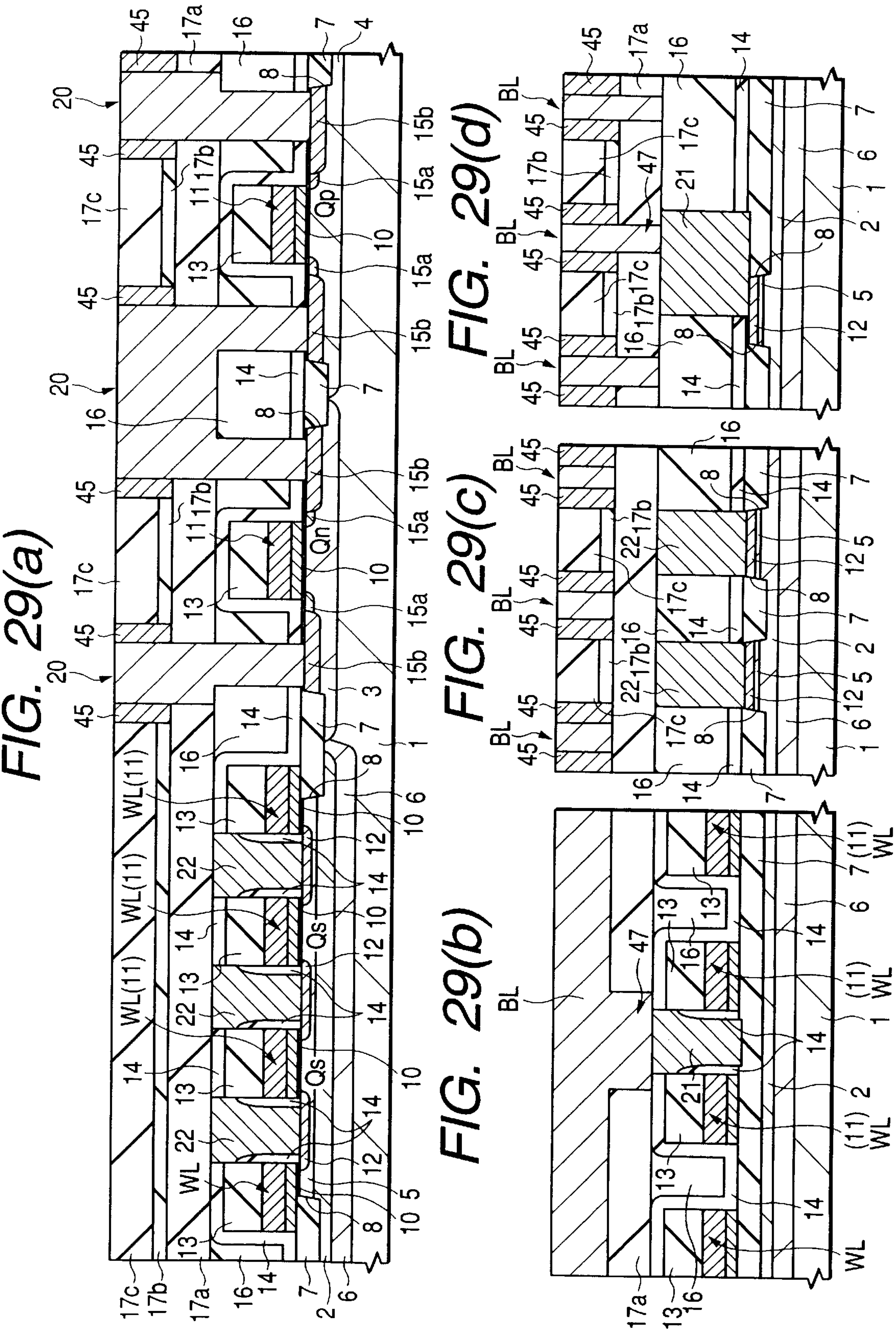
FIG. 29(*a*) is a cross-sectional view depicting another example of the process for manufacturing the DRAM according to the embodiment 2 in process order.

While the present embodiment is characterized in that no photoresist films are formed upon defining each wiring trench 18*b*, photoresist films 46 may be formed as shown in FIG. 27. Each photoresist film 46 can be formed in a manner similar to the photoresist films 35 employed in the embodiment 1. In this case, the wiring trenches 18*b* are formed in a peripheral region of each plug 21 and not continuously formed in the direction in which each wiring trench 18*a* extends, as shown in FIG. 28. Therefore, parts (plug connecting portions 47) of the bit lines BL charged into the wiring trenches 18*b* are formed over the plugs 21 as shown in FIG. 29 after the formation of the bit lines BL. Further, no connecting portions are formed in other bit-line extending directions. Therefore, the capacitance between the interconnections is further reduced to make it possible to improve the performance of the DRAM.

Figure 30:
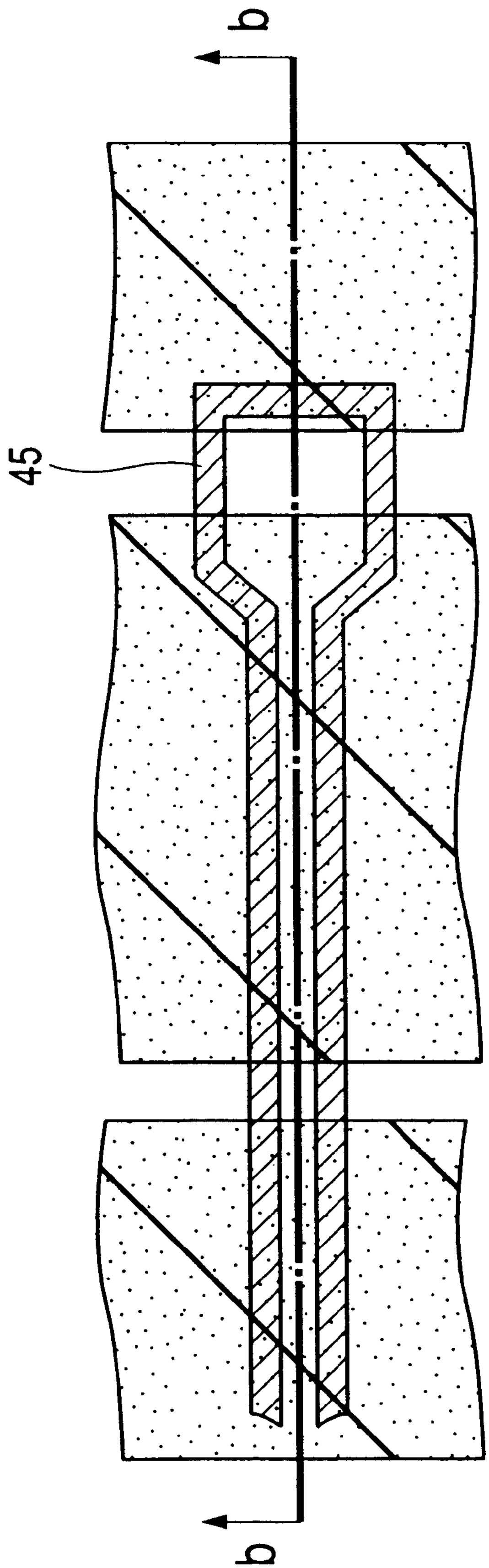
FIG. 30 is a plan view illustrating another example of the process for manufacturing the DRAM according to the embodiment 2 in process order.

When the side wall spacers 45 are formed on the inner side walls of the wiring trenches 18*a* as in the present embodiment, contact regions in the peripheral circuit region can be widened as shown in FIG. 30. Owing to the widening of the contact regions in the peripheral circuit regions in this way, contact areas in the peripheral circuit region are ensured and contact resistance can be reduced.

It is needless to say that an insulating film 44 having an etching selection ratio with respect to an insulating film 17*a* can be formed between an insulating film 16 and the insulating film 17*a* in a manner similar to the embodiment 1.

(Embodiment 3)

Figures 31A, 31B, 31C, 31D, 31E, 31F:
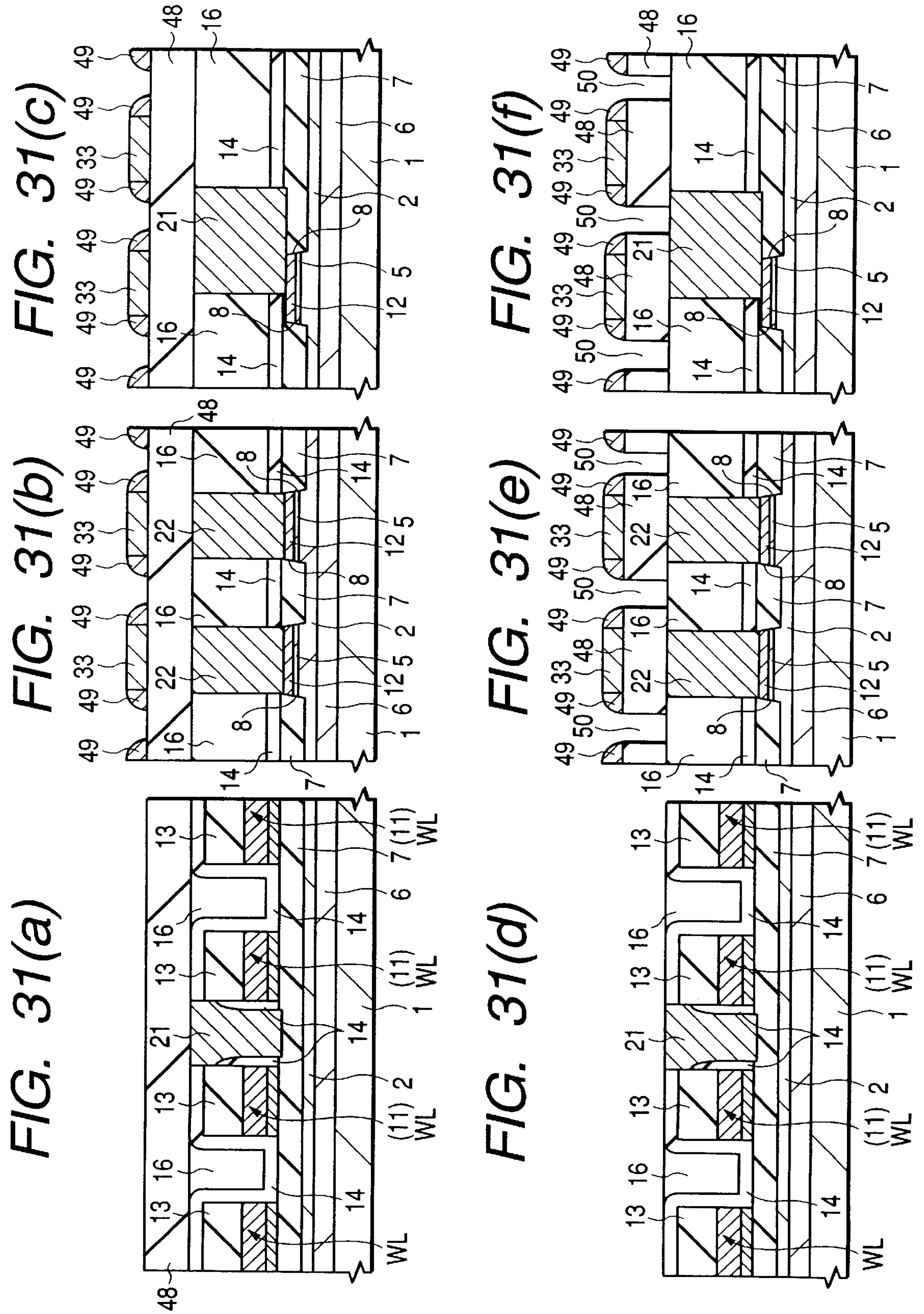
FIG. 31(*a*) is a cross-sectional view showing one example of a process for manufacturing a DRAM according to an embodiment 3 in process order.
Figures 32A, 32B, 32C, 32D, 32E, 32F:
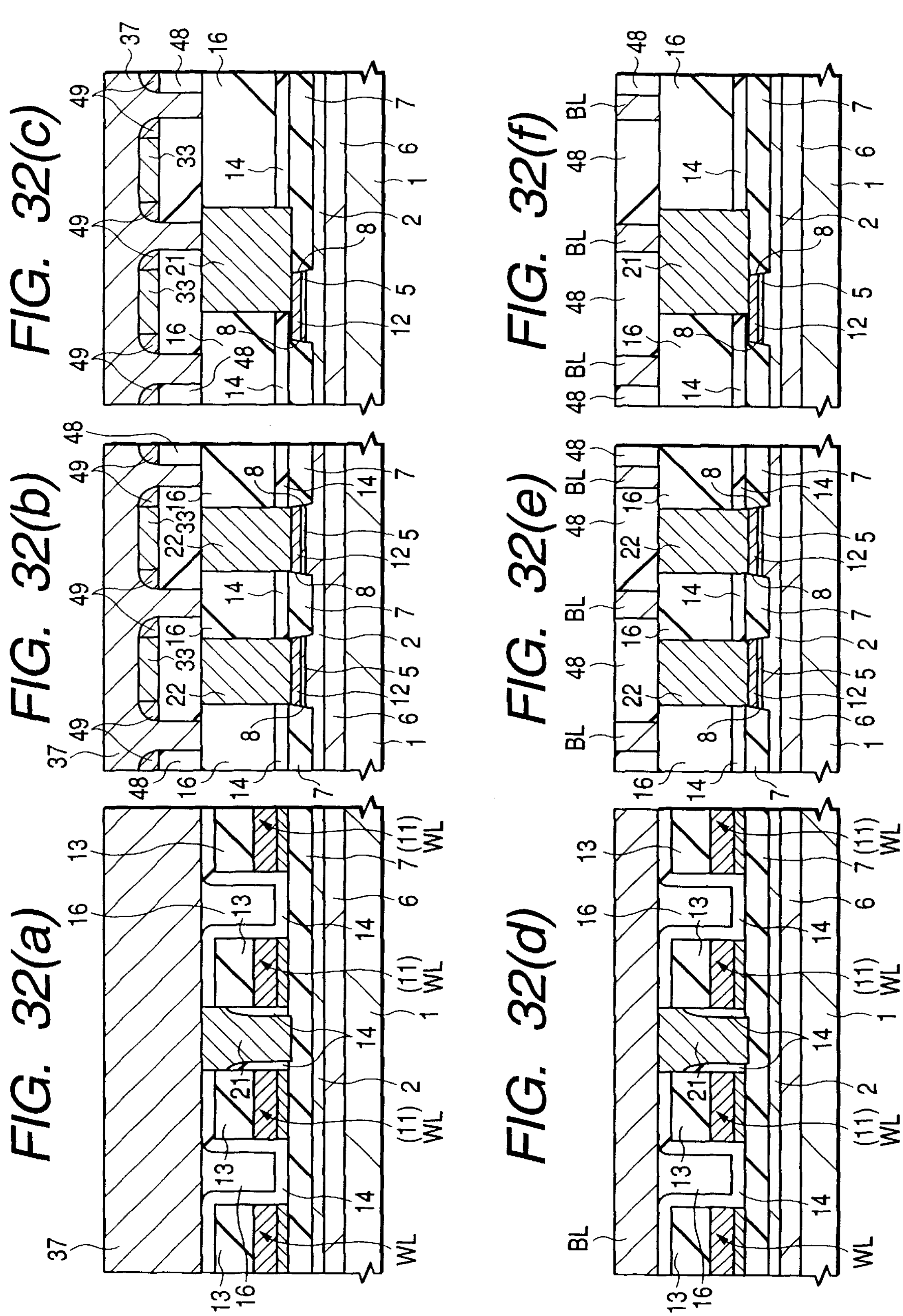
FIG. 32(*a*) is a cross-sectional view depicting one example of the process for manufacturing the DRAM according to the embodiment 3 in process order.

FIGS. 31 and 32 are respectively cross-sectional views showing one example of a process for manufacturing a DRAM, according to the embodiment 3 in process order. Incidentally, FIGS. 31(*a*), 31(*b*) and 31(*c*) and FIGS. 32(*a*), 32(*b*) and 32(*c*) or FIGS. 31(*d*), 31(*e*) and 31(*f*) and FIGS. 32(*d*), 32(*e*) and 32(*f*) are the cross-section taken along line A—A, the cross-section taken along line D—D and the cross-section taken along line B—B in FIG. 2, respectively.

The DRAM according to the present embodiment is different from that according to the embodiment 1 in the structure of each bit line BL (first layer interconnections 20) and its manufacturing method or process, and the structure of an insulting film by which each bit line BL is formed. Thus, only their dissimilar portions will be explained.

Process steps for manufacturing the DRAM according to the present embodiment are similar to those up to the process step of FIG. 9 in the embodiment 1. In the present embodiment, however, an insulating film 48 in which each wiring trench is defined, is constructed as a single layer film without being set as the three-layer films comprised of the insulating films 17*a,* 17*b* and 17*c* as in the embodiment 1. The insulating film 48 can be formed as a TEOS oxide film.

As in the process step of FIG. 9 in the embodiment 1, a tungsten film 33 is patterned. Thereafter a tungsten film (not shown) for covering the patterned tungsten films 33 is deposited and subjected to anisotropic etching to thereby form side wall spacers 49 composed of tungsten on their corresponding side walls of the tungsten films 33 (see FIGS. 31(*a*), 31(*b*) and 31(*c*)). The patterning of the tungsten 33 is carried out with the minimum processing dimensions of photolithography. However, spaces smaller than the minimum processing dimensions can be defined owing to the formation of the side wall spacers 49.

Next, the insulating film 48 is etched with the tungsten films 33 and side wall spacers 49 as masks. Owing to this etching, each wiring trench 50 is formed (see FIGS. 31(*d*), 31(*e*) and 31(*f*)). The wiring trenches 50 are formed with a width less than or equal to the minimum processing dimension of photolithography as described above.

Incidentally, no photoresist films are used upon defining the wiring trenches 50 in a manner similar to the embodiment 2. Owing to the unuse of the photoresist films, the process can be simplified.

The surface of each plugs 21 is made bare at the bottom of each wiring trench 50. Thus, if the bit lines BL are formed inside the wiring trenches 50 as will be described later, then the bit lines themselves are electrically connected to their corresponding plugs 21. It is therefore unnecessary to form bit line connecting holes. Namely, the formation of each bit line connecting hole is omitted and a problem on mask misalignment developed between the plug 21 and each bit line BL due to the patterning of each bit line connecting hole can be can be avoided.

Next, connecting holes for a peripheral circuit are defined in a manner similar to the embodiment 1. Thereafter, a tungsten film 37 having a thickness of 300 nm is formed over the entire surface of the semiconductor substrate 1 by a sputtering method, for example (see FIGS. 32(*a*), 32(*b*) and 32(*c*)). Further, the tungsten film 37, side wall spacers

49 and tungsten film 33 are polished by a CMP method, for example (see FIGS. 32(*d*), 32(*e*) and 32(*f*)). Thus, each bit line BL (first layer interconnection 20) is formed. The wiring width of the bit line BL formed in this way is formed small as compared with the embodiments 1 and 2. As a consequence, the distance between the interconnections is made long so that the capacitance between the interconnections can be reduced. Thus, the sensitivity for the detection of each stored charge can be improved and the performance of the DRAM can be enhanced.

Subsequent process steps are similar to those employed in the embodiment 1.

According to the DRAM of the present embodiment, the wiring trenches 50 each jointly having the function of each bit line connecting hole can be formed without having to use the photoresist film. Thus, the process can be simplified and the problem on the mask misalignment due to the formation of the big line connecting holes can be avoided. Further, since the wiring width of each bit line BL can be formed narrowly, the distance between the interconnections is made long so as to reduce the capacitance between the bit lines, whereby the performance of the DRAM such as the improvement in the sensitivity for the detection of each stored charge can be improved.

Figures 33A, 33B, 33C, 33D, 33E, 33F:
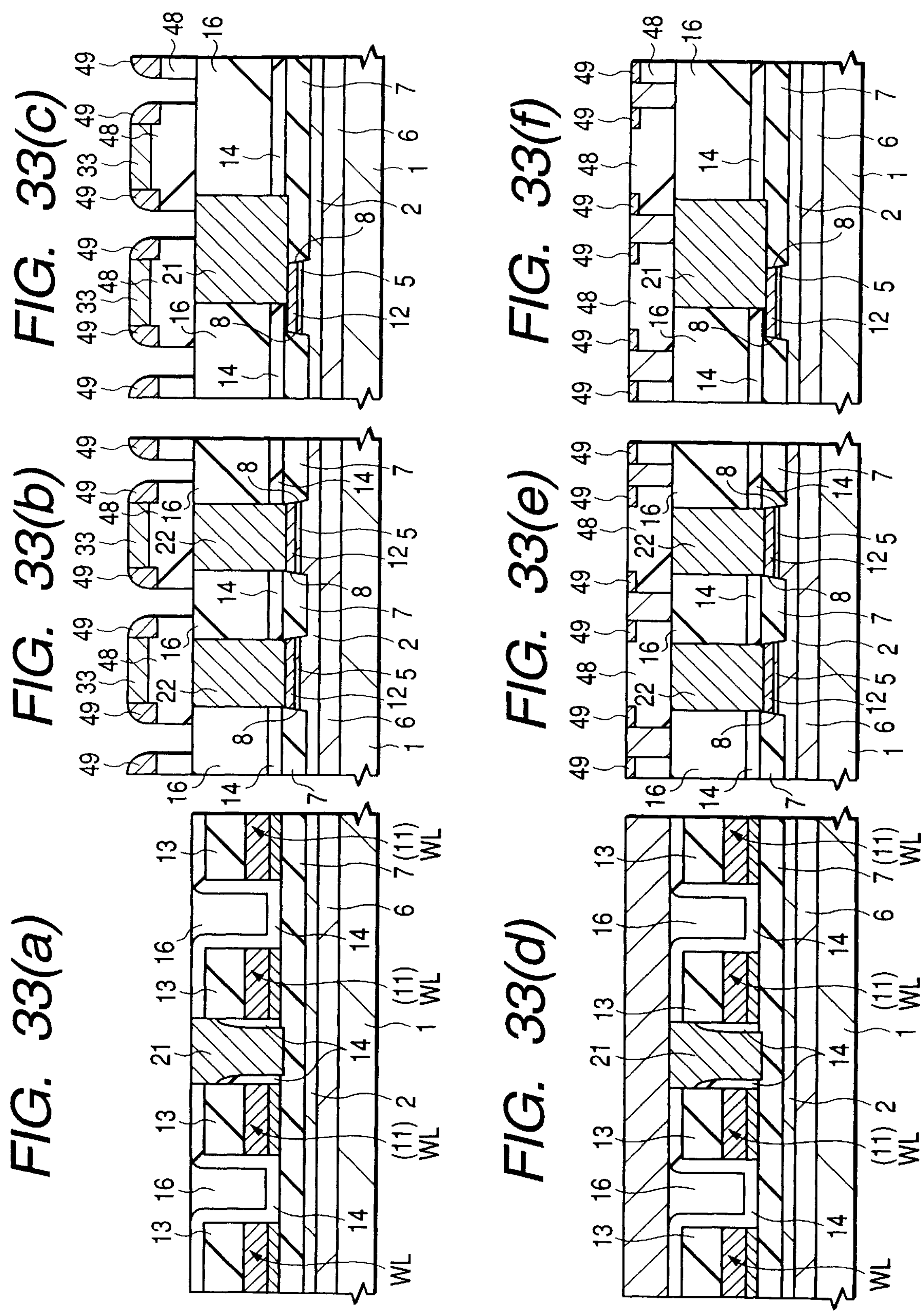
FIG. 33(*a*) is a cross-sectional view depicting another example of the process for manufacturing the DRAM according to the embodiment 3 in process order.

Upon patterning of the tungsten film 33, as shown in FIG. 33, each insulating film 48 used as a bed is excessively etched so that the bottom of each side wall spacer 49 can be formed at a height lower than the bottom of the tungsten film 33 (see FIGS. 33(*a*), 33(*b*) and 33(*c*)). With respect to the bit lines BL formed in this way, parts of the side wall spacers 49 can be left in the vicinity of the surfaces of the insulating films 48 as parts of the bit lines BL. Owing to the parts of the side wall spacers 49, the sectional area of each bit line BL is increased and wiring capacitance is reduced, thereby allowing contribution to an improvement in the performance of the DRAM.

Contact regions in the peripheral circuit region can be widened as shown in FIG. 30 in a manner similar to the embodiment 2 even in the case of the present embodiment. It is needless to say that a silicon nitride film or the like having an etching selection ratio with respect to the insulating films 48 can be formed between an insulating film 16 and each insulating film 48 in a manner similar to the embodiment 1.

While the invention made by the present inventors has been described above specifically by the embodiments of the invention, the present invention is not necessarily limited to the embodiments. It is needless to say that various changes can be made thereto within the scope not departing from the substance thereof.

Advantageous effects obtained by typical ones of the inventions disclosed in the present application will be described in brief as follows:

(1) In each memory cell of a scaled-down DRAM, the electrical connections between bit lines and connecting plugs can be implemented on a self-alignment basis in a word-line direction, and the electrical connections therebetween can be implemented with ease and a high degree of reliability.

(2) A process for forming portions for connecting between the bit lines and the connecting plugs can be simplified.

(3) The capacitance between the bit lines is reduced and the sensitivity for the detection of each stored electrical charge is improved, whereby the DRAM can be improved in performance.

(4) According to the present invention, since mask used upon definition of wiring trenches for burying and forming bit lines BL are left behind and the mask is utilized as one mask upon defining each wiring trench for forming the connecting plug thereinside, the bit lines and the connecting plugs are self-aligned in the direction of the wiring width of each bit line. Accordingly, there is provided a structure wherein no connecting plugs are formed below the insulating film corresponding to the same layer as the bit lines, which defines the interval between the adjacent bit lines. The interval between the adjacent connecting plugs is the same as the width of the insulating film or defined so as to be greater than the width thereof. It is thus possible to prevent an increase in the capacitance between the bit lines and a short circuit between the connecting plugs and the bit lines due to misalignment between connecting plug patterns and bit line patterns.

While, for example, an example of the capacitor having the cylindrical lower electrode having the opening in the upward direction is illustrated as the capacitor C in the embodiment 1, a simple stack type capacitor may be used.

Figure 35:
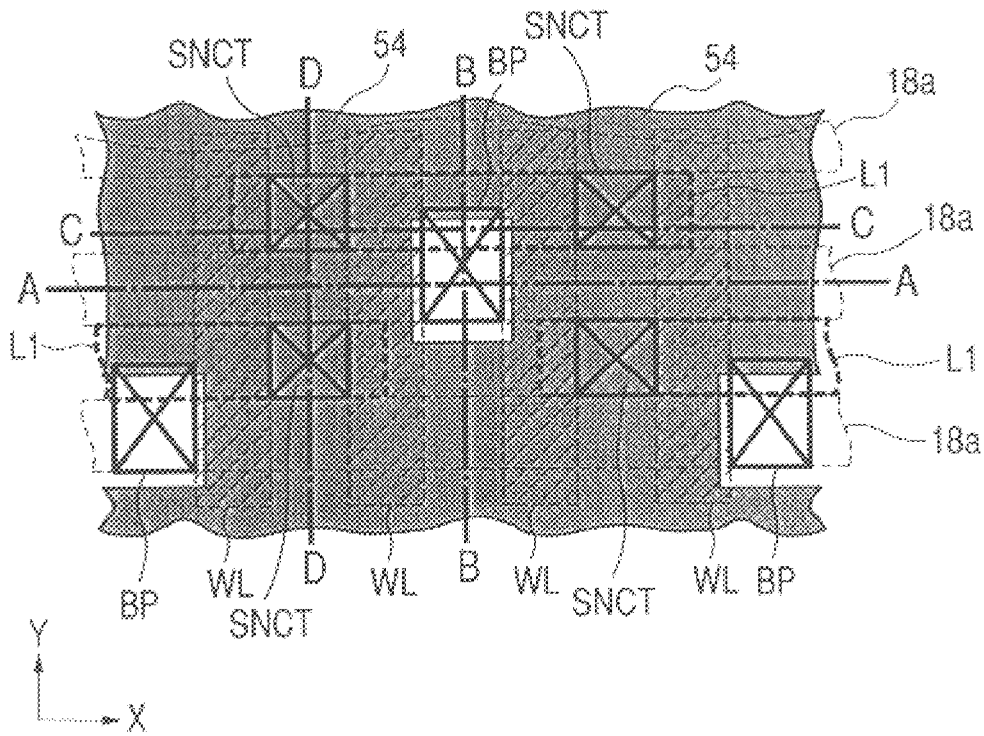
FIG. 35 is a plan view showing one example of a process for manufacturing a DRAM according to a still further embodiment of the present invention in process order.
Figure 36A:
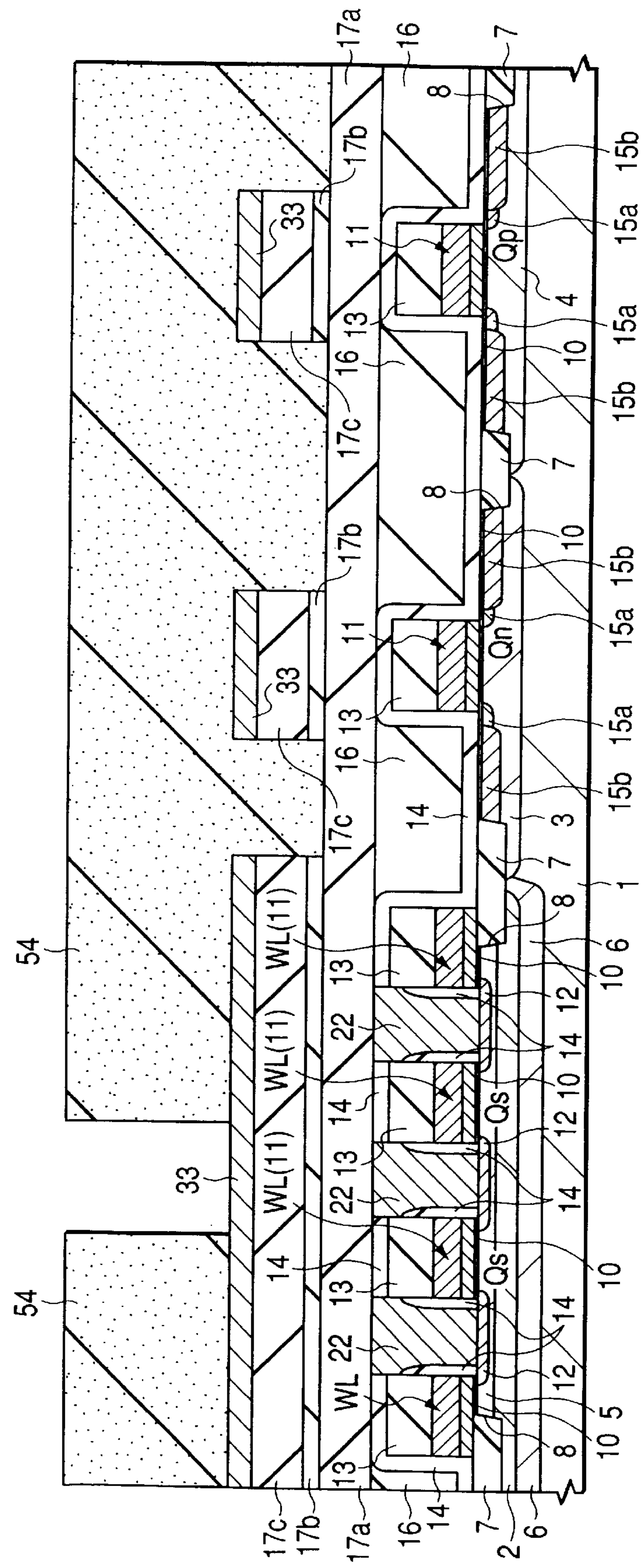
FIG. 36(*a*) is a cross-sectional view depicting another example of the process for manufacturing the DRAM according to the still further embodiment of the present invention in process order.
Figure 36B:
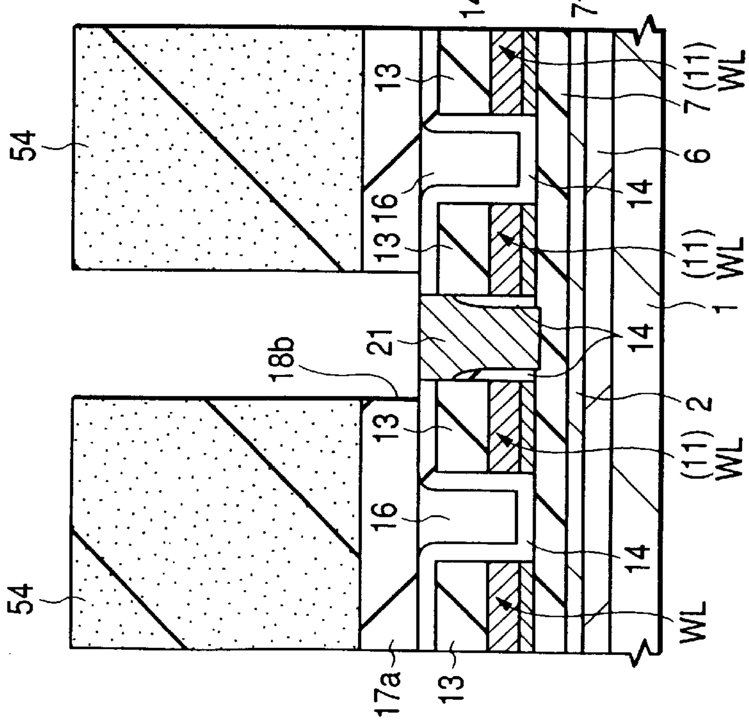
Figure 36C:
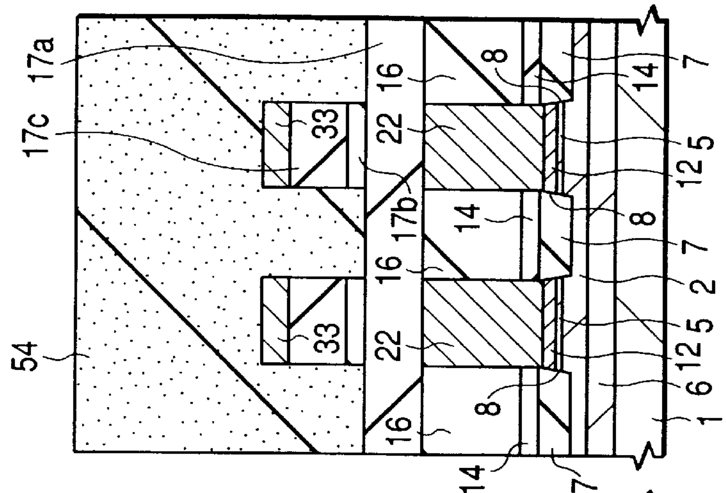
Figure 36D:
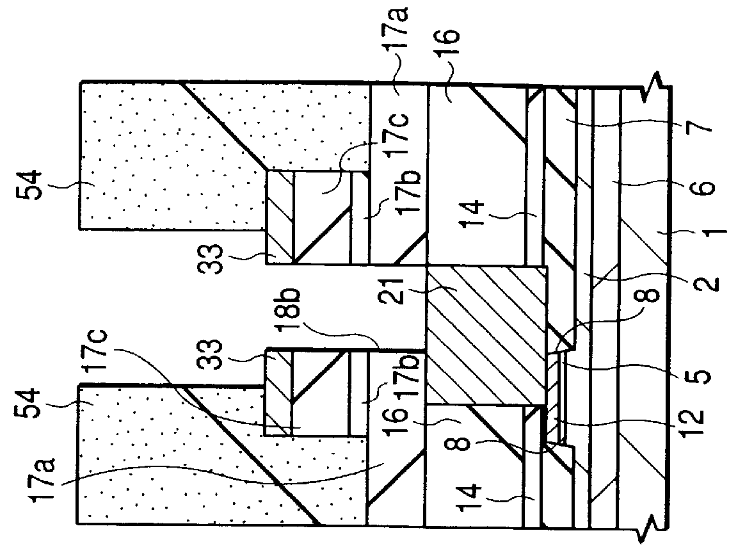

Further, the photoresist films formed over the tungsten films 32 may be used as photoresist films 54 formed as patterns having island-shaped openings shown in FIG. 35. This allows reductions in the number of the wiring trenches 18*b* formed in the region non-used for connection to the active layer of each MISFET and the number of the connecting plugs formed within the wiring trenches 18*b* and makes it useful in a decrease in the capacitance of each bit line BL. At this time, the length of each opening in the Y direction may suitably be set so that the opening does not extend to its adjacent wiring trench even if mask misalignment is taken into consideration.

Figure 37A:
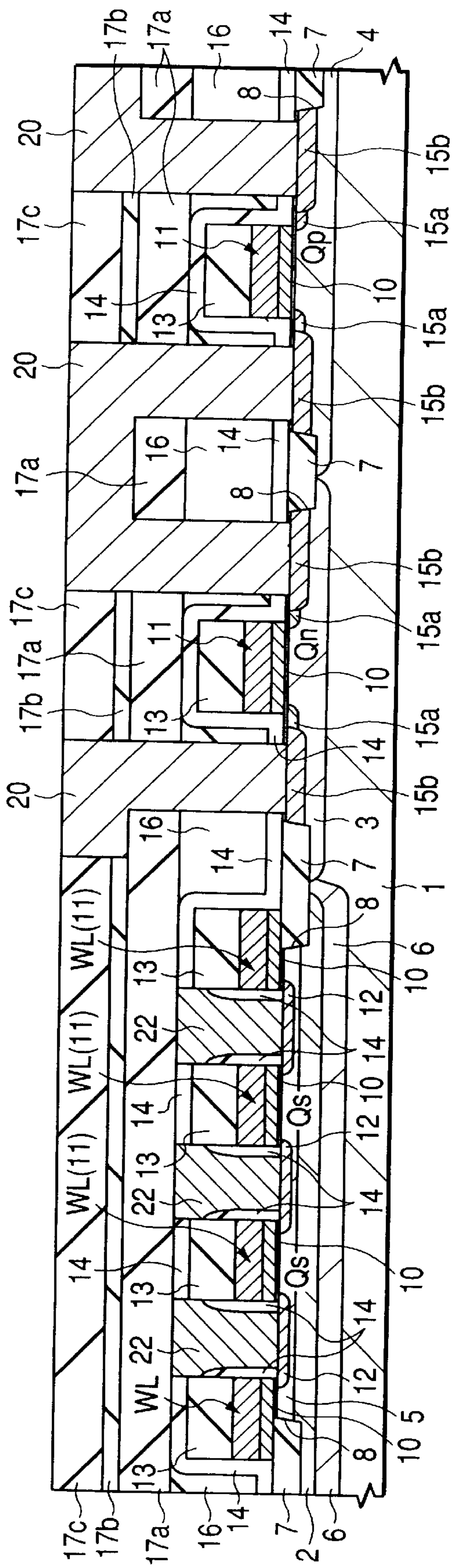
FIG. 37(*a*) is a cross-sectional view showing another example of the process for manufacturing the DRAM according to the still further embodiment of the present invention in process order.
Figures 37B, 37C, 37D:
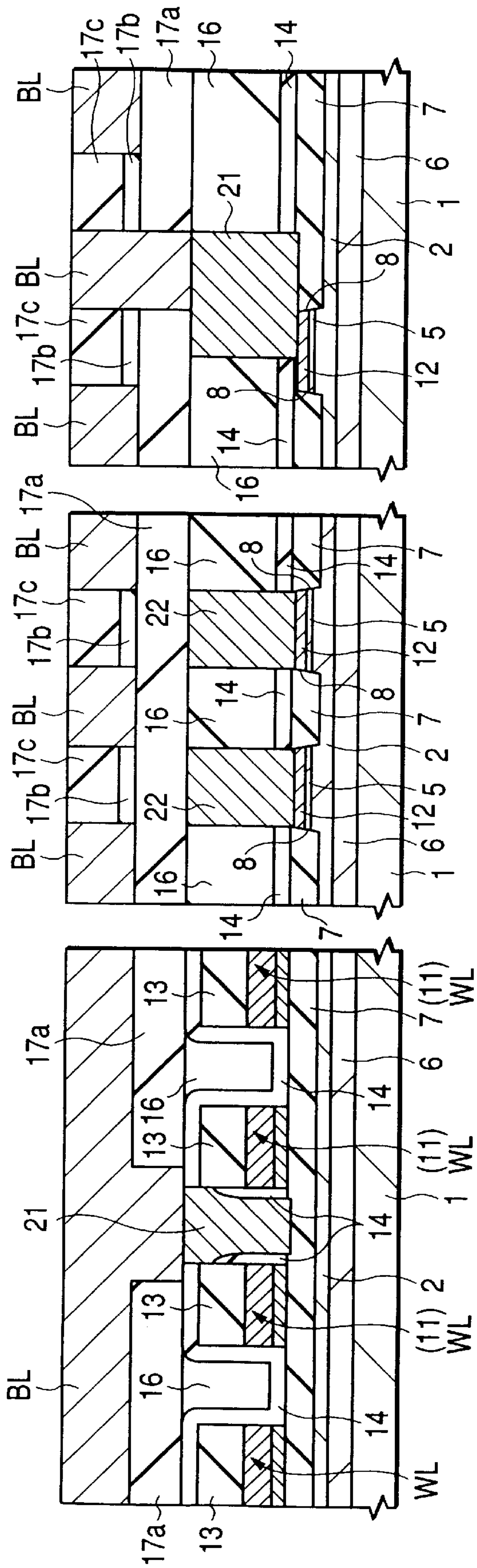

FIGS. 36 and 37 are respectively cross-sectional views showing a process for manufacturing a DRAM according to the example shown in FIG. 35 in process order.

By forming a TiSi film or a film obtained by stacking the TiSi film and a TiN film on each other, etc. between a tungsten film 33 which forms bit lines BL and connecting plugs and connecting plugs 21 and 22 composed of a polycrystalline silicon, the reaction between the tungsten film 33 and the connecting plugs 21 and 22 can be prevented from occurring, and contact resistance can also be lowered.

The method or process for forming the bit lines BL (first layer interconnections 20), according to the present embodiment is not limited to the application to the DRAM. The present method is applicable to a logic circuit equipped with a DRAM in mixed form, a flash memory-contained microcomputer equipped with a DRAM in mixed form, and another chip equipped with a system in mixed form.

Figure 34:
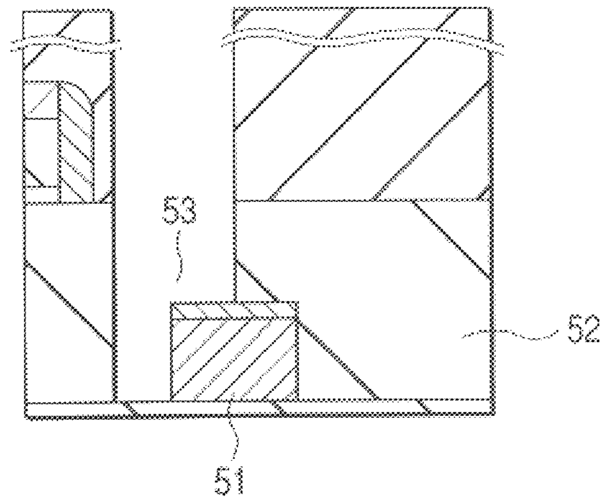
FIG. 34 is a cross-sectional view illustrating a further embodiment of the present invention.

Further, the method for forming the bit lines BL (first layer interconnections 20), according to the present embodiment is not limited to the application of the formation of the first layer interconnections. This is also applicable to the formation of second or more layer interconnections. In this case, when each connecting hole 53 for an (N+1)th layer interconnection is defined in an insulating film 52 for covering an Nth layer interconnection 51 after the formation of the Nth layer interconnection 51 as shown in FIG. 34, it can be formed so as to overlap with the Nth layer interconnection 51. It is thus possible to easily perform the electrical connections between the Nth layer interconnection 51 and the (N+1)th layer interconnection.

What is claimed is:

1. A process for manufacturing a semiconductor integrated circuit device having MISFETs each having a gate electrode and a source and drain, comprising the following steps:

(a) forming isolation regions on a main surface of a semiconductor substrate;

(b) forming active regions in a region surrounded by said isolation regions;

(c) forming a first interconnection serving as the gate electrode of said each MISFET over said each active region;

(d) forming a pair of semiconductor regions each serving as the source and drain of said each MISFET within said active regions on both sides of said first interconnection;

(e) forming a first insulating film over said first interconnection;

(f) defining connecting holes in said first insulating film lying over at least one semiconductor region of said pair of semiconductor regions;

(g) forming a first connecting member electrically connected to said one of said pair of semiconductor regions within said each connecting hole;

(h) successively forming a second insulating film, a third insulating film, a fourth insulating film and a first coating over said connecting member;

(i) forming a first resist film having an opening crossing said first interconnection over said first coating;

(j) etching said first coating exposed at the bottom of the opening of said first resist film to thereby define an opening therein;

(k) etching the fourth insulating film bare in the bottom of the opening of said first coating by a method in which an etching rate for said fourth insulating film is faster than that for each of said first coating and said third insulating film, thereby defining an opening;

(l) etching the third insulating film bare in the bottom of the opening defined in said fourth insulating film;

(m) forming a second resist film having an opening over the opening defined in said first coating;

(n) etching said second insulating film bare in the bottom of the opening defined in said second resist film by a method in which an etching rate for said second insulating film is greater than that for each of said second resist film and said first coating to thereby define an opening therein and expose said connecting member at the bottom of said opening;

(o) forming a first conductor film connected to said connecting member over the main surface of said semiconductor substrate including the interiors of the openings defined in said second insulating film, said third insulating film and said fourth insulating film; and (p) removing said first conductor film lying over said fourth insulating film.

2. The process according to claim 1, wherein said first coating and said first conductor film are comprised of the same material respectively and said step (p) further includes removing said first coating.

3. The process according to claim 1, further including (q) forming a fifth insulating film over said first insulating film and said connecting member, and wherein the etching in said step (n) is carried out by a method in which an etching rate for said second insulating film is greater than that for said fifth insulating film.

4. A process for manufacturing a semiconductor integrated circuit device having MISFETs each having a gate electrode and a source and drain, comprising the following steps:

(a) forming isolation regions on a main surface of a semiconductor substrate;

(b) forming active regions in a region surrounded by said isolation regions;

(c) forming a first interconnection serving as the gate electrode of said each MISFET over said each active region;

(d) forming a pair of semiconductor regions serving as the source and drain of said each MISFET within said active regions on both sides of said first interconnection;

(e) forming a first insulating film over said first interconnection;

(f) defining connecting holes in said first insulating film lying over at least one semiconductor region of said pair of semiconductor regions;

(g) forming a first connecting member electrically connected to said one of said pair of semiconductor regions within said each connecting hole;

(h) successively forming a second insulating film, a third insulating film, a fourth insulating film and a first coating over said connecting member;

(i) forming a first resist film having an opening crossing said first interconnection over said first coating;

(j) etching said first coating exposed at the bottom of the opening of said first resist film to thereby define an opening therein;

(k) etching the fourth insulating film bare in the bottom of the opening of said first coating by a method in which an etching rate for said fourth insulating film is faster than that for each of said first coating and said third insulating film, thereby defining an opening;

(l) etching said third insulating film bare in the bottom of the opening defined in said fourth insulating film;

(m) forming a second conductor film over the main surface of said semiconductor substrate, including the interiors of the openings defined in said fourth insulating film and said third insulating film;

(n) anisotropically etching said second conductor film to thereby form side walls comprised of part of said second conductor film over each of the interiors of the openings defined in said fourth insulating film and said third insulating film;

(o) etching said second insulating film bare in the bottom of the opening defined in said third insulating film by a method in which an etching rate for said second insulating film is greater than that for each of said side walls and said first coating to thereby define an opening therein and expose said connecting member at the bottom of said opening;

(p) forming a first conductor film connected to said connecting member over the main surface of said semiconductor substrate, including the interiors of the openings defined in said second insulating film, said third insulating film and said fourth insulating film; and (q) removing said first conductor film lying over said fourth insulating film.

5. The process according to claim 4, wherein said step (o) further includes forming a second resist film having an opening over the openings defined in said fourth insulating film and said third insulating film, and the etching for said second insulating film is carried out under the existence of said second resist film.

6. A process for manufacturing a semiconductor integrated circuit device having MISFETs each having a gate electrode and a source and drain, comprising the following steps:

(a) forming isolation regions on a main surface of a semiconductor substrate;

(b) forming active regions in a region surrounded by said isolation regions;

(c) forming a first interconnection serving as the gate electrode of said each MISFET over said each active region;

(d) forming a pair of semiconductor regions each serving as the source and drain of said each MISFET within said active regions on both sides of said first interconnection;

(e) forming a first insulating film over said first interconnection;

(f) defining connecting holes in said first insulating film lying over at least one semiconductor region of said pair of semiconductor regions;

(g) forming a first connecting member electrically connected to said one of said pair of semiconductor regions within said each connecting hole;

(h) successively forming a second insulating film and a first coating over said connecting member;

(i) forming a first resist film having an opening crossing said first interconnection over said first coating;

(j) etching said first coating exposed at the bottom of the opening of said first resist film to thereby define an opening therein;

(k) forming a first conductor film over the main surface of said semiconductor substrate, including the interior of the opening defined in said first coating;

(l) subjecting said first conductor film to anisotropic etching to thereby form side walls over an inner wall of the opening defined in said first coating;

(m) etching said second insulating film under the existence of said first coating and said side walls to thereby define an opening therein and expose said connecting member at the bottom of said opening;

(n) forming a second conductor film over the main surface of said semiconductor substrate, including the interior of the opening defined in said second insulating film; and (o) removing part of said second conductor film to thereby form a second interconnection electrically connected to said connecting member inside the opening of said second insulating film.

7. The process according to claim 6, wherein said step (j) has further etching said second insulating film after the opening is defined in said first coating.

8. A process for manufacturing a semiconductor integrated circuit device, comprising the following steps:

(a) forming a first semiconductor region, a second semiconductor region, and an isolation region for separating said first and second semiconductor regions from each other on a main surface of a semiconductor substrate;

(b) forming a first insulating film over the main surface of the semiconductor substrate, including upper portions of said first and second semiconductor regions;

(c) a step for forming a second insulating film over said first insulating film;

(d) forming a first film having first and second openings over said second insulating film;

(e) etching the second insulating film bare in the bottoms of said first and second openings by a method in which an etching rate for said second insulating film is faster than that for said first film, thereby defining first and second trenches;

(f) forming a second film covering parts of said first and second trenches inside said first and second trenches and over said first film;

(g) etching the first insulating film bare in the bottoms of said first and second trenches by a method in which an etching rate for said first insulating film is faster than that for each of said first and second films thereby to define a third opening at the bottom of said first trench and define a fourth opening at the bottom of said second trench;

(h) removing said second film;

(i) a step for forming a first conductor film over the second insulating film including the interiors of said first trench, said second trench, said third opening and said fourth opening; and (j) removing part of said first conductor film to thereby form a first interconnection electrically connected to said first semiconductor region through said third opening inside said first trench and form a second interconnection electrically connected to said second semiconductor region through said fourth opening inside said second trench.

9. A process for manufacturing a semiconductor integrated circuit device, comprising the following steps:

(a) forming first and second MISFETs respectively comprised of a gate insulating film, a gate electrode and a pair of semiconductor regions, and an isolation region for separating said first and second MISFETs from each other over a main surface of a semiconductor substrate;

(b) forming a first insulating film over the main surface of the semiconductor substrate, including upper portions of said first and second MISFETs;

(c) forming a second insulating film over said first insulating film;

(d) forming a first film having first and second openings over said second insulating film;

(e) etching the second insulating film bare in the bottoms of said first and second openings by a method in which an etching rate for said second insulating film is faster than that for said first film, thereby defining first and second trenches;

(f) forming a second film covering parts of said first and second trenches inside said first and second trenches and over said first film;

(g) etching the first insulating film bare in the bottoms of said first and second trenches by a method in which an etching rate for said first insulating film is faster than that for each of said first and second films thereby to define a third opening at the bottom of said first trench and define a fourth opening at the bottom of said second trench;

(h) removing said second film;

(i) a step for forming a first conductor film over the second insulating film including the interiors of said first trench, said second trench, said third opening and said fourth opening; and (j) removing part of said first conductor film to thereby form a first interconnection electrically connected to one of the pair of semiconductor regions of said first MISFET through said third opening inside said first trench and form a second interconnection electrically connected to one of the pair of semiconductor regions of said second MISFET through said fourth opening inside said second trench.

10. The process according to claim 9, further including (k) forming a first capacitor electrically connected to the other of the pair of semiconductor regions of said first MISFET, and a second capacitor electrically connected to the other of the pair of semiconductor regions of said second MISFET.

11. The process according to claim 9, wherein said step (d) includes forming a third film over the main surface of the semiconductor substrate, including the upper portions of said first and second MISFETs, forming a photoresist film having an opening over said third film, and etching said third film through the opening of said photoresist film to thereby define first and second openings and form a first film comprised of part of said third film.

12. The process according to claim 11, wherein said second film is a photoresist film.

13. The process according to claim 9, wherein said step (d) further includes forming side walls comprised of a film containing the same material as that for said first film over inner walls of said first and second openings.

14. The process according to claim 9, wherein said step (c) includes forming an insulating film corresponding to a first layer, forming an insulating film corresponding to a second layer over the insulating film corresponding to the first layer, and forming a second insulating film comprised of the insulating films corresponding to said first and second layers, and said step (e) includes etching the insulating film corresponding to the second layer bare in the bottoms of said first and second openings by a method in which an etching rate for the insulating film corresponding to the first layer is faster than that for each of the first film and the insulating film corresponding to the first layer, and etching the insulating film corresponding to the first layer by a method in which an etching rate for the insulating film corresponding to the first layer is faster than that for the first film, thereby defining the first and second trenches.

15. The process according to claim 9, wherein in said step (f), said second film has a fifth opening defined over part of said first trench and a sixth opening defined over part of said second trench, the width of said fifth opening is greater than that of said first trench and said fifth opening exposes not only part of said first trench but also part of said first film, and the width of said sixth opening is greater than that of said second trench and said sixth opening exposes not only part of said second trench but also part of said first film.

16. The process according to claim 9, wherein in said step (f), said second film has a fifth opening defined over part of said first trench and a sixth opening defined in part of said second trench, the width of said fifth opening is greater than that of said first trench and said fifth opening exposes not only part of said first trench but also parts of said first film on both sides of said first trench, and the width of said sixth opening is greater than that of said second trench and said sixth opening exposes not only part of said second trench but also parts of said first film on both sides of said second trench.

17. The process according to claim 9, wherein said first film is comprised of the same material as that for said first conductor film and is removed subsequently to said first conductor film in the step for removing part of said first conductor film, of said step (j).

18. The process according to claim 9, further including (k) forming side walls comprised of a conductor film over the inner walls of said first and second trenches, and wherein the etching in said step (g) is carried out by a method in which the etching rate for said first insulating film is faster than that for said side walls.

* * * * *